United States Patent
Tada

(10) Patent No.: US 7,911,855 B2
(45) Date of Patent: Mar. 22, 2011

(54) SEMICONDUCTOR DEVICE WITH VOLTAGE INTERCONNECTIONS

(75) Inventor: Akira Tada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 230 days.

(21) Appl. No.: 12/280,074

(22) PCT Filed: Feb. 22, 2007

(86) PCT No.: PCT/JP2007/053252
§ 371 (c)(1),
(2), (4) Date: Aug. 20, 2008

(87) PCT Pub. No.: WO2007/099841
PCT Pub. Date: Sep. 7, 2007

(65) Prior Publication Data
US 2010/0165776 A1   Jul. 1, 2010

(30) Foreign Application Priority Data
Feb. 24, 2006   (JP) ................................ 2006-048763

(51) Int. Cl.
*G11C 7/00* (2006.01)
(52) U.S. Cl. ...................... 365/189.09; 365/63; 365/154
(58) Field of Classification Search ..................... 365/63, 365/154, 189.09
See application file for complete search history.

(56) References Cited

U.S. PATENT DOCUMENTS

| | | | |
|---|---|---|---|
| 5,274,601 A | 12/1993 | Kawahara et al. | |
| 2002/0008999 A1 | 1/2002 | Hidaka | |
| 2002/0186581 A1 * | 12/2002 | Yamaoka et al. | 365/154 |
| 2004/0156244 A1 * | 8/2004 | Becker | 365/189.11 |
| 2005/0232054 A1 * | 10/2005 | Yamaoka et al. | 365/226 |

FOREIGN PATENT DOCUMENTS

| | | |
|---|---|---|
| JP | 9-64715 | 3/1997 |
| JP | 9-321600 | 12/1997 |
| JP | 2000-59200 | 2/2000 |
| JP | 2002-64150 | 2/2002 |
| JP | 2002-158576 | 5/2002 |
| JP | 2005-50514 | 2/2005 |

OTHER PUBLICATIONS

Kim, S., et al. "Experimental Measurement of A Novel Power Gating Structure with Intermediate Power Saving Mode," Proceedings of the 2004 International Symposium on Low Power Electronics and Design, 2004, p. 20-25.
Hama, N., et al., "SOI Circuit Technology for Batteryless Mobile System with Green Energy Sources," 2002 Symposium on VLSI Circuits Digest of Technical Papers, 2002, p. 280, IEEE.
Pakbaznia, E., "Charge Recycling in MTCMOS Circuits: Concept and Analysis," DAC 2006, Jul. 24-28, 2006, p. 97, ACM, San Francisco.

* cited by examiner

*Primary Examiner* — Hoai V Ho
(74) *Attorney, Agent, or Firm* — McDermott Will & Emery LLP

(57) ABSTRACT

A semiconductor device capable of reducing power consumption is provided. When a power to an internal circuit is interrupted, e.g., in a standby mode, a switch is turned off, and a pseudo-ground line is charged with a leak current of the internal circuit to raise a potential thereof. After the switch is turned off, a switch connected to a charge supply unit is turned on while the potential is rising, so that the charge supply unit is electrically coupled to the pseudo-ground line. Thereby, charges accumulated in the charge supply unit are discharged to the pseudo-ground line. The switch is turned off to decouple electrically the charge supply unit from the pseudo-ground line. Thereby, when the power supply is interrupted, a part of the charges for raising the potential of the pseudo-ground line is supplemented with the charges of the charge supply unit.

16 Claims, 38 Drawing Sheets

FIG.19
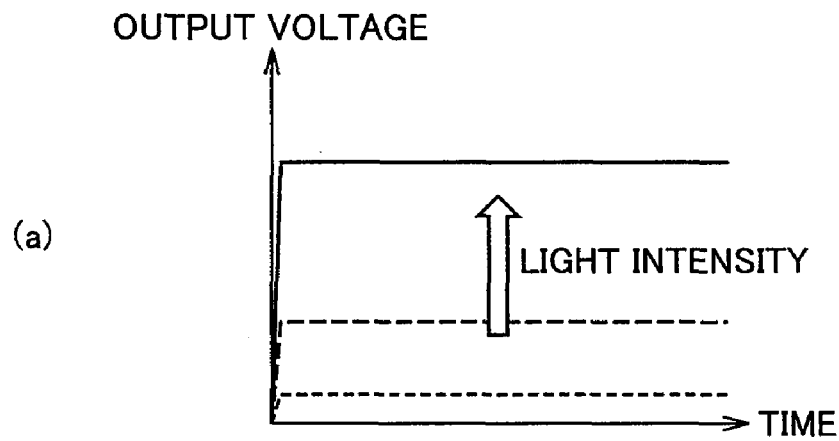
(a)
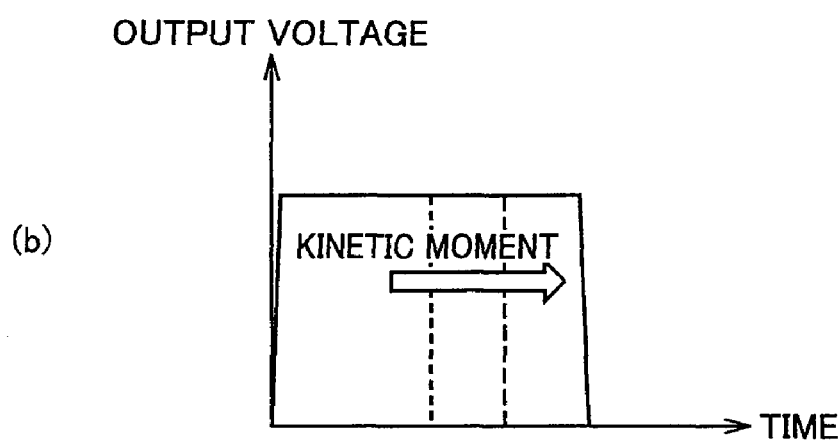
(b)
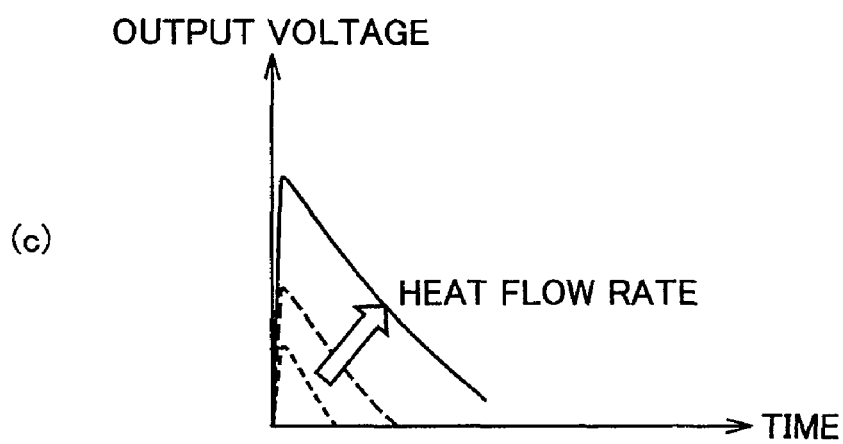
(c)

FIG.22
(a)
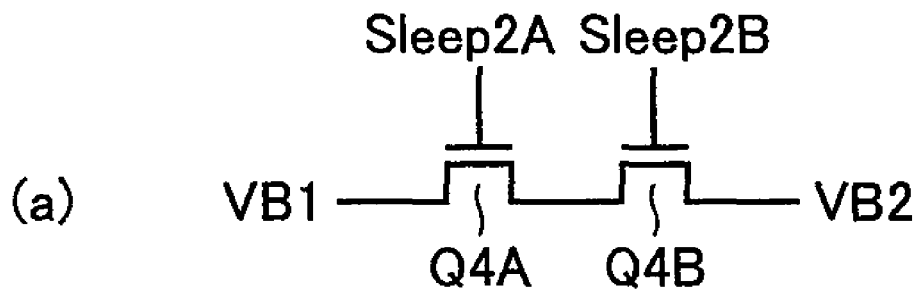
(b)
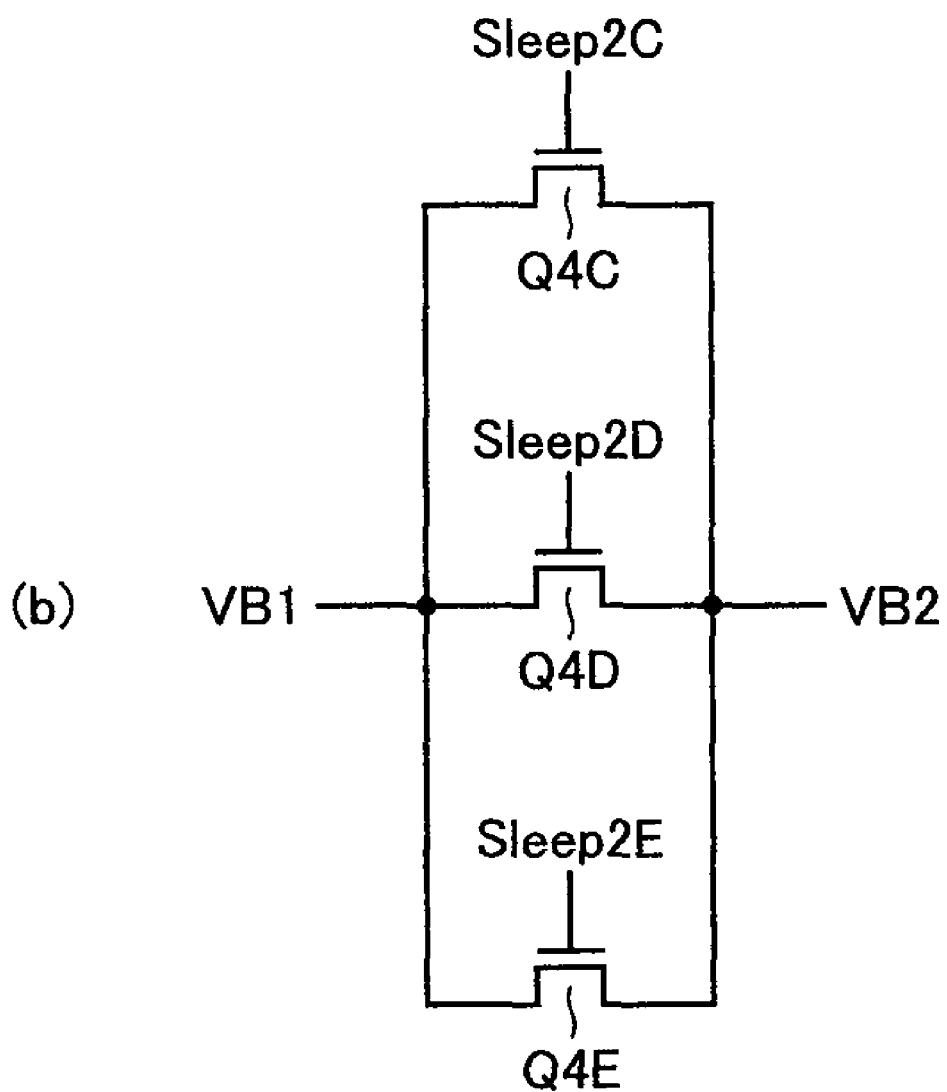

FIG.31
(a) VOLTAGE LEVEL
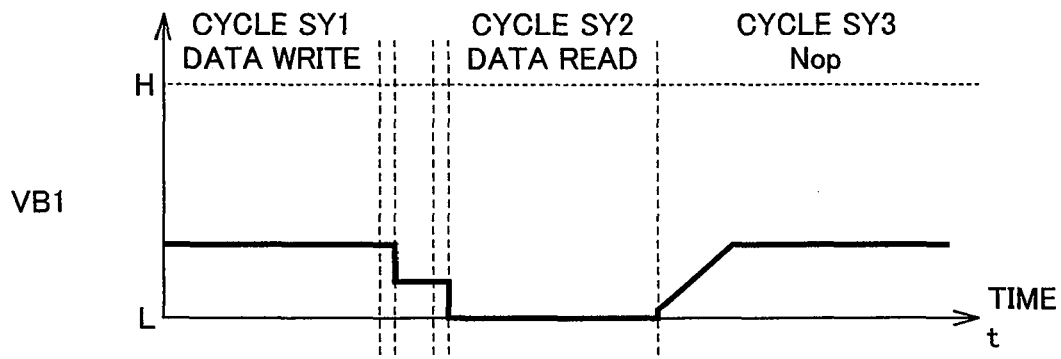
(b) VOLTAGE LEVEL
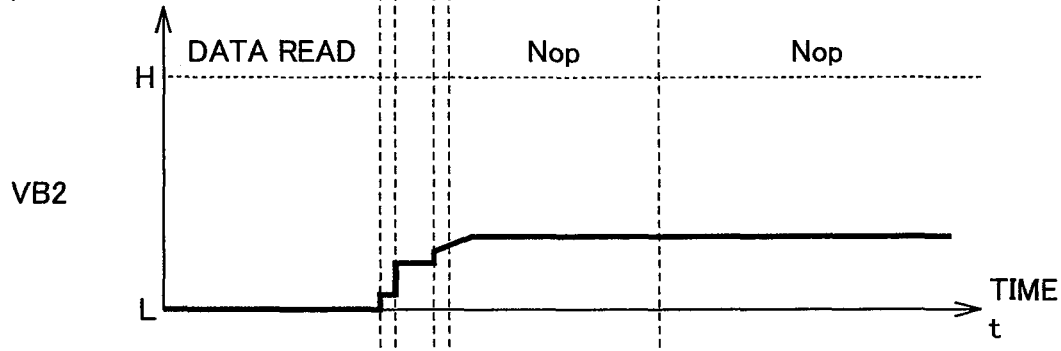
(c) VOLTAGE LEVEL
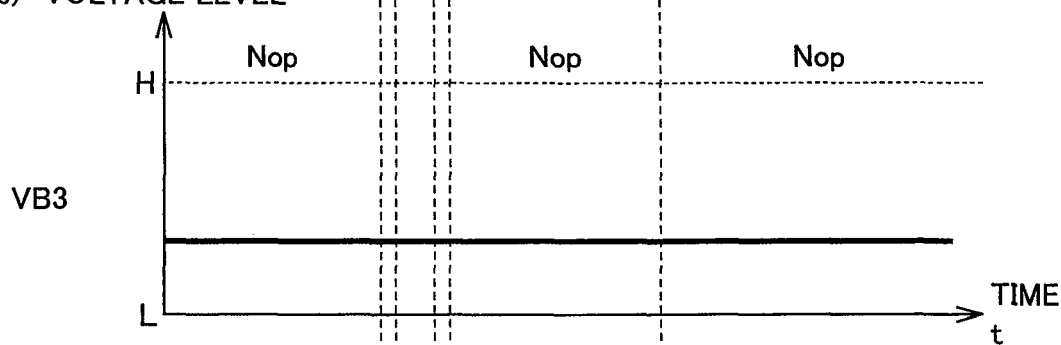
(d) VOLTAGE LEVEL
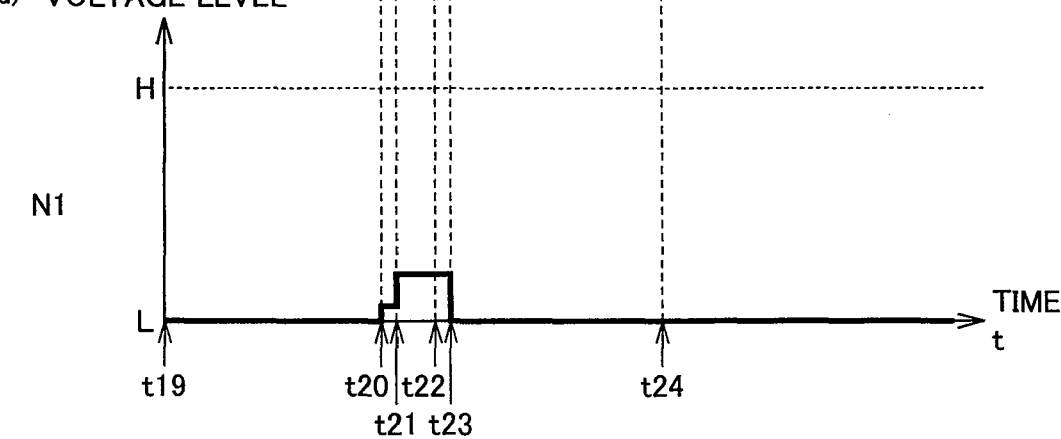

SEMICONDUCTOR DEVICE WITH VOLTAGE INTERCONNECTIONS

RELATED APPLICATIONS

This application is the U.S. National Phase under 35 U.S.C. §371 of International Application No. PCT/JP2007/053252, filed on Feb. 22, 2007, which in turn claims the benefit of Japanese Application No. 2006-048763, filed on Feb. 24, 2006, the disclosures of which Applications are incorporated by reference herein.

TECHNICAL FIELD

The present invention relates to a semiconductor device, and particularly to a semiconductor device that has a structure interrupting an electrical connection of a power supply line and a ground line to a logic circuit and the like, and can reduce power consumption.

BACKGROUND ART

In recent years, progress has been made in improving integration density and performance of semiconductor devices, and fields of application thereof have been widely expanding. According to these situations, technical matters for reducing the power consumption of semiconductor devices or semiconductor chip bodies have been increasing in importance. More specifically, a data information device having a telephone, an electronic organizer, a small personal computer and/or the like in an integrated form is required to have an internal battery having a long duration. Further, a high-performance information processing device is required to have a cooling device and a power supply device of small sizes. In view of a social demand for protecting global environment by effectively using energy resources, the improvement of the performance as well as the reduction of the power consumption of the semiconductor device have been deemed as important elemental technologies for adding value to the semiconductor devices.

As an example of such technologies, there has been a semiconductor device which uses multiple kinds of thresholds, i.e., a so-called "Multi-Threshold CMOS (which may also be referred to as an "MTCMOS" hereinafter). An MTCMOS circuit is formed of a logic circuit group and transistors of high threshold voltages, and can prevent increase in power consumption in the logic circuit group when the logic circuit group formed of the CMOSs is on standby. In connection with this, Patent Documents 1-3 and Non-Patent Document 1 have disclosed various methods that reduce power consumption in a standby mode.

More specifically, the logic circuit group includes a logic circuit having a single or multiple logic gate(s) or the like. The logic gate is formed of a P-channel MOS transistor having a low threshold voltage and an N-channel MOS transistor having a low threshold voltage.

FIG. 46 illustrates a conventional MTCMOS circuit.

Referring to FIG. 46, logic circuit groups L1 and L2 are shown. For example, logic circuit group L1 has a structure in which P- and N-channel MOS transistors P2 and Q1 each having a low threshold voltage are connected between a pseudo-power supply line VA1 on a high potential side and a pseudo-ground line VB1 on a low potential side.

Pseudo-power supply line VA1 is connected to a true power supply Vcc via a P-channel MOS transistor P1 having a high threshold. Pseudo-ground line VB1 is connected to a true ground voltage GND via an N-channel MOS transistor Q2 having a high threshold. Transistor P1 receives on its gate a control signal /Sleep3, and transistor Q2 receives on its gate a control signal Sleep3 that is an inverted signal of control signal /Sleep3.

Logic circuit group L2 has substantially the same structure. Although not shown, it is formed of transistors of a low threshold. Logic circuit group L2 is connected between a pseudo-power supply line Va2 on a high potential side and a pseudo-ground line VB2 on a low potential side. Pseudo-power supply line VA2 is connected to true power supply Vcc via a P-channel MOS transistor P3 having a high threshold. Also, pseudo-ground line VB2 is connected to true ground voltage GND via an N-channel MOS transistor Q3 having a high threshold. Transistor P3 receives on its gate a control signal /Sleep1, and transistor Q3 receives a control signal Sleep1 that is an inverted signal of control signal /Sleep1.

FIG. 47 is a timing chart of control signals Sleep1 and Sleep3 that operate the MTCMOS circuit.

As shown in FIG. 47, control signals Sleep1 and Sleep3 attain "H" and "L" levels at a time ta, respectively. Thereby, logic circuit group L1 attains a standby mode. Logic circuit group L2 is in an active mode.

More specifically, control signals Sleep3 and /Sleep3 to logic circuit group L1 attain the "L" and "H" levels, respectively. Thereby, pseudo-power supply line VA1 is electrically decoupled from power supply voltage Vcc. Also, pseudo-ground line VB1 is electrically decoupled from ground voltage GND. Control signals Sleep1 and /Sleep1 to logic circuit group L2 attain the "H" and "L" levels, respectively, so that transistors P3 and Q3 are turned on to couple electrically pseudo-power supply line VA2 and pseudo-ground line VB2 to power supply voltage Vcc and ground voltage GND, respectively.

Thereby, a current is supplied to pseudo-power supply line VA2 and pseudo-ground line VB2 via a current path of a low resistance, and logic circuit group L2 can operate.

At a subsequent time tb, control signal Sleep3 attains the "H" level so that logic circuit group L1 attains the active mode. More specifically, control signals Sleep3 and /Sleep3 to logic circuit group L1 attain the "H" and "L" levels, and thereby turn on transistors P1 and Q2, respectively. Since transistors P1 and Q2 are turned on, pseudo-power supply line VA1 and pseudo-ground line VB1 are electrically coupled to power supply voltage Vcc and ground voltage GND, respectively.

At a subsequent time tc, control signal Sleep1 attains the "L" level so that logic circuit group L2 attains the standby mode. More specifically, control signals Sleep1 and /Sleep1 to logic circuit group L2 attain the "L" and "H" levels, and thereby turn off transistors P3 and Q3, respectively.

This results in a state in which power supply voltage Vcc and ground voltage GND are electrically decoupled from pseudo-power supply line VA2 and pseudo-ground line VB2, respectively.

In general, a leak current preventing capability lowers with lowering of a threshold voltage of a transistor. Thus, power consumption of transistors P2, Q1 and the like increases. Therefore, the above circuit structure that generates leak currents in transistors P1, P3, Q2 and Q3 can reduce the power consumption in the standby mode. More specifically, in logic circuit groups L1 and L2, even when the structure uses transistors having low threshold voltages, this structure can suppress leak currents in transistors of a logic circuit group, and therefore can reduce the power consumption of the whole circuit.

Patent Document 1: Japanese Patent Laying-Open No. 09-064715

Patent Document 2: Japanese Patent Laying-Open No. 09-321600

Patent Document 3: Japanese Patent Laying-Open No. 2000-059200

Non-Patent Document 1: Suhwan Kim, Stephen V. Kosonocky, Daniel R. Knebel and Kevin Stawiasz, "Experimental Measurement of A Novel Power Gating Structure with Intermediate Power Saving Mode", Proceedings of the 2004 International Symposium on Low Power Electronics and Design, pp. 20-25, 2004.

DISCLOSURE OF THE INVENTION

Problems to be Solved by the Invention

During a standby period of the above circuit structure, pseudo-power supply lines VA1 and VA2 as well as pseudo-ground lines VB1 and VB2 are electrically decoupled from corresponding true power supply Vcc or true ground voltage GND, and the structure is in a high-impedance state. Therefore, currents gradually leak to pseudo-power supply lines VA1 and VA2 as well as pseudo-ground lines VB1 and VB2 via transistors forming logic circuits L1 and L2 with the passage of time.

Since logic circuit groups L1 and L2 are formed of the transistors of low threshold voltages as described above, leak currents occurs, and the potentials of pseudo-power supply lines VA1 and VA2 as well as the potentials of pseudo-ground lines VB1 and VB2 approach each other until these stay in a balanced potential.

In connection with the above, the following can be considered. In the case where logic circuit groups L1 and L2 are formed of sequential circuits or the like that are configured to store logical states of register circuits, latch circuits, flip-flop circuits and the like, potential differences enabling holding of the logical state cannot be ensured between pseudo-power supply line VA1 and pseudo-ground line VB1 and between pseudo-power supply line VA1 and pseudo-ground line VB2 when the standby period is long. Thus, stored information may be lost. This means that the semiconductor device cannot resume the last state even when it enters the active mode after the standby period. It is noted that logic circuits and the like other than the circuits configured to store the logical state can attain a state in which the potentials of pseudo-power supply lines VA1 and VA2 becomes close to pseudo-ground lines VB1 and VB2, respectively.

FIG. 48 illustrates a case in which the potential levels of pseudo-ground lines VB1 and VB2 of logic circuit groups L1 and L2 rise with time.

At time ta, logic circuit group L1 attains the standby mode, and control signals Sleep3 and /Sleep3 attain the "L" and "H" levels, respectively, so that pseudo-ground line VB1 is charged with the leak current on power supply voltage Vcc side, and the potential of pseudo-ground line VB1 rises as represented by dotted line in FIG. 48. Pseudo-ground line VB1 will attain the balanced potential that keeps a balance of leak currents. At subsequent time tb, logic circuit group L1 attains the active mode, and control signals Sleep3 and /Sleep3 attain the "H" and "L" levels, respectively. Thereby, pseudo-ground line VB1 is electrically coupled to ground voltage GND, and is pulled down. Likewise, at a time tc, logic circuit group L2 attains the standby mode, and control signals Sleep1 and /Sleep1 attain the "L" and "H" levels, respectively. Thereby, pseudo-ground line VB2 is charged with the leak current on the power supply voltage Vcc side, and the potential thereof rises. Pseudo-ground line VB2 attains the balanced potential at the level keeping the balance of leak currents. Although not shown in the figure, when the structure is in the active mode, pseudo-ground line VB2 is electrically coupled to ground voltage GND, and is pulled down.

Thus, the pseudo-ground line that has been at the level of balanced potential charged at the time of switching from the standby mode to the active mode is electrically coupled to ground voltage GND, and attains the discharging state. For switching from the active mode to the standby mode, therefore, the charges must be pulled out from the power supply voltage Vcc side again for charging the pseudo-ground line. This results in a problem that the effect of reducing the power consumption is not sufficient when the switching from the active mode to the standby mode is frequently performed.

The invention has been made for overcoming the above problem, and an object of the invention is to provide a semiconductor device that can further reduce the power consumption.

Means for Solving the Problems

A semiconductor device according to the invention includes a first voltage interconnection supplying a first voltage, a second voltage interconnection supplying a second voltage, a first voltage supply interconnection arranged between the first and second voltage interconnections, a first internal circuit connected between the second voltage interconnection and the first voltage supply interconnection, and forming a current path between the second voltage interconnection and the first voltage supply interconnection in response to an input signal, a first switch (SW1) connected between the first voltage interconnection and the first voltage supply interconnection, and being turned on in response to an input first control signal, a charge supply unit charging the first voltage supply interconnection, and a second switch (SW2) connected between the first voltage supply interconnection and the charge supply unit, and being turned on in response to an input second control signal.

Effects of the Invention

The semiconductor device according to the invention includes the charge supply unit that charges the first voltage supply interconnection. Therefore, when the first voltage supply interconnection is to be charged with charges supplied from another power supply, the semiconductor device can supplement a part of the charges with the charges of the charge supply unit so that the quantity of charges pulled out from another power supply can be reduced, and power consumption can be reduced.

BRIEF DESCRIPTION OF THE DRAWINGS

FIG. 19 illustrates a power generation element according to the fourth modification of the first embodiment of the invention.

FIG. 22 illustrates switches according to a fifth modification of the first embodiment of the invention.

FIG. 31 illustrates voltage levels of pseudo-ground lines VB1-VB3 and node N1 of memory block MB according to input of control signals /Sleep7-/Sleep10 in FIG. 30.

DESCRIPTION OF THE REFERENCE SIGNS 10, 10# chip; 15 storage unit; 20 control unit; 25 internal circuit; 30 charge supply unit; 50 CPU; 100 logic unit; SW1, SW1_1, SW1_2, SW1_1a, SW1_2a, SW1_1a#, SW1_2a#, SW2, SW2a, SW2b, SW2#, SW2#a, SW2#b, SWZ, SWZa, SWP1, SWP2 switch

BEST MODES FOR CARRYING OUT THE INVENTION

Embodiments of the invention will now be described with reference to the drawings. In the following description, the same parts and components bear the same reference numbers, and description thereof is not repeated.

First Embodiment

Figure 1:
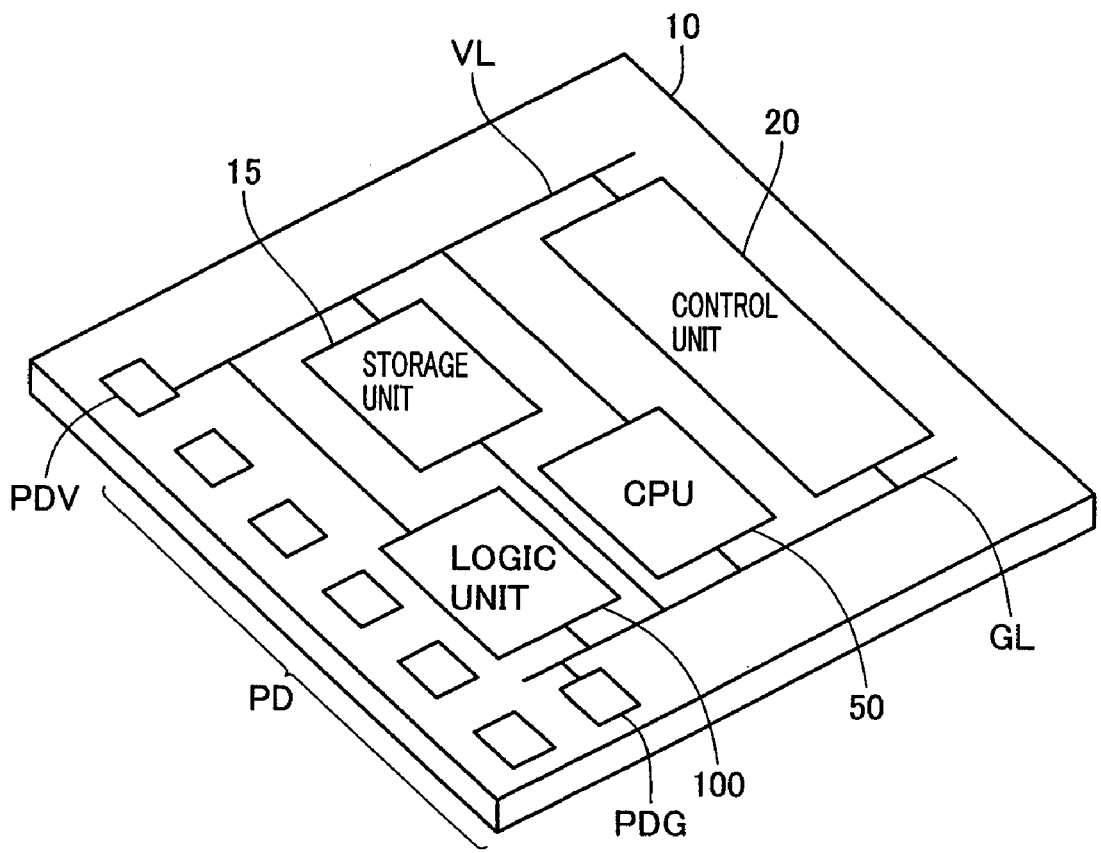
FIG. 1 schematically shows a structure of a semiconductor device 10 according to a first embodiment of the invention.

FIG. 1 schematically shows a structure of a chip 10 according to a first embodiment of the invention.

Referring to FIG. 1, a chip 10 according to the embodiment of the invention includes a CPU 50 for controlling a whole circuit, a storage unit 15 having a memory for storing information, a control unit 20 that is a peripheral circuit for producing a clock signal or control signals based on commands from CPU 50 and a logic unit 100 for executing various arithmetic operations.

Chip 10 is provided at its peripheral region with pads, which are a power supply pad PDV supplying a power supply voltage Vcc, a ground pad PDG supplying a ground voltage GND and a pad PD externally receiving a command signal and the like in this example.

Ground pad PDG is electrically coupled to a ground line GL for supplying a ground voltage of the circuit, and is supplied with ground voltage GND. Power supply pad PDV is electrically coupled to a power supply line VL for supplying power supply voltage Vcc, and is supplied with power supply voltage Vcc. In the following description, power supply line VL and ground line GL supply power supply voltage Vcc and ground voltage GND, respectively.

Figure 2:
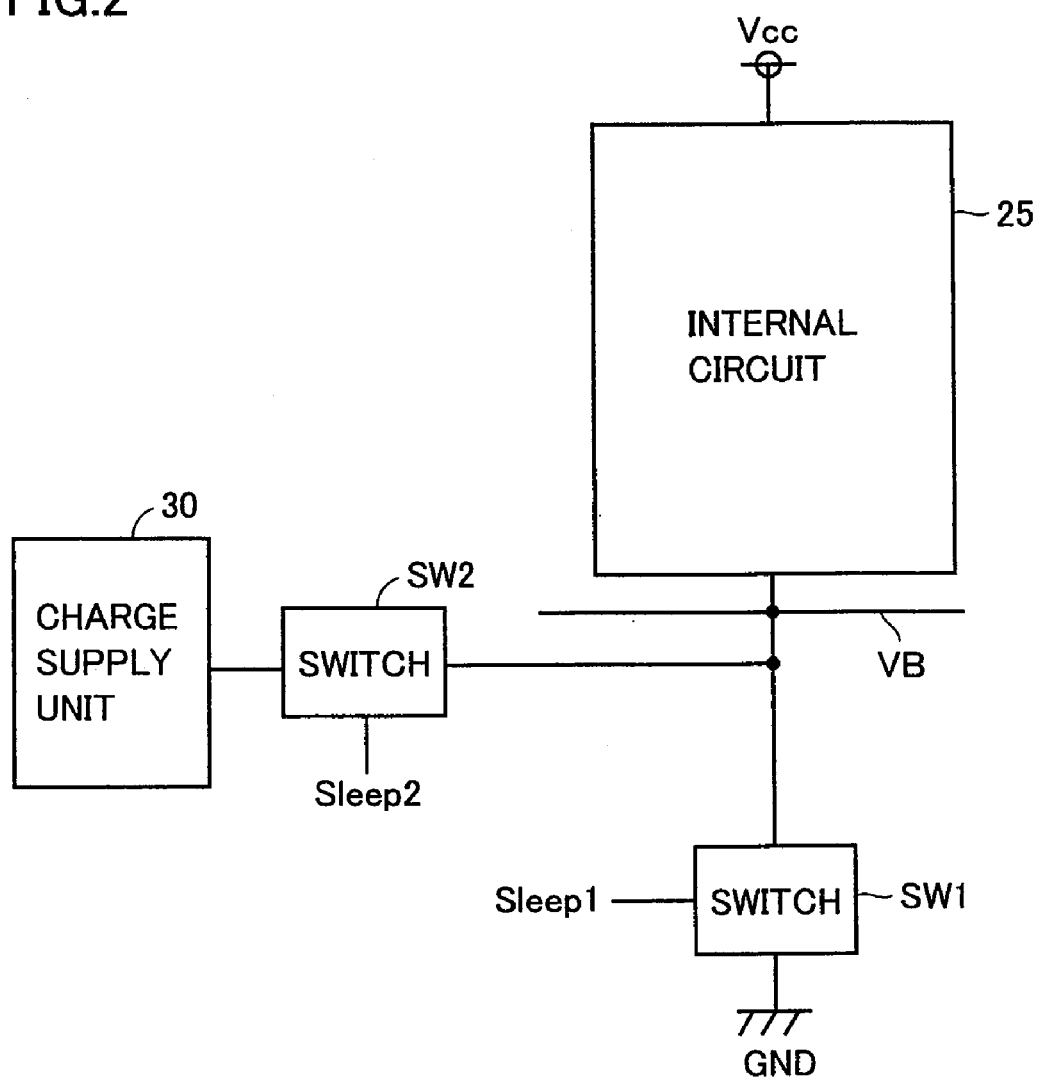
FIG. 2 illustrates a basic structure supplying a power supply voltage Vcc and a ground voltage GND to an internal circuit according to the embodiment of the invention.

FIG. 2 illustrates a basic structure supplying power supply voltage Vcc and ground voltage GND to an internal circuit according to the embodiment of the invention.

Referring to FIG. 2, a pseudo-ground line VB is arranged corresponding to an internal circuit 25. Pseudo-ground line VB is electrically coupled to ground voltage GND via a switch SW1. Pseudo-ground line VB is electrically coupled to a charge supply unit 30 via a switch SW2.

Switch SW1 electrically couples ground voltage GND to pseudo-ground line VB in response to a control signal Sleep1.

Switch SW2 electrically couples charge supply unit 30 to pseudo-ground line VB in response to a control signal Sleep2.

Charge supply unit 30 has already held charges, and is configured to charge pseudo-ground line VB with the charges held thereby when switch SW2 is turned on in response to control signal Sleep2. In the following description, the control unit provides the control signal to be supplied to switches SW.

Specific structures of the invention will now be described. First, description will be given on an example of the internal circuit, i.e., logic circuit groups included in logic unit 100 that is an MTCMOS circuit.

Figure 3:
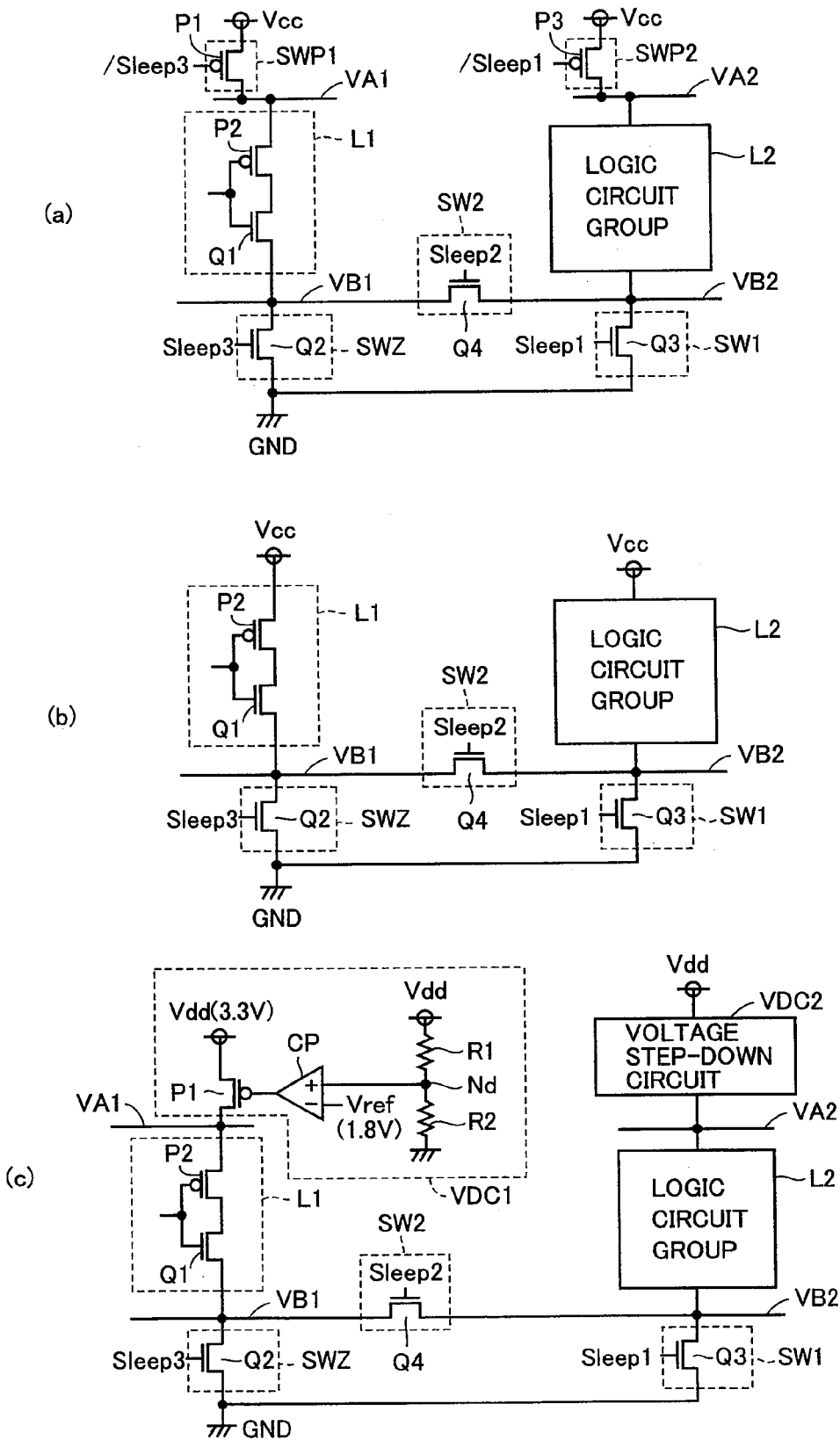
FIG. 3 illustrates an MTCMOS circuit according to the first embodiment of the invention.

FIG. 3 illustrates the MTCMOS circuit according to the first embodiment of the invention. Logic circuit groups L1 and L2 included in logic unit 100 will be representatively described below by way of example.

Referring to FIG. 3(a), the MTCMOS circuit according to the first embodiment of the invention includes logic circuit groups L1 and L2, pseudo-power supply lines VA1 and VA2 arranged corresponding to logic circuit groups L1 and L2, respectively, switches SWP1 and SWP2 that are arranged corresponding to pseudo-power supply lines VA1 and VA2 for controlling electrical connections to power supply line VL, respectively, pseudo-ground lines VB1 and VB2 arranged corresponding to logic circuit groups L1 and L2, respectively, switches SWZ and SW1 arranged corresponding to pseudo-ground lines VB1 and VB2 for controlling electrical connections to ground line GL, respectively, and switch SW2 arranged between pseudo-ground line VB1 and VB2. Switches SWP1 and SWP2 include P-channel MOS transistors P1 and P3 each having a threshold voltage larger in absolute value than a threshold voltage of the transistors forming logic circuit group L1, and receives control signals /Sleep3 and /Sleep1. The pseudo-power supply line and the pseudo-ground line are voltage supply interconnections supplied with power supply voltage Vcc and ground voltage GND, respectively.

Switches SWZ, SW1 and SW2 include N-channel MOS transistors Q2-Q4, respectively. In the following description, P- and N-channel MOS transistors may be simply referred to as "transistors".

Transistor Q2 is arranged between pseudo-ground line VB1 and ground voltage GND, and receives a control signal Sleep3 on its gate. Transistor Q3 is arranged between pseudo-ground line VB2 and ground voltage GND, and receives control signal Sleep1 on its gate. Transistor Q4 is arranged between pseudo-ground lines VB1 and VB2, and receives control signal Sleep2 on its gate. Control signals Sleep and /Sleep are input according to predetermined timing depending on an active mode or a standby mode and. In this example, CPU 50 provides these control signals Sleep and /Sleep.

The active mode represents a state in which, e.g., logic circuit group L1 is active in response to a signal (e.g., a control signal or a clock signal provided from CPU 50) supplied to logic circuit group L1 and provides a signal. In other words, it represents a state in which the transistors forming logic circuit group L1 are turned on and off to perform the switching operations so that an operation current flows. In the following description of the example, the "on" of the transistor represents a conductive state, and the "off" represents a nonconductive state.

The standby mode represents a state in which the circuits forming, e.g., logic circuit group L1 are not performing a circuit operation. In other words, it represents a nonconductive state of the transistors forming logic circuit group L1 and thus a state in which an operation current does not flow. Usually, the transistors forming logic circuit group L1 pass a current smaller than the operation current of the transistors in the active mode, such as an off current of the like of the transistors.

In this example, power supply voltage Vcc is set, e.g., to 1.8 V. Further, a transistor of which threshold voltage is low in absolute value has a threshold voltage, e.g., from 0.3 to 0.35 V. A transistor of which threshold voltage is high in absolute value specifically has a threshold voltage Vth, e.g., from 0.4 to 0.45 V.

The following description will be given primarily on the MTCMOS circuit including logic circuit group L1 formed of the transistors of a low threshold voltage as well as switches SW formed of the transistors of a high threshold voltage. However, the transistors forming switch SW or switch SWP of the invention can likewise be employed in the case where these transistors have the same threshold voltage as the transistors forming logic circuit group L1. The same is true with modifications and embodiments described later.

Pseudo-ground lines VB1 and VB2 supply ground voltage GND to logic unit 100, and are voltage supply interconnections, respectively. In this example described below, elements forming switches SW and SWP are MOS transistors. However, these elements may be elements other than the MOS transistors, provided that these can be electrically turned on/off.

Figure 4:
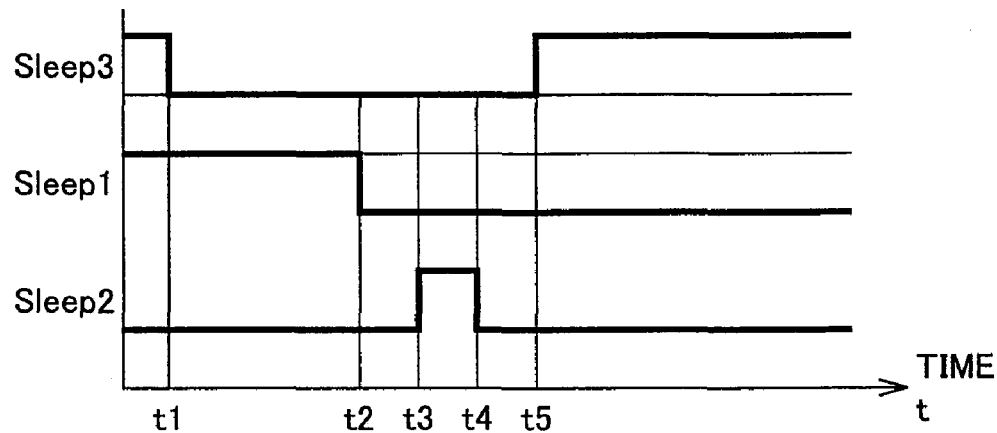
FIG. 4 is a timing chart illustrating an operation of the MTCMOS circuit according to the first embodiment of the invention.

FIG. 4 is a timing chart illustrating an operation of the MTCMOS circuit according to the first embodiment of the invention.

Referring to FIG. 4, at a time t1, logic circuit group L2 attains an active mode, and logic circuit group L1 attains a standby mode. More specifically, control signals Sleep3 and /Sleep3 attain "L" and "H" levels, respectively. Further, control signals Sleep1 and /Sleep1 attain the "H" and "L" levels, respectively. Control signal Sleep2 attains the "L" level.

Thereby, transistor Q3 is turned on to couple electrically pseudo-ground line VB2 to ground voltage GND. Also, transistor P3 is turned on to couple electrically power supply voltage Vcc to pseudo-power supply line VA2. Transistor Q2 is turned off to decouple electrically ground voltage GND from pseudo-ground line VB1. Also, transistor P1 is turned off to decouple electrically power supply voltage Vcc from pseudo-power supply line VA1. Transistor Q4 is turned off to decouple electrically pseudo-ground line VA1 from pseudo-ground line VA2.

Therefore, logic circuit group L2 attains the active mode, and is supplied with a voltage required for the operation so that logic circuit group L2 executes a predetermined operation. Logic circuit group L1 is in the standby mode, and transistors P1 and Q2 are off so that the voltage supply is interrupted.

At a time t2, control signal Sleep1 attains the "L" level. Thereby, transistor Q3 is turned off to decouple electrically pseudo-ground line VB2 from ground voltage GND. At a time t3, control signal Sleep2 is set to the "H" level. Thereby, transistor Q4 is turned on to couple electrically pseudo-ground lines VB1 and VB2 together via a node N0.

At a time t4, control signal Sleep2 attains the "L" level. Thereby, transistor Q4 is turned off to decouple electrically pseudo-ground lines VB1 and VB2 from each other.

At a time t5, control signal Sleep3 attains the "H" level. Thereby, transistor Q2 is turned on to couple electrically pseudo-ground line VB1 to ground voltage GND, and logic circuit group L1 attains the active mode so that logic circuit group L1 is supplied with a power supply required for the operation, and executes a predetermined operation. Logic circuit group L2 attains the standby mode, and transistors P3 and Q3 are off and thus interrupt the power supply.

Figure 5:
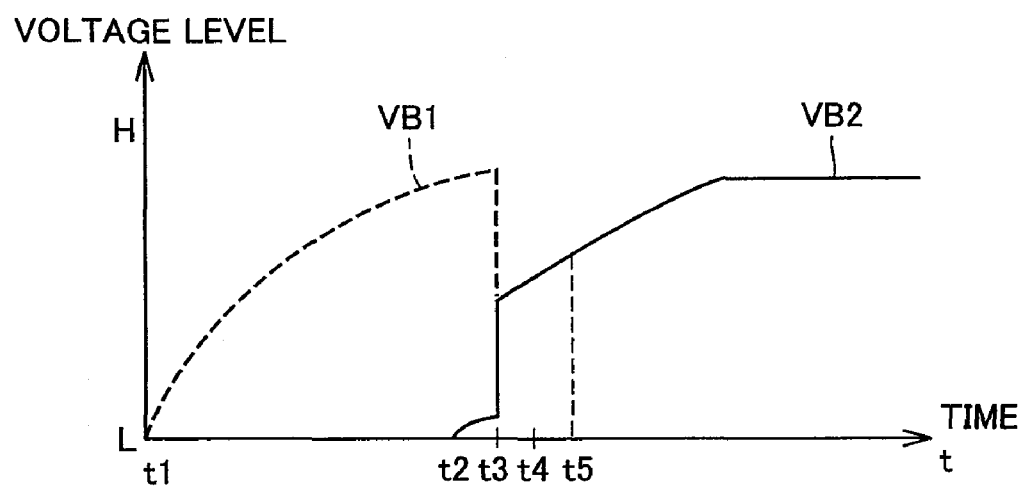
FIG. 5 illustrates voltage levels of pseudo-ground lines VB1 and VB2 of the MTCMOS circuit according to the first embodiment of the invention, and particularly the voltage levels according to input of control signals in FIG. 4.

FIG. 5 illustrates voltage levels of pseudo-ground lines VB1 and VB2 of the MTCMOS circuit according to the first embodiment of the invention, and particularly the voltage levels according to input of the control signals in FIG. 4.

At time t1, transistor Q2 for pseudo-ground line VB1 is off so that pseudo-ground line VB1 is electrically decoupled from ground voltage GND. Accordingly, pseudo-ground line VB1 is charged with a current leaking from logic circuit group L1 so that the potential of pseudo-ground line VB1 will rise. Also, at time t1, transistor Q3 for pseudo-ground line VB2 is off so that pseudo-ground line VB2 is electrically coupled to ground voltage GND. Therefore, the potential of pseudo-ground line VB2 attains 0 V. Since transistor Q4 is off, pseudo-ground lines VB1 and VB2 are electrically decoupled from each other. Pseudo-ground line VB1 attains a balanced potential at a level keeping a balance of the leak current.

At subsequent time t2, control signal Sleep1 attains the "L" level. Thereby, transistor Q3 is turned off to decouple electrically pseudo-ground line VB2 from ground voltage GND. At time t3, control signal Sleep2 attains the "H" level. Thereby, transistor Q4 is turned on to couple electrically pseudo-ground lines VB1 and VB2 together. At time t4, control signal Sleep2 attains the "L" level. Thereby, transistor Q4 is turned off to decouple electrically pseudo-ground lines VB1 and VB2 from each other.

At time t2 in FIG. 5, control signal Sleep1 attains the "L" level so that pseudo-ground line VB2 is gradually charged with a leak current flowing through logic circuit group L2, and thereby the potential thereof starts rising. At time t3, the potential of pseudo-ground line VB2 that is coupled to pseudo-ground line VB1 already charged with the charges rapidly rises.

At time t5, control signal Sleep3 attains the "H" level. Thereby, pseudo-ground line VB1 is electrically coupled to ground voltage GND because transistor Q2 is on. However, pseudo-ground line VB2 is electrically decoupled from ground voltage GND so that pseudo-ground line VB2 is charged with the leak current flowing through logic circuit group L2, and the potential of pseudo-ground line VB2 rises to a balanced potential similarly to pseudo-ground line VB1.

In the structure according to the first embodiment of the invention, pseudo-ground line VB1 of logic circuit group L1 corresponding to charge supply unit 30 accumulates the charging charges when logic circuit group L1 is in the standby mode. In the method that has been described, the charging charges are discharged from charge supply unit 30 to pseudo-ground line VB2 of logic circuit group L2 corresponding to the internal circuit via the switch so that the charging of pseudo-ground line VB2 is executed.

More specifically, in the foregoing structure, when logic circuit group L2 enters the standby mode, the charges are discharged to pseudo-ground line VB2 corresponding to logic circuit group L2 so that the potential of pseudo-ground line VB2 rises.

Accordingly, the above structure can use the charges that are carried by pseudo-ground line VB1, and thereby can supplement, with them, a part of the charges required for raising the potential of pseudo-ground line VB2, e.g., when logic circuit group L2 attains the standby mode. Thus, the potential of pseudo-ground line VB2 rises based on the charges discharged from pseudo-ground line VB1 (charge supply unit) so that the quantity of charges that are pulled out from power supply voltage Vcc side can be reduced, and the power consumption can be reduced. In other words, according to the foregoing method, the charges resulting from the charging of pseudo-ground line VB1 are reused for charging another pseudo-ground line VB2.

In this example, the method of reusing the charges between pseudo-ground lines VB1 and VB2 has been described. However, the charges can be reused between pseudo-power supply lines VA1 and VA2 in the substantially same manner, and the same is true with the following contents.

In the example already described, pseudo-power supply lines VA1 and VA2 are electrically coupled to the same power supply voltage Vcc. However, pseudo-power supply lines VA1 and VA2 may be electrically coupled to different power supply voltages, respectively. For example, a power supply voltage Vcc1 may be arranged for pseudo-power supply line VA1, and a power supply voltage Vcc2 may be provided for pseudo-power supply line VA2.

In the structure of FIG. 3(a) that has been described by way of example, switch SWP1 including transistor P1 is employed corresponding to logic circuit group L1 and is arranged between power supply voltage Vcc and pseudo-power supply line VA1. Also, pseudo-power supply line VA2 and switch SWP2 are arranged corresponding to logic circuit group L2. However, the embodiment may be applied to the structure of FIG. 3(b), in which switches SWP1 and SWP2 as well as pseudo-power supply lines VA1 and VA2 may be eliminated, and power supply voltage Vcc is directly supplied to logic circuit groups L1 and L2.

In another structure, switches SWP1 and SWP2 may be replaced with voltage step-down circuits VDC1 and VDC2, as is done in a structure of FIG. 3(c).

FIG. 3(c) shows an example of a structure that steps down a power supply voltage Vdd of 3.3 V to supply a voltage of 1.8 V (=Vcc) to pseudo-power supply lines VA1 and VA2. A voltage step-down circuit VDC1 includes a transistor P1, a comparator CP and resistances R1 and R2. Transistor P1 is arranged between power supply voltage Vdd and pseudo-power supply line VA, and receives on its gate an output signal of comparator CP. Comparator CP compares a voltage on an internal node Nd with a reference voltage Vref, and provides a result of this comparison. More specifically, when the voltage on internal node Nd is higher than reference voltage Vref (1.8 V), comparator CP provides the "H" level, whereby transistor P1 is turned of When the voltage on internal node Nd is lower than reference voltage Vref (1.8 V), comparator CP provides the "L" level, which turns on transistor P1. Resistances R1 and R2 are connected in series between power supply voltage Vcc and ground voltage GND via internal node Nd. Resistance division based on resistances R1 and R2 is adjusted to place a voltage of about 1.8 V on internal node Nd when power supply voltage Vdd is 3.3 V.

By this structure, transistor P1 already described with reference to FIG. 3(a) may be used as a driver transistor in the final stage. Voltage step-down circuit VDC2 is substantially the same as voltage step-down circuit VDC1 so that description thereof is not repeated.

Although the following description will be given primarily on the structure in FIG. 3(a), the structures already described can be applied to other structures.

In the above example, the structure of the inverter has been described as logic circuit group L1. However, this is not restrictive.

Figure 6:
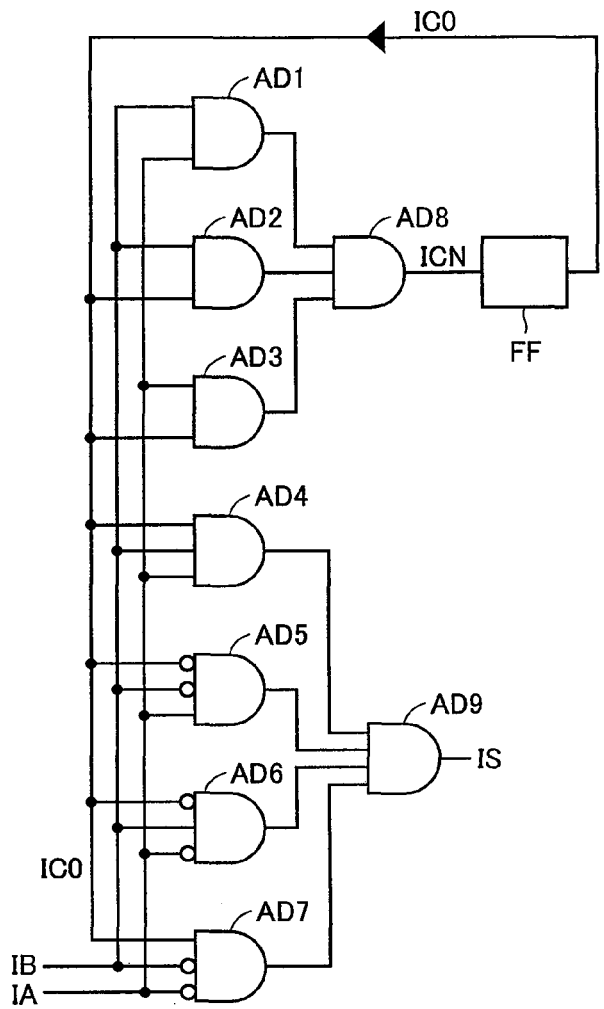
FIG. 6 shows an example of an arithmetic and logic circuit forming a logic circuit group.

FIG. 6 is an example of an arithmetic and logic operation circuit forming the logic circuit group.

Referring to FIG. 6, a full adder is shown as an example of the arithmetic and logic operation circuit. More specifically, AND circuits AD1-AD9 and a flip-flop circuit FF are arranged.

AND circuit AD1 provides a result of logical AND between input data IA and IB to one of input nodes of an AND circuit AD8. AND circuit AD2 provides a result of logical AND between input data IB and IC0 to one of input nodes of AND circuit AD8. AND circuit AD3 provides a result of logical AND between input data IA and IC0 to one of the input nodes of AND circuit AD8. AND circuit AD8 receives results provided from AND circuits AD1-AD3, and provides a result of logical AND among them to flip-flop circuit FF as output data ICN. Flip-flop circuit FF receives and holds output data ICN from AND circuit AD8. When next input data IA and IB are input, flip-flop circuit FF outputs the held data as input data IC0.

AND circuit AD4 provides a result of the logical AND among input data IA, IB and IC0 to one of the input nodes of AND circuit AD9. AND circuit AD5 provides a result of logical AND among inverted data of input data IC0, inverted data of input data IB and inverted data of input data IA to one of the input nodes of AND circuit AD9. AND circuit AD6 provides a result of logical AND among inverted data of input data IC0, input data IB and inverted data of input data IA to one of the input nodes of AND circuit AD9. AND circuit AD7 provides a result of logical AND between inverted data of input data IA and inverted data of Ib to one of the input nodes of AND circuit AD9. AND circuit AD9 provides a result of logical AND of the output data of AND circuits AD4-AD7 as output data IS. Output data IS is sum data of input data IA and IB, and output data ICN is carry data.

The full adder has been described as an example of the logic circuit group. However, the logic circuit group is not restricted to the above, and may be applied to the foregoing inverter, NAND circuit, NOR circuit and the like as well as a combination of them. Also, the logic circuit group may also be applied to an Arithmetic and Logic Unit (ALU) such as a subtractor or a multiplier, and other various circuits.

The structure that supplies power supply voltage Vcc as the operation voltage has been described as an example of the structure of the foregoing logic circuit group. However, the above structure may be employed for supplying a current instead of power supply voltage Vcc according to the control signal.

Figure 7:
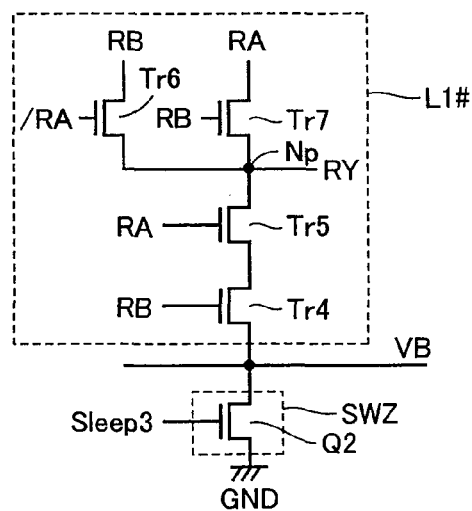
FIG. 7 shows an example of a logic circuit group supplying a current from a control signal line instead of a power supply voltage Vcc.

FIG. 7 shows an example of a logic circuit group supplying a current instead of power supply voltage Vcc from a control signal line.

Referring to FIG. 7, a structure differs from the structure in FIG. 3 in that logic circuit group L1 in FIG. 3 is replaced with a logic circuit group L1#. Logic circuit group L1# is a logic circuit supplying a current from a control signal line, and is an exclusive OR circuit (XOR circuit) formed of so-called pass-transistors.

More specifically, logic circuit group L1# includes transistors Tr4-Tr7. Transistors Tr4 and Tr5 are connected in series between an output node Np receiving an output signal RY and pseudo-ground line VB, and receive signals RA and RB on their gates, respectively.

Transistor Tr6 receives signal RB from an input terminal on a source side, has a drain side electrically coupled to node Np and receives a signal /RA on its gate. Transistor Tr7 receives signal RA from an input terminal on the source side, has a drain side electrically coupled to node Np and receives a signal /RB on its gate.

An operation of logic circuit group L1# will now be described.

For example, when both signals RA and RB are at the "L" level, the inverted signals thereof are supplied to gates of transistors Tr6 and Tr7 to turn on them, respectively. More specifically, transistors Tr6 and Tr7 are turned on to transmit signals RA and RB to node Np. Since both signals RA and RB are at the "L" level, transistors Tr4 and Tr5 are both off. Since signals RA and RB are at the "L" level, signal RY at the "L" level is provided from output node Np.

When signals RA and RB are at the "H" and "L" levels, respectively, transistor Tr6 receives on its gate an inverted signal (at the "L" level) of signal RA, and transistor Tr7 receives on its gate an inverted signal (at the "H" level) of signal RB. Thereby, transistor Tr7 is turned on to transmit signal RA to node Np. Thus, output node Np outputs signal RY at the "H" level. Since one of signals RA and RB is at the "L" level, only one of transistors Tr4 and Tr5 is on, and the other is off. Therefore, pseudo-ground line VB is electrically decoupled from node Np.

When signals RA and RB at the "L" and "H" levels, respectively, transistor Tr6 receives an inverted signal (at the "H" level) of signal RA on its gate, and transistor Tr7 receives an inverted signal (at the "L" level) of signal RB on its gate. Thereby, transistor Tr6 is turned on to transmit signal RB to node Np. Thus, output node Np outputs signal RY at the "H" level. Since only one of signals RA and RB is at the "L" level, only one of transistors Tr4 and Tr5 is on, and the other is off so that pseudo-ground line VB is electrically decoupled from node Np.

When both signals RA and RB are the "H" level, transistors Tr6 and Tr7 receive the inverted signals (at the "L" level) thereof on their gates, respectively, and therefore are off. Since transistors Tr5 and Tr4 receive signals RA and RB, respectively, both transistors Tr5 and Tr4 are on and electrically couple output node Np to pseudo-ground line VB. Thus, pseudo-ground line VB is electrically coupled to ground voltage GND so that the signal at the "L" level is transmitted to output node Np to provide signal RY at the "L" level.

Thus, in this XOR circuit, output node Np is electrically coupled to input nodes of signals RA and RB to form signal transmission paths of signals RA and RB in response to input of signals RA and RB, respectively. Also, output node Np and ground voltage GND are electrically coupled together to form the signal transmission path fixed at the "L" level.

In the active mode, this XOR circuit receives control signal Sleep1 at the "H" level. In the standby mode, it receives control signal Sleep1 at the "L" level.

In this structure, for example, when externally supplied signals RA and RB are at the "L" level during the standby mode, signals /RA and /RB are at the "H" level so that the charges are pulled out from the gates of transistors Tr6 and Tr7, and pseudo-ground line VB is charged with them through transistors Tr4 and Try.

Similarly to the case already described, therefore, when logic circuit group L1# attains the standby mode, a part of the charges required for raising the potential of pseudo-ground line VB is supplemented with the charges carried by the pseudo-ground line of the other logic circuit group. Thereby, it is possible to reduce the quantity of charges that are pulled out from the gates of transistors Tr6 and Tr7, and thereby to suppress the power consumption.

In the case where logic circuit group L1# does not have a power supply and operates with only external signals, as is done in the above structure, the externally supplied current is consumed. Therefore, this current to be supplied can be reduced by charging pseudo-ground line VB, and the power consumption of the whole circuit can be reduced.

The XOR circuit using the pass-transistors has been discussed as an example of logic circuit group L1#, it is not particularly restricted to the XOR circuit, and it is naturally possible to provide another logic circuit formed of the pass-transistors.

In the above description, signals RA, RB and the like indicate that these are electrically coupled to signal interconnections supplying the voltage signals indicating the logical levels of the signals in question, respectively, and the signal interconnections in question are included in the voltage interconnections that supply the voltages described in the first embodiment. Also, signals RA, RB and the like are supplied at the logical levels that are arbitrarily changed.

First Modification of the First Embodiment

Figure 8:
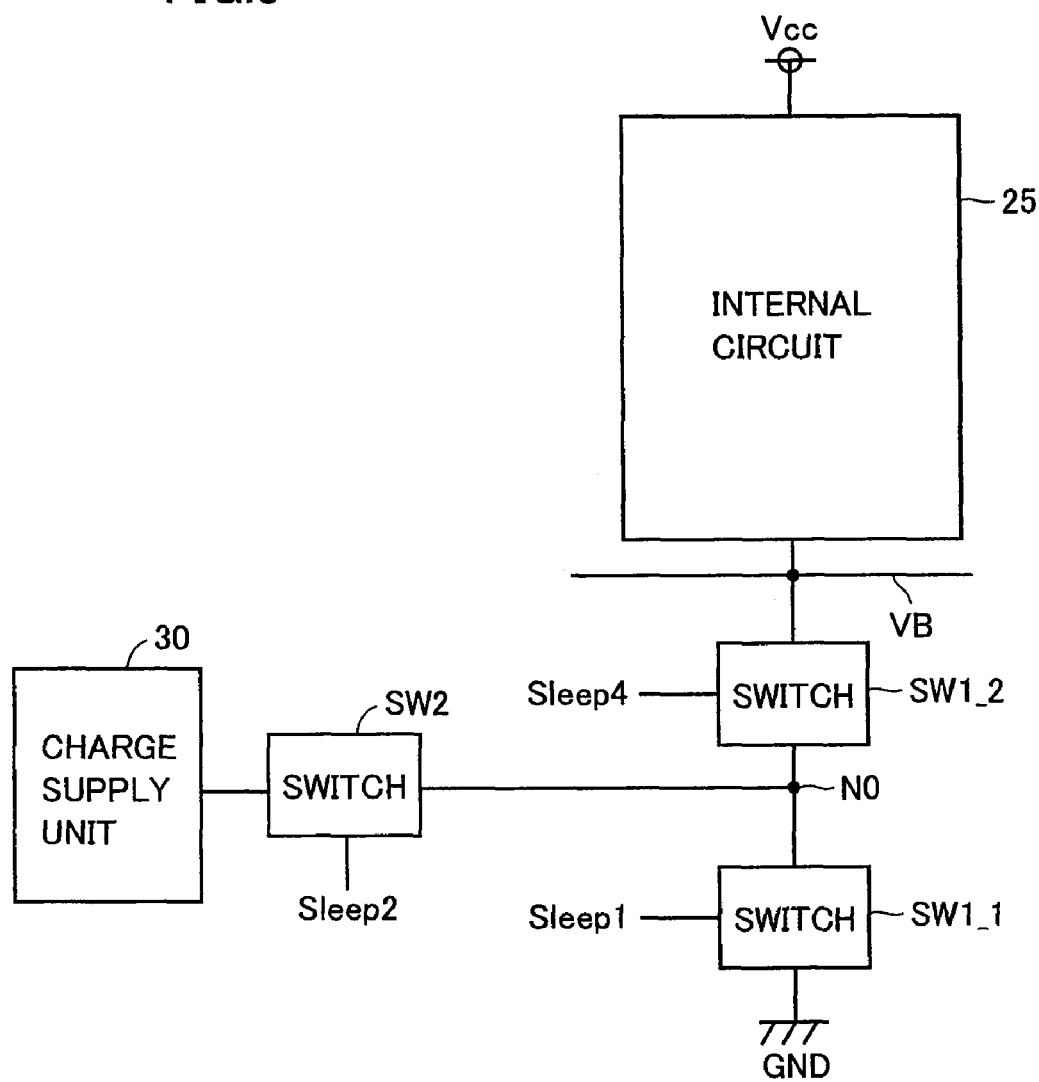
FIG. 8 is another diagram illustrating a basic structure supplying power supply voltage Vcc and ground voltage GND to the internal circuit according to the embodiment of the invention.

FIG. 8 is another diagram illustrating a basic structure supplying power supply voltage Vcc and ground voltage GND to the internal circuit according to the embodiment of the invention.

Referring to FIG. 8, pseudo-ground line VB is arranged corresponding to internal circuit 25. Pseudo-ground line VB is electrically coupled to internal node N0 via a switch SW1_2. Charge supply unit 30 is electrically coupled to internal node N0 via switch SW2. Internal node N0 is electrically coupled to ground voltage GND via a switch SW1_1.

Switch SW1_1 electrically couples ground voltage GND to internal node N0 in response to control signal Sleep1.

Switch SW2 electrically couples charge supply unit 30 to internal node N0 in response to control signal Sleep2.

Switch SW1_2 electrically couples internal node N0 to pseudo-ground line VB in response to a control signal Sleep4.

Charge supply unit 30 has held charges, and is configured to discharge the charges held in charge supply unit 30 to internal node N0 when switch SW2 is turned on in response to control signal Sleep2. When switch SW1_2 is turned on, pseudo-ground line VB is charged with the charges held in charge supply unit 30.

Figure 9:
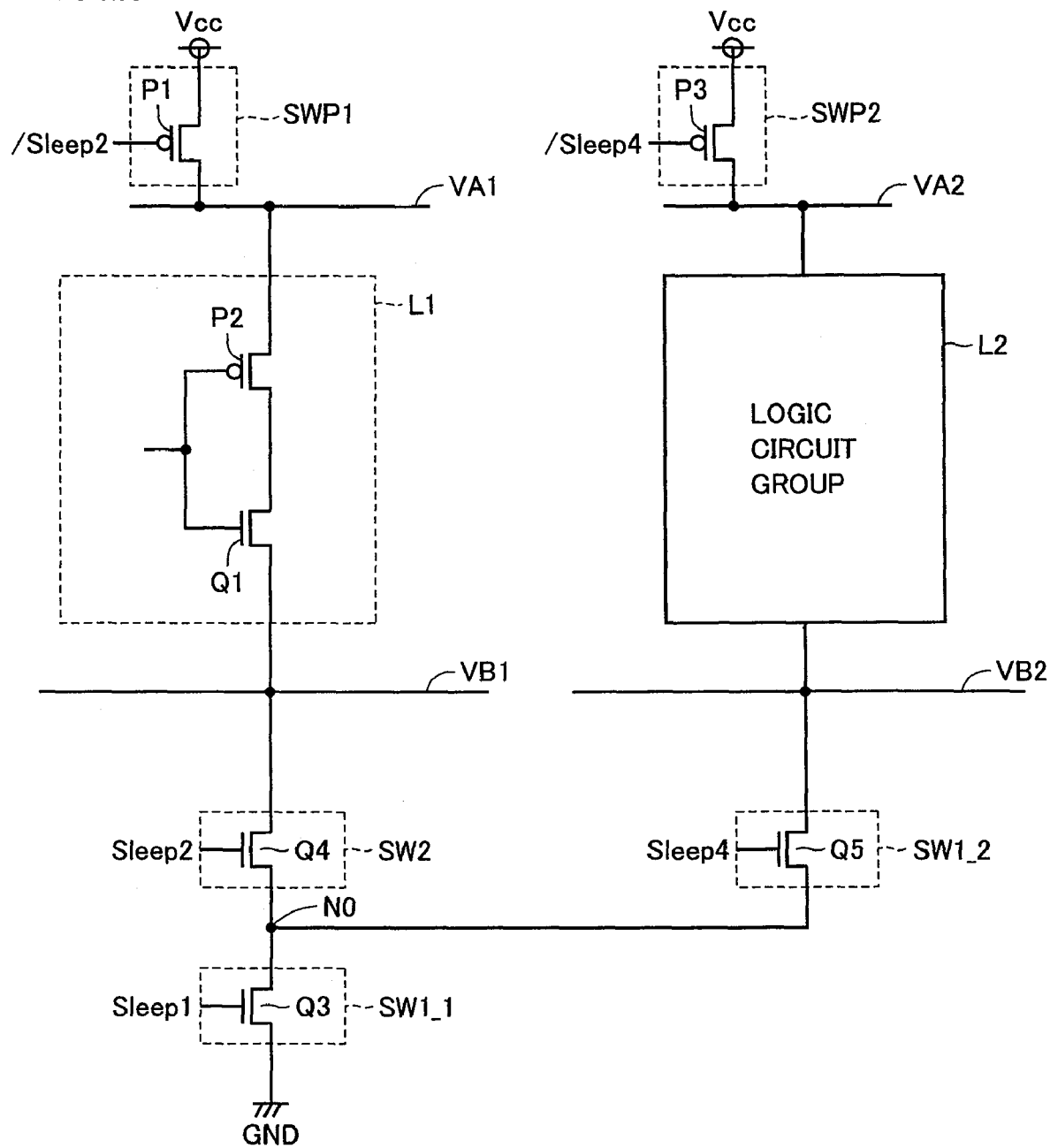
FIG. 9 illustrates an MTCMOS circuit according to a first modification of the first embodiment of the invention.

FIG. 9 illustrates an MTCMOS circuit according to a first modification of the first embodiment of the invention.

Referring to FIG. 9, the MTCMOS circuit according to the first modification of the first embodiment of the invention includes logic circuit groups L1 and L2, pseudo-power supply lines VA1 and VA2 arranged corresponding to logic circuit groups L1 and L2, respectively, switches SWP1 and SWP2 arranged corresponding to pseudo-power supply lines VA1 and VA2 for controlling electrical connections between power supply line VL and them, respectively, pseudo-ground lines VB1 and VB2 arranged corresponding to logic circuit groups L1 and L2, respectively, switches SW2 and SW1_2 arranged corresponding to pseudo-ground lines VB1 and VB2 for controlling electrical connections between internal node N0 and them, respectively, and switch SW1_1 arranged between internal node N0 and ground line GL. Switches SWP1 and SWP2 include P-channel MOS transistors P1 and P3 having threshold voltages larger in absolute value than the threshold voltages of the transistors forming logic circuit group L1, and receive control signals /Sleep2 and /Sleep4. The pseudo-power supply line and the pseudo-ground line are voltage supply lines supplied with power supply voltage Vcc and ground voltage GND, respectively.

More specifically, switch SW2 includes transistor Q4 and electrically couples internal node N0 to pseudo-ground line VB1 in response to input of control signal Sleep2. Switch SW1_1 includes transistor Q3, and electrically couples internal node N0 to ground line GL in response to input of control signal Sleep1. Switch SW1_2 includes transistor Q5, and electrically couples internal node N0 to pseudo-ground line VB2 in response to input of control signal Sleep4.

Figure 10:
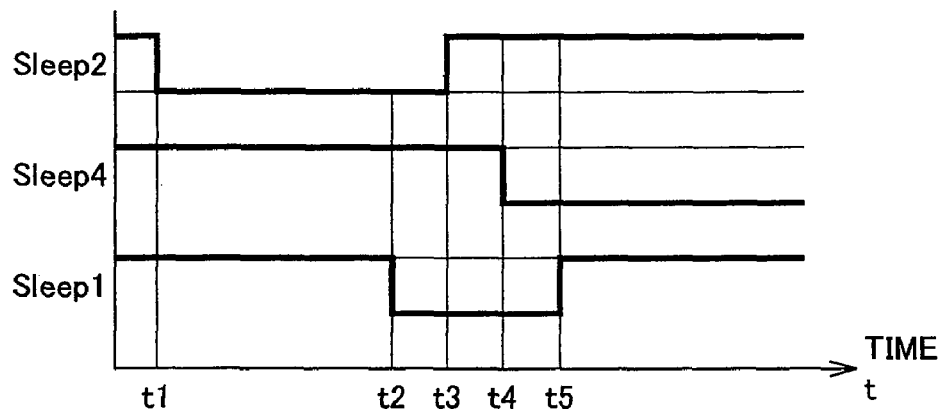
FIG. 10 is a timing chart illustrating an operation of the MTCMOS circuit according to the first modification of the first embodiment of the invention.

FIG. 10 is a timing chart illustrating an operation of the MTCMOS circuit according to the first modification of the first embodiment of the invention.

Referring to FIG. 10, at time t1, logic circuit group L2 attains the active mode, and logic circuit group L1 attains the standby mode. More specifically, control signals Sleep2 and /Sleep2 attain the "L" and "H" levels, respectively. Control signals Sleep4 and /Sleep4 attain the "H" and "L" levels, respectively. Control signal Sleep1 attains the "H" level.

Thereby, transistor Q3 is turned on to couple electrically internal node N0 to ground voltage GND. Transistor Q4 is turned off to decouple electrically pseudo-ground line VB1 from internal node N0. Transistor Q5 is turned on to couple electrically internal node N0 to pseudo-ground line VB2. Transistor P3 is turned on to couple electrically power supply voltage Vcc to pseudo-power supply line VA2. Transistor P1 is turned off to decouple electrically pseudo-power supply line VA1 from power supply voltage Vcc.

Therefore, logic circuit group L2 attains the active mode, and is supplied with a voltage required for an operation so that it executes the predetermined operation. Logic circuit group L1 attains the standby mode, and the power supply to it is interrupted because transistors P1 and Q4 are off.

At subsequent time t2, control signal Sleep1 attains the "L" level. Thereby, transistor Q3 is turned off to decouple electrically internal node N0 from ground voltage GND. At subsequent time t3, control signal Sleep2 attains the "H" level. Thereby, transistor Q4 is turned on to couple electrically pseudo-ground line VB1 to internal node N0. In this operation, control signal Sleep4 is already at the "H" level so that transistor Q5 is already on to couple electrically pseudo-ground lines VB1 and VB2 together via internal node N0.

At time t4, control signal Sleep4 attains the "L" level. Thereby, transistor Q5 is turned off to decouple electrically pseudo-ground line VB2 from internal node N0.

At subsequent time t5, control signal Sleep1 attains the "H" level. Thereby, transistor Q3 is turned on to couple electrically internal node N0 to ground voltage GND. Since transistor Q4 is on, pseudo-ground line VB1 is electrically coupled to ground voltage GND. Thereby, logic circuit group L1 attains the active mode, and is supplied with the voltage required for the operation so that it executes the predetermined operation. Logic circuit group L2 attains the standby mode, and is not supplied with the voltage because transistors P3 and Q5 are off.

Figure 11:
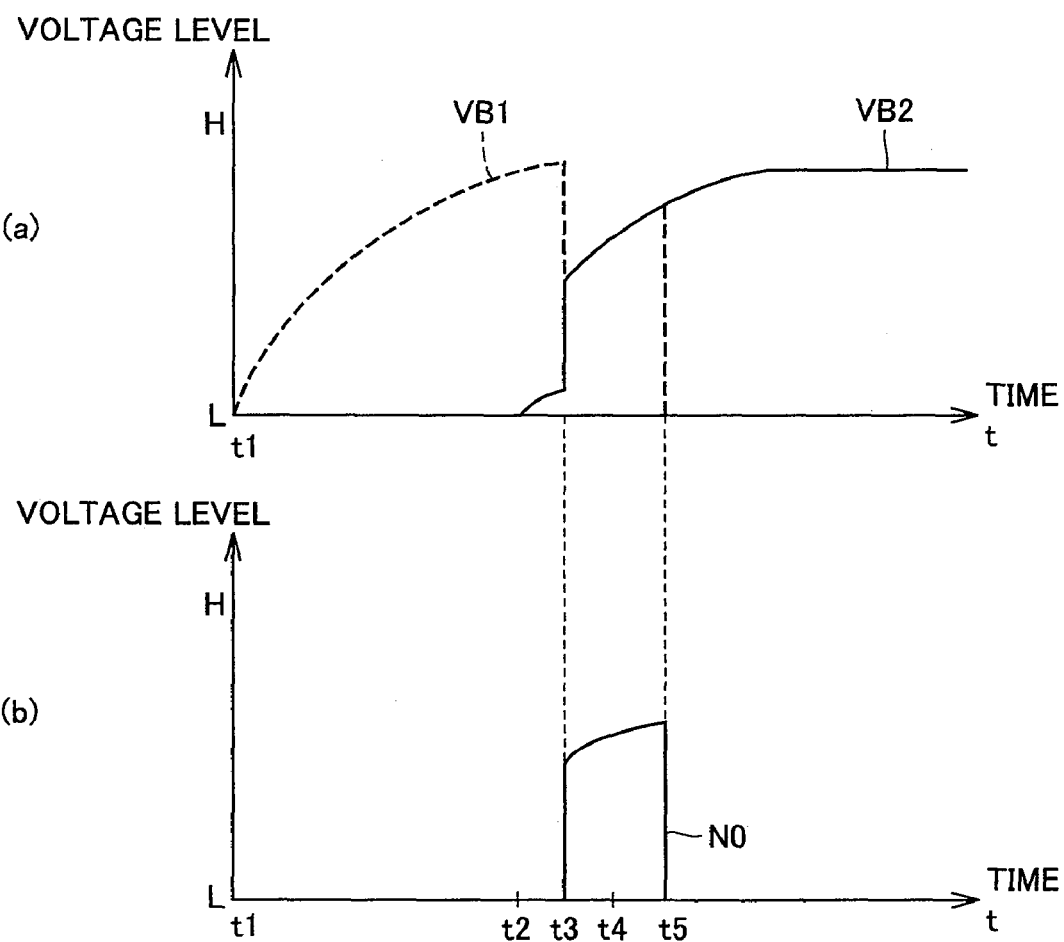
FIG. 11 illustrates voltage levels of pseudo-ground lines VB1 and VB2 of the MTCMOS circuit according to the first modification of the first embodiment of the invention, and particularly the voltage levels according to input of control signals in FIG. 10.

FIG. 11 illustrates voltage levels of pseudo-ground lines VB1 and VB2 of the MTCMOS circuit according to the first modification of the first embodiment of the invention.

FIG. 11(a) shows the potential levels of pseudo-ground lines VB1 and VB2. FIG. 11(b) illustrates a potential level of internal node N0.

At time t1, pseudo-ground line VB1 is already decoupled electrically from ground voltage GND because transistor Q4 is off. Therefore, pseudo-ground line VB1 will be charged with a current leaking from logic circuit group L1, and the potential thereof will rise. At time t1, transistors Q3 and Q5 are already on so that ground voltage GND and pseudo-ground line VB2 are already coupled electrically together. Therefore, pseudo-ground line VB2 has a potential of 0 V. Pseudo-ground line VB1 attains a balanced potential at the level that keeps a balance of the leak current.

At time t2, as control signal Sleep1 attains the "L" level, transistor Q3 is turned off to decouple electrically ground voltage GND and internal node N0 from each other.

Thereby, the leak current flowing through logic circuit group L2 starts to charge gradually internal node N0 and pseudo-ground line VB2 so that the potentials thereof start to rise.

At subsequent time t3, control signal Sleep2 attains the "H" level, and thereby pseudo-ground line VB1 is electrically coupled to internal node N0. In this operation, as already described, pseudo-ground line VB2 and internal node N0 are already coupled electrically together, and therefore the charges that are already carried by pseudo-ground line VB1 are discharged to pseudo-ground line VB2. FIG. 11(a) shows the case where the potential of node N0 rapidly rises at time t3.

At time t4, control signal Sleep4 attains the "L" level to decouple electrically internal node N0 from pseudo-ground line VB2, and logic circuit group L2 attains the standby mode. At time t5, control signal Sleep1 attains the "H" level, and thereby internal node N0 is electrically coupled to ground voltage GND. Thus, pseudo-ground line VB1 is electrically coupled to ground voltage GND and attains the active mode.

The structure according to the first modification of the first embodiment of the invention is likewise configured such that the timing control is performed by switches SW1_1 and SW1_2, and thereby the charges with which pseudo-ground line VB1 was charged during the standby mode of logic circuit group L1 are discharged to pseudo-ground line VB2 when logic circuit group L2 attains the standby mode, and raise the potential of pseudo-ground line VB2.

More specifically, in the structure according to the first modification of the first embodiment of the invention, pseudo-ground line VB1 of logic circuit group L1 corresponding to charge supply unit 30 accumulates the charging charges when logic circuit group L1 is in the standby mode. The charging charges are discharged from charge supply unit 30 through the switch to pseudo-ground line VB2 of logic circuit group L2 corresponding to the internal circuit so that pseudo-ground line VB2 is charged.

Therefore, the above structure can use the charges carried by pseudo-ground line VB1 for supplementing, with them, a part of the charges required for raising the potential of pseudo-ground line VB2 when logic circuit group L2 attains the standby mode. Thus, pseudo-ground line VB2 can reduce the quantity of the charges pulled out from the power supply voltage Vcc side for raising the potential based on the charges discharged from pseudo-ground line VB1 (charge supply unit), and thereby can reduce the power consumption.

This example has been described in connection with the case where pseudo-power supply lines VA1 and VA2 are electrically coupled to the same power supply voltage Vcc. However, instead of the connection to the same power supply voltage, pseudo-power supply lines VA1 and VA2 may be electrically coupled to different power supply voltages, respectively. For example, power supply voltage Vcc1 may be arranged for pseudo-power supply line VA1, and power supply voltage Vcc2 may be arranged for pseudo-power supply line VA2.

Second Modification of the First Embodiment

Figure 12:
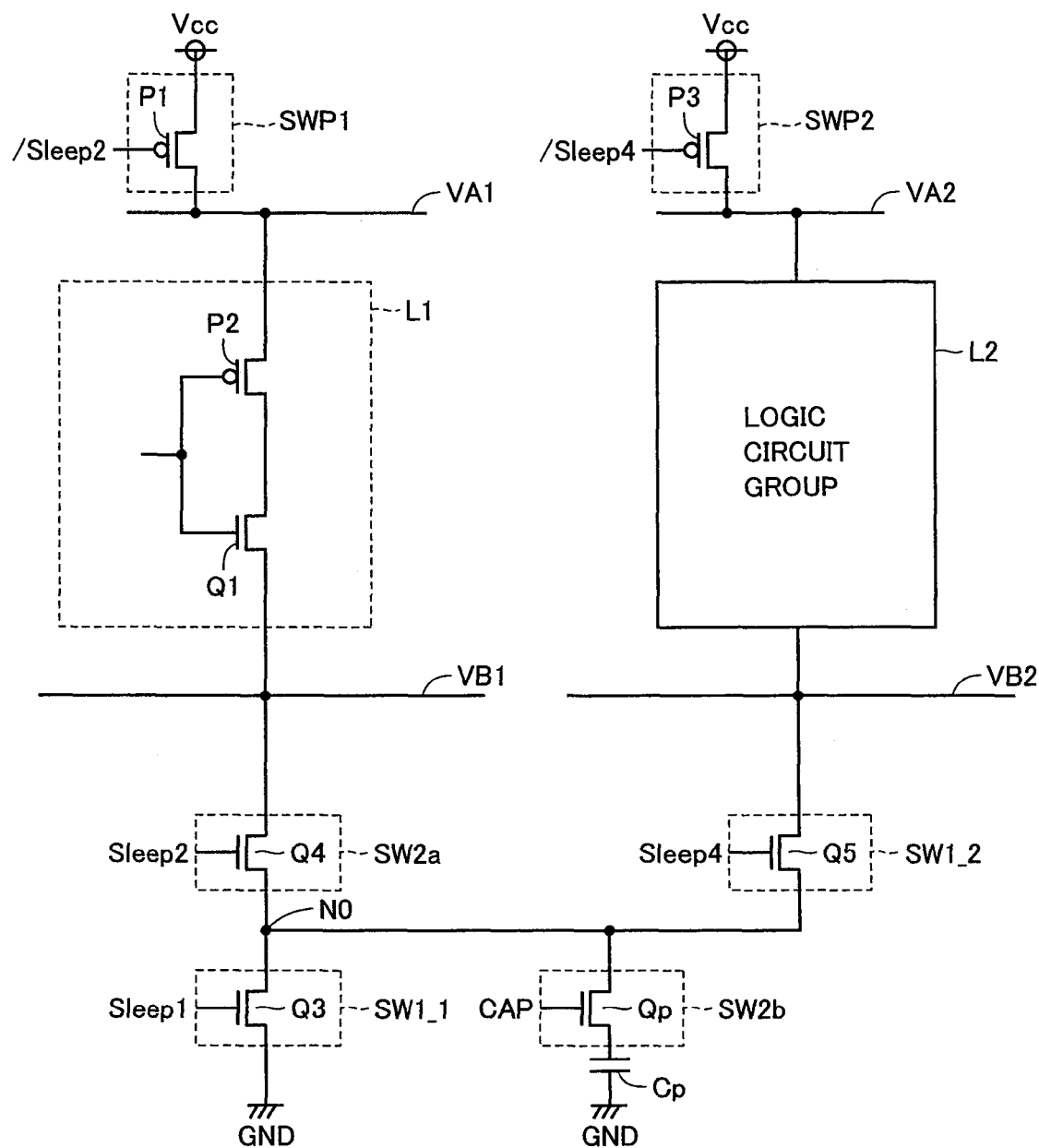
FIG. 12 illustrates an MTCMOS circuit according to a second modification of the first embodiment of the invention.

FIG. 12 illustrates an MTCMOS circuit according to a second modification of the first embodiment of the invention.

Referring to FIG. 12, the MTCMOS circuit according to the second modification of the first embodiment of the invention differs from the MTCMOS circuit according to the first modification described with reference to FIG. 9 in that switch SW2 is replaced with a switch SW2a, and a switch SW2b and a capacitor Cp are additionally employed. More specifically, switch SW2a includes transistor Q4, and electrically couples internal node N0 to pseudo-ground line VB1 in response to input of control signal Sleep2. Switch SW2b includes a transistor Qp, and is arranged between internal node N0 and capacitor Cp having conductors, one of which is electrically coupled to ground voltage GND, and particularly between internal node N0 and the other conductor of capacitor Cp. In response to a received control signal CAP, the electrical connection between internal node N0 and the other conductor of capacitor Cp is controlled.

Figure 13:
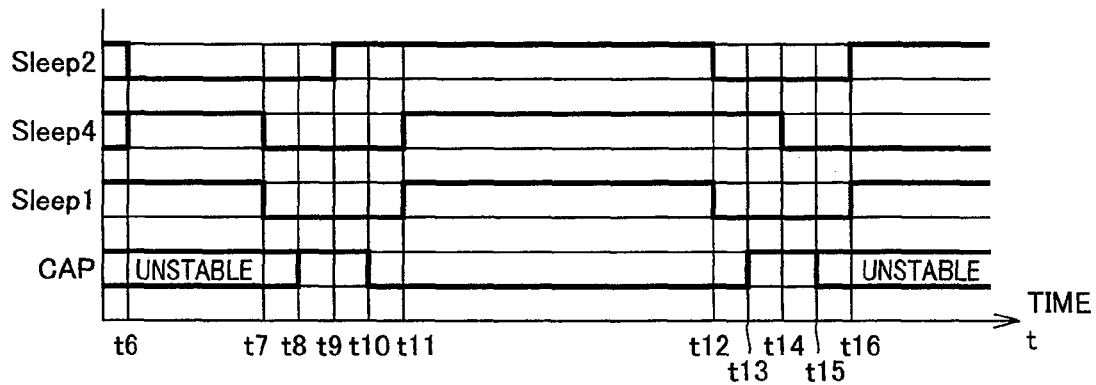
FIG. 13 is a timing chart illustrating an operation of the MTCMOS circuit according to the second modification of the first embodiment of the invention.

FIG. 13 is a timing chart illustrating an operation of the MTCMOS circuit according to the second modification of the first embodiment of the invention.

Referring to FIG. 13, at a time t6, logic circuit group L2 attains the active mode, and logic circuit group L1 attains the standby mode. More specifically, control signals Sleep2 and /Sleep2 attain the "L" and "H" levels, respectively. Control signals Sleep4 and /Sleep4 attain the "H" and "L" levels, respectively. Control signal Sleep1 attains the "H" level. Thereby, transistor Q4 is turned off, and transistors Q3 and Q5 are turned on. Control signal CAP is unstable.

Therefore, pseudo-power supply line VA2 is electrically coupled to power supply voltage Vcc, and pseudo-ground line VB2 is electrically coupled to ground voltage GND. Logic circuit group L2 is supplied with the power, and executes the predetermined operation.

At a time t7, control signals Sleep4 and Sleep1 attain the "L" level. Thereby, transistors Q3 and Q5 are turned off. It is not necessary to turn off transistors Q3 and Q5 at the same time, and they may be turned off at different times, respectively. At a time t8, control signal CAP attains the "H" level. Thereby, transistor Qp is turned on to couple electrically node N0 to capacitor Cp.

At a subsequent time t9, control signal Sleep2 attains the "H" level. Therefore, transistor Q4 is turned on to couple electrically pseudo-ground line VB1 to node N0. In this operation, control signal CAP is at the "H" level so that capacitor Cp accumulates the charges which have been stored in the pseudo-ground line VB1.

At a time t10, control signal CAP attains the "L" level, and transistor Qp is turned off to decouple electrically node N0 from capacitor Cp.

At a time t11, control signals Sleep4 and Sleep1 attain the "H" level. Thereby, both transistors Q5 and Q3 are turned on, and pseudo-ground lines VB1 and VB2 are electrically coupled to ground voltage GND. It is not necessary to turn on transistors Q5 and Q3 at the same timing, and they may be turned on at different times, respectively.

Therefore, logic circuit groups L1 and L2 attain the active mode, and are supplied with the power required for the operations so that they execute the predetermined operations.

At a time t12, control signal Sleep2 attains the "L" level. Transistor Q4 is turned off to decouple electrically pseudo-ground line VB1 from node N0. Also, control signal Sleep1 attains the "L" level. Thereby, transistor Q3 is turned off to decouple electrically node N0 from ground voltage GND. It is not necessary to turn off transistors Q4 and Q3 at the same time, and they may be turned off at different times, respectively.

At a time t13, control signal CAP attains the "H" level. Thereby, the other conductor of capacitor Cp is electrically coupled to node N0. At this time, control signal Sleep4 attains the "H" level to couple electrically internal node N0 to pseudo-ground line VB2. Therefore, capacitor Cp is electrically coupled to node N0 in response to input of control signal CAP (at the "H" level), and the charges accumulated in capacitor Cp are discharged to pseudo-ground line VB2.

At a subsequent time t14, control signal Sleep4 attains the "L" level to turn off transistor Q5.

At a time t16, control signals Sleep2 and Sleep1 attain the "H" level. Thereby, transistors Q4 and Q3 are turned off. It is not necessary to turn on transistors Q4 and Q3 at the same time, and they may be turned on at different times, respectively.

Thereby, pseudo-ground line VB1 is electrically coupled to ground voltage GND via node N0, and attains 0 V. Logic circuit group L1 attains the active mode, and logic circuit group L2 attains the standby mode. In this operation, control signal CAP is unstable.

Control signal CAP has been described as an example of timing for performing the charging with the charges accumulated in the pseudo-ground line and the discharging of such charges. Timing other than that defined as described above may be employed, provided that the above purposes can be achieved. In this example, by keeping the signal at the "H" level between times t8-t11, charging with the charges accumulated, e.g., in pseudo-ground line VB1 can be performed. Also, by keeping the signal at the "H" level between times t12 and t15, the accumulated charges can be discharged, e.g., to pseudo-ground line VB2. By the above setting, the purpose of the structure can be achieved.

Figure 14:
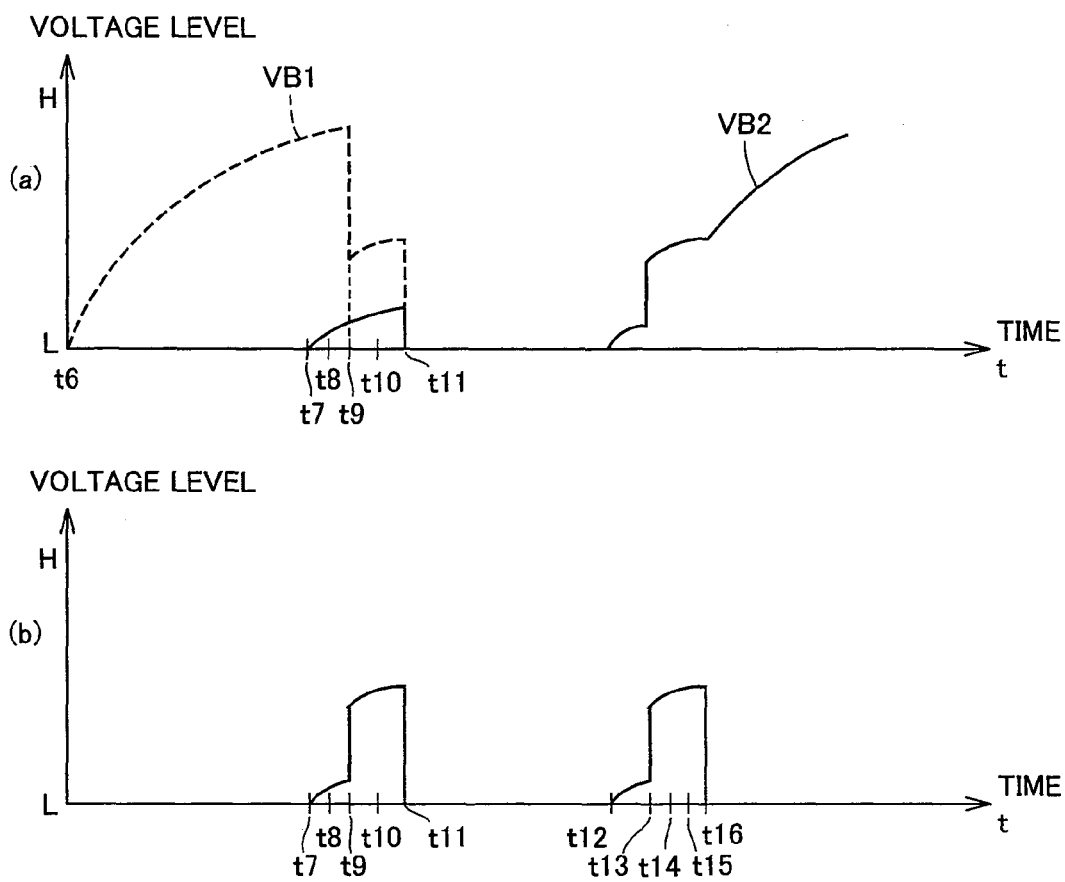
FIG. 14 illustrates voltage levels of pseudo-ground lines VB1, VB2 and node N0 of the MTCMOS circuit according to the second modification of the first embodiment of the invention, and particularly the voltage levels according to input of control signals in FIG. 13.

FIG. 14 illustrates the voltage levels of pseudo-ground lines VB1 and VB2 as well as node N0 in the MTCMOS circuit according to the second modification of the first embodiment of the invention, and particularly the voltage levels according to input of the control signals in FIG. 13.

FIG. 14(a) illustrates voltage levels of pseudo-ground lines VB1 and VB2. FIG. 14(b) illustrates the voltage level of node N0. It is noted that capacitor Cp in an initial state has not stored charges.

At time t6, transistor Q4 is off so that pseudo-ground line VB1 is already decoupled electrically from ground voltage GND. Therefore, pseudo-ground line VB1 is charged with a current leaking from logic circuit group L1, and the potential thereof will rise. A time t6, transistors Q5 and Q3 are on so that ground voltage GND and pseudo-ground line VB2 are already electrically coupled together. Therefore, the potential of pseudo-ground line VB2 is 0 V. Pseudo-ground line VB1 attains the balanced potential at the level that keeps the balance of the leak current.

At subsequent time t7, control signals Sleep4 and Sleep1 attain the "L" level so that transistors Q5 and Q3 are turned off to decouple electrically node N0 from ground voltage GND. Since transistor Q5 is turned off, pseudo-ground line VB2 is electrically decoupled from node N0. Thereby, pseudo-ground line VB2 and node N0 are gradually charged with the leak current flowing through logic circuit group L2, and the levels thereof start to rise.

At subsequent time t8, control signal CAP attains the "H" level, and transistor Qp is turned on to couple electrically capacitor Cp to node N0.

At time t9, control signal Sleep2 attains the "H" level, and pseudo-ground line VB1 is electrically coupled to node N0. Thereby, capacitor Cp accumulates the charges that have been accumulated in pseudo-ground line VB1.

At time t9 in FIG. 14(b), the potential of node N0 coupled to pseudo-ground line VB1 bearing the charges rapidly rises.

At subsequent time t10, control signal CAP attains the "L" level, and transistor Qp is turned off to decouple electrically capacitor Cp from internal node N0.

At time t11, control signals Sleep4 and Sleep1 attain the "H" level. Thereby, transistors Q5 and Q3 are turned on to couple electrically pseudo-ground line VB2 to ground voltage GND via internal node N0. Control signal Sleep2 is kept at the "H" level and transistor Q4 is on so that pseudo-ground line VB1 is electrically coupled to ground voltage GND via internal node N0.

At a subsequent time t12, control signals Sleep2 and Sleep1 attain the "L" level. Thereby, transistors Q4 and Q3 are turned off so that node N0 is electrically decoupled from ground voltage GND. Also, pseudo-ground line VB1 is electrically decoupled from internal node N0.

At a subsequent time t13, control signal CAP attains the "H" level. Thereby, transistor Qp is turned on to couple electrically the other conductor of capacitor Cp to internal node N0. Thereby, the charges accumulated in capacitor Cp are discharged to internal node N0. In this operation, control signal Sleep4 is at the "H" level so that pseudo-ground line VB2 is electrically coupled to node N0, and the potential thereof rises according to the charges accumulated in capacitor Cp.

FIG. 14(b) shows rapid rising of the potential of pseudo-ground line VB2 and node N0 that are electrically coupled to capacitor Cp accumulating the charges.

At time t14, control signal Sleep4 attains the "L" level. Thereby, transistor Q5 is turned off to decouple electrically pseudo-ground line VB2 from node N0. At time t14, transistor Q5 is off so that pseudo-ground line VB2 is electrically decoupled from ground voltage GND. Therefore, pseudo-ground line VB2 that is charged with the leak current flowing from logic circuit group L2 will rises to the balanced potential that keeps the balance of the leak current.

At time t16, control signals Sleep1 and Sleep2 attain the "H" level. Thereby, transistors Q4 and Q3 are turned on to couple electrically pseudo-ground line VB1 to ground voltage GND via internal node N0. Thus, logic circuit group L1 attains the active mode, and logic circuit group L2 attains the standby mode because transistor Q5 is off.

In the structure of the second modification of the first embodiment of the invention, the charges carried by pseudo-ground line VB1 are accumulated and held in capacitor Cp corresponding to charge supply unit 30 in FIG. 8 during a predetermined period, e.g., when logic circuit group L1 in the standby mode. When logic circuit group L2 corresponding to internal circuit 25 attains the standby mode, the charges are discharged to pseudo-ground line VB2 and thereby raise the potential of pseudo-ground line VB2. The structure that charges pseudo-ground line VB2 with the charges accumulated in capacitor Cp has been described by way of example. However, this is not restrictive, and the structure that charges pseudo-ground line VB1 with the charges accumulated in capacitor Cp may be naturally employed. Further, the description has been given on the manner in which capacitor Cp accumulates the charges with which pseudo-ground line VB1 was charged during the standby mode of logic circuit group L1. However, such a structure can be naturally employed that capacitor Cp accumulates the charges with which pseudo-ground line VB2 was charged during the standby mode of logic circuit group L2.

For example, when logic circuit group L2 is set to the standby mode, the above structure can supplement a part of charges required in raising the potential of pseudo-ground line VB2, with the charges carried by pseudo-ground line VB1. Thus, the potential of pseudo-ground line VB2 rises based on the charges discharged from pseudo-ground line VB1 so that it is possible to reduce the quantity of charges pulled out from the power supply voltage Vcc side and to reduce the power consumption.

In the structures of the first embodiment and the first modification that have been described, one of logic circuit groups L1 and L2 is in the active mode, and the other is in the standby mode. However, in the structures of the second modification of the first embodiment, capacitor Cp can accumulate and hold the charges so that it is not necessary to set one of the logic circuit groups to the standby mode, and flexibility in design can be improved. Naturally, the charges accumulated in capacitor Cp can be used for its own circuit, i.e., logic circuit group L1 in addition to another circuit, i.e., logic circuit group L2.

As capacitor Cp, it is possible to employ a gate capacitor formed between a gate electrode of a transistor and a semiconductor substrate or an interconnection capacity that is a load capacity of the interconnection connected between transistors.

Third Modification of the First Embodiment

Figure 15:
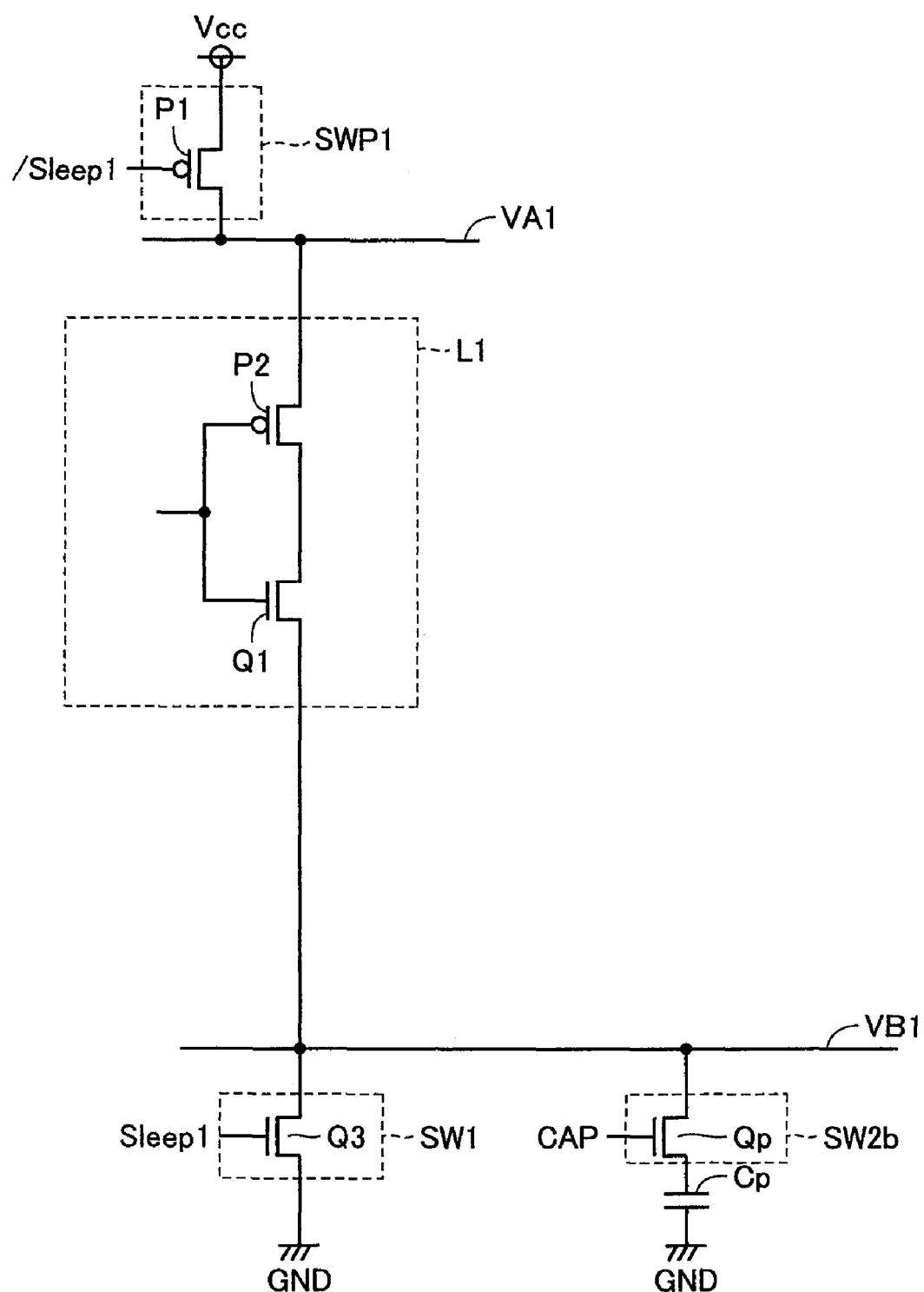
FIG. 15 illustrates an MTCMOS circuit according to a third modification of the first embodiment of the invention.

FIG. 15 illustrates an MTCMOS circuit according to a third modification of the first embodiment of the invention.

Referring to FIG. 15, the MTCMOS circuit according to the third modification of the first embodiment of the invention differs from the MTCMOS circuit according to the first embodiment already described with reference to FIG. 3(a) in that the circuit corresponding to logic circuit group L2 is not employed. More specifically, pseudo-power supply line VA1 and pseudo-ground line VB1 are arranged corresponding to logic circuit group L1, and switch SWP1 controlling the electric connection between pseudo-power supply line VA1 and power supply line VL, switch SW1 controlling the electric connection between pseudo-ground line VB1 and ground line GL, foregoing switch SW2b and capacitor Cp are arranged between pseudo-ground line VB1 and ground voltage GND.

Figure 16:
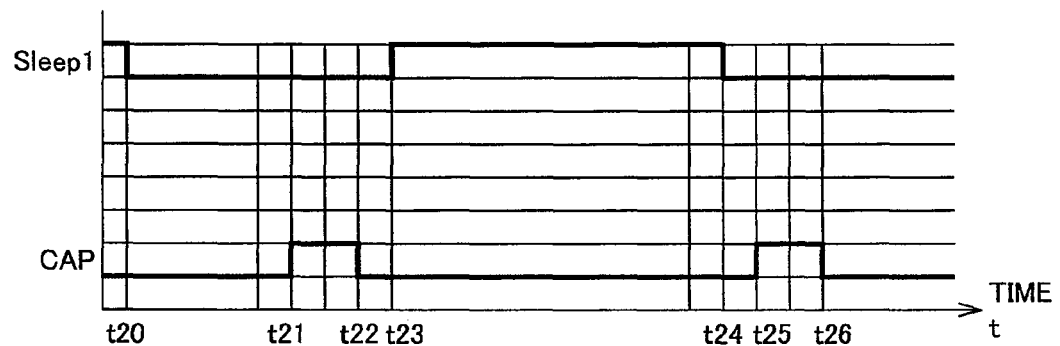
FIG. 16 is a timing chart illustrating an operation of the MTCMOS circuit according to the third modification of the first embodiment of the invention.

FIG. 16 is a timing chart illustrating an operation of the MTCMOS circuit according to the third modification of the first embodiment of the invention.

Referring to FIG. 16, at a time t20, logic circuit group L1 attains the standby mode. More specifically, control signals Sleep1 and /Sleep1 attain the "L" and "H" levels, respectively. Thereby, transistors P1 and Q3 are turned off. Therefore, pseudo-power supply line VA1 is electrically decoupled from power supply voltage Vcc, and pseudo-ground line VB1 is electrically decoupled from ground voltage GND.

At a subsequent time t21, control signal CAP attains the "H" level. Thereby, transistor Qp is turned on to couple electrically pseudo-ground line VB1 to the other conductor of capacitor Cp so that capacitor Cp accumulates the charges that have been carried by pseudo-ground line VB1.

At time t22, control signal CAP attains the "L" level, and transistor Qp is turned off to decouple electrically node N0 from capacitor Cp.

At a subsequent time t23, logic circuit group L1 attains the active mode. More specifically, control signals Sleep1 and /Sleep1 attain the "H" and "L" levels, respectively. Thereby, transistors P1 and Q3 are turned on. Therefore, pseudo-power supply line VA1 and power supply voltage Vcc are electrically coupled together, and pseudo-ground line VB1 and ground voltage GND are electrically coupled together so that logic circuit group L1 is supplied with the power required for the operation, and executes the predetermined operation.

At a subsequent time t24, control signals Sleep1 and /Sleep1 attain the "L" and "H" levels, respectively. Thereby, transistors P1 and Q3 are turned off so that pseudo-power supply line VA1 is electrically decoupled from power supply voltage Vcc, and pseudo-ground line VB1 is electrically decoupled from ground voltage GND. At a time t25, control signal CAP attains the "H" level. Thereby, transistor Qp is turned on to couple electrically the other conductor of capacitor Cp to pseudo-ground line VB1. Therefore, the charges accumulated in capacitor Cp are discharged to pseudo-ground line VB1.

Figure 17:
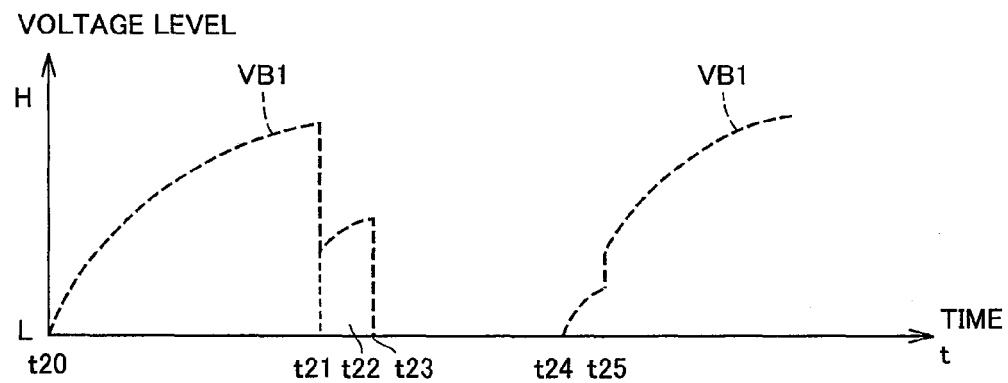
FIG. 17 illustrates a voltage level of pseudo-ground line VB1 of the MTCMOS circuit according to the third modification of the first embodiment of the invention, and particularly the voltage level according to input of control signals in FIG. 16.

FIG. 17 illustrates the voltage level of pseudo-ground line VB1 of the MTCMOS circuit according to the third modification of the first embodiment of the invention, and particularly illustrates the voltage level according to input of the control signals in FIG. 16.

Referring to FIG. 17, at time t20, transistor Q2 is off so that pseudo-ground line VB1 is electrically decoupled from ground voltage GND. Pseudo-ground line VB1 is charged with the current leaking from logic circuit group L1, and the potential of pseudo-ground line VB1 will rise. The potential level of pseudo-ground line VB1 attains a balanced potential at a level that keeps the balance of the leak current.

At subsequent time t21, control signal CAP attains the "H" level, and transistor Qp is turned on to couple electrically capacitor Cp to pseudo-ground line VB1. Thereby, capacitor Cp accumulates the charges that have been carried by pseudo-ground line VB1.

FIG. 17 shows the case in which pseudo-ground line VB1 charged with the charges is electrically coupled to capacitor Cp at time t21, and the potential thereof lowers corresponding to the charges accumulated in capacitor Cp.

At subsequent time t22, control signal CAP attains the "L" level, and transistor Qp is turned off to decouple electrically capacitor Cp from internal node N0.

At subsequent time t23, control signals Sleep1 and /Sleep1 attain the "H" and "L" levels, respectively. Thereby, transistors P1 and Q2 are turned on to couple pseudo-power supply line VA1 and pseudo-ground line VB1 to power supply voltage Vcc and ground voltage GND, respectively. Thereby, pseudo-ground line VB1 attains the voltage level of 0 V.

At subsequent time t24, control signals Sleep1 and /Sleep1 attain the "L" and "H" levels, respectively. Thereby, transistors P1 and Q3 are turned off. Thereby, pseudo-power supply line VA1 and pseudo-ground line VB1 are electrically decoupled from power supply voltage Vcc and ground voltage GND, respectively.

At a time t25, control signal CAP attains the "H" level. Thereby, transistor Qp is turned on to couple electrically the other conductor of capacitor Cp to pseudo-ground line VB1. Thereby, the charges accumulated in capacitor Cp are discharged to pseudo-ground line VB1.

FIG. 17 shows the case in which the gradual charging of pseudo-ground line VB1 with the leak current flowing through logic circuit group L1 starts at time t24 to raise the potential thereof, and the potential of pseudo-ground line VB1 electrically coupled to capacitor Cp accumulating the charges rapidly rises at time t25. Pseudo-ground line VB1 has been electrically decoupled from ground voltage GND because transistor Q3 is off. Pseudo-ground line VB1 is charged with the current leaking from logic circuit group L1 so that the potential of pseudo-ground line VB1 will rise to the balanced potential that keeps the balance of the leak current. Thus, logic circuit group L1 attains the standby mode because transistor Q3 is off.

In the structure according to the third modification of the first embodiment of the invention, therefore, capacitor Cp corresponding to charge supply unit 30 in FIG. 2 temporarily accumulates and holds the charges with which pseudo-ground line VB1 is charged during the standby mode of logic circuit group L1. The charges thus accumulated in capacitor Cp are discharged to pseudo-ground line VB1 of logic circuit group L1 corresponding to internal circuit 25 when the next standby mode is to be attained, so that the potential of pseudo-ground line VB1 rises.

In the above structure, the charges carried by pseudo-ground line VB1 can be reused for a part of the charges that are required for raising the potential of pseudo-ground line VB1, e.g., when logic circuit group L1 attains the standby mode. Therefore, the above structure can reduce the quantity of charges pulled out from the power supply voltage Vcc side, and can reduce the power consumption.

The structures of the second and third modifications already described employ capacitor Cp, which accumulates the charges carried by the pseudo-ground line for using the charges accumulated in capacitor Cp so that the pseudo-ground line may be charged with these accumulated charges when the standby mode is attained. However, such a structure may be naturally employed that switch SW3, pseudo-ground line VB2, logic circuit group L2 and the like already described with reference to FIG. 3 are employed for pseudo-ground line VB1, and thereby the charging is performed on pseudo-ground line VB2 of logic circuit group L2, i.e., another circuit.

Fourth Modification of the First Embodiment

Although the second and third modifications have been described in connection with the structure that uses the capacitor for charging the pseudo-ground line, another configuration may be employed.

Figure 18:
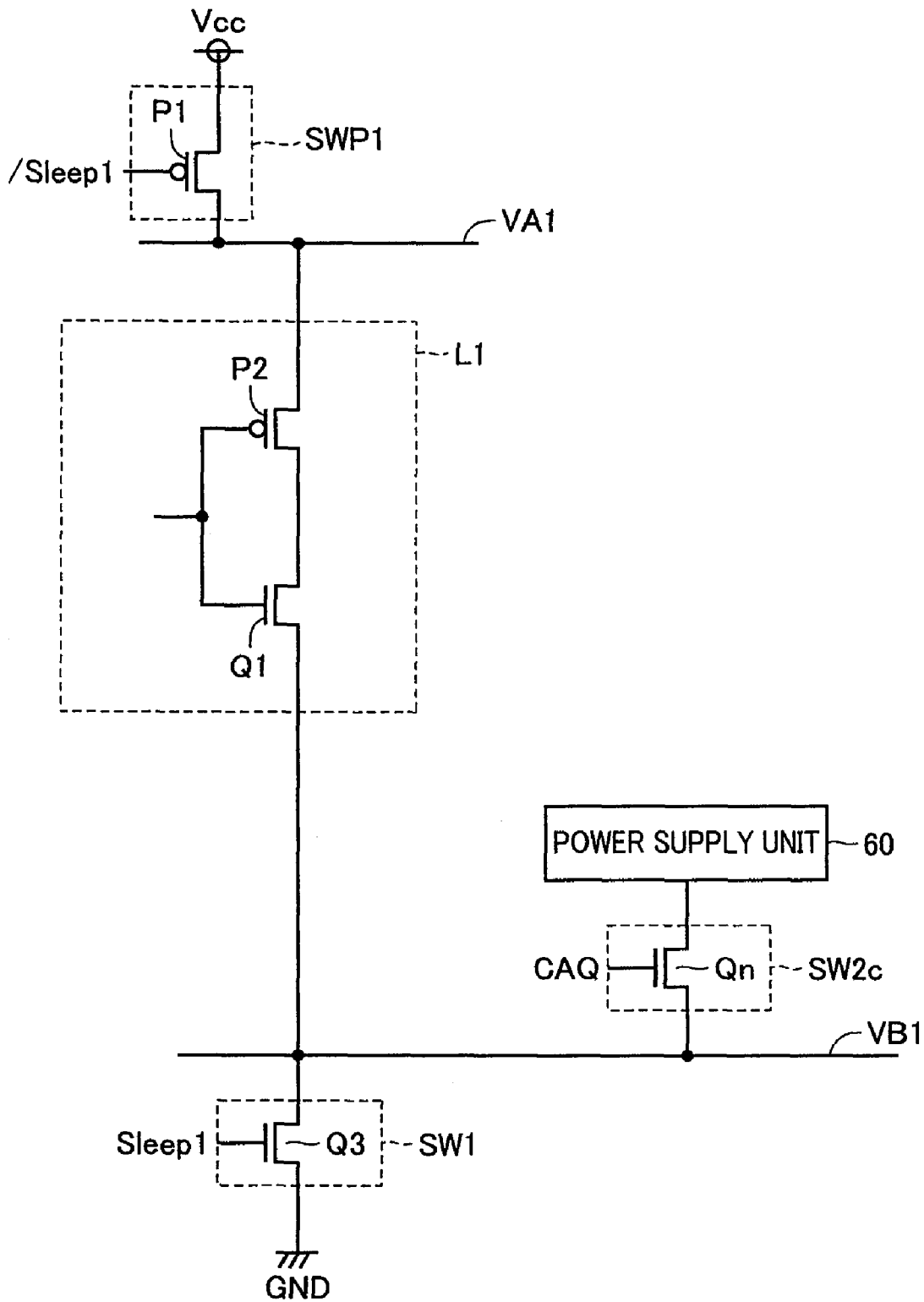
FIG. 18 illustrates a MTCMOS circuit according to a fourth modification of the first embodiment of the invention.

FIG. 18 illustrates an MTCMOS circuit according to a fourth modification of the first embodiment of the invention.

Referring to FIG. 18, the MTCMOS circuit according to the fourth modification of the first embodiment of the invention includes a power supply unit 60 and a switch SW2c instead of capacitor Cp and switch SW2b.

Switch SW2c includes a transistor Qn, and controls an electrical connection between power supply unit 60 and pseudo-ground line VB1 in response to input of a control signal CAQ.

Power supply unit 60 according to the fourth modification of the first embodiment of the invention includes a power generating unit that generates an electric power by converting physical energy other than electric energy into electric energy. For example, power supply unit 60 employs a photovoltaic element that generates a power based on light intensity of sunlight, a generator element using a spring that generates a power based on a kinetic moment of the spring or a thermal generator element that generates a power based on a heat flow rate. For example, an example of such generator elements is disclosed in a non-patent document (N. Hama, A. Yajima, Y. Yoshida, F. Utsunomiya, J. Kodate, T. Tsukahara, T. Douseki, "SOI Circuit Technology for Batteryless Mobile System with Green Energy Sources," "Symposium On VLSI Circuits Digest of Technical Papers, IEEE. 2002).

FIG. 19 illustrates the generator element according to the fourth modification of the first embodiment of the invention.

FIG. 19(a) shows an output voltage of the photovoltaic element. More specifically, an output voltage increases with a light intensity. FIG. 19(b) shows an output voltage of a generator element using a spring. An output voltage increases with a kinetic moment. A time during which an output voltage is maintained increases with the kinetic moment. FIG. 19(c) shows an output voltage of a thermal generator element. An output voltage as well as a duration of the output voltage increase with increase in heat flow rate.

Figure 20:
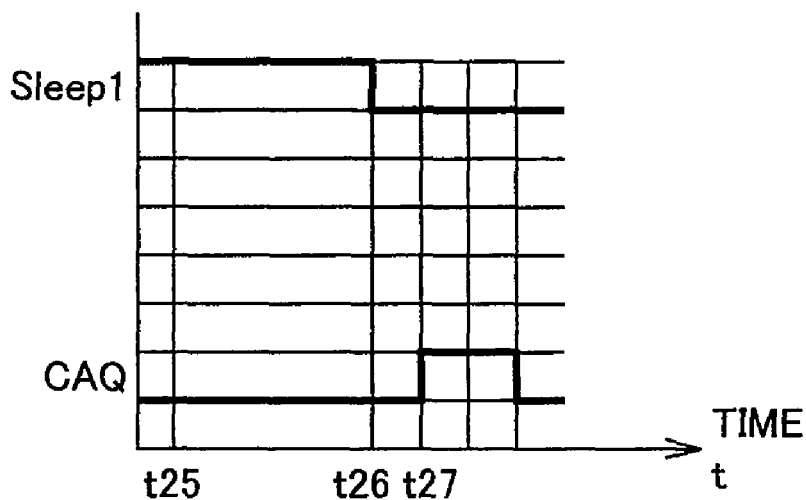
FIG. 20 is a timing chart illustrating an operation of the MTCMOS circuit according to the fourth modification of the first embodiment of the invention.

FIG. 20 is a timing chart illustrating an operation of the MTCMOS circuit according to the fourth modification of the first embodiment of the invention.

Referring to FIG. 20, logic circuit group L1 attains the active mode at time t25. More specifically, control signals Sleep1 and /Sleep1 attain the "H" and "L" levels, respectively. Thereby, transistors P1 and Q3 are turned on. Therefore, pseudo-power supply line VA1 is electrically coupled to power supply voltage Vcc, and pseudo-ground line VB1 is electrically coupled to ground voltage GND so that the power required for the operation is supplied, and the predetermined operation is executed.

At a subsequent time t26, control signals Sleep1 and /Sleep1 attain the "L" and "H" levels, respectively, and the standby mode is attained. Thereby, transistors P1 and Q3 are turned off to decouple electrically pseudo-power supply line VA1 from power supply voltage Vcc. Also, pseudo-ground line VB1 is electrically decoupled from ground voltage GND.

At a subsequent time t27, control signal CAP attains the "H" level. Thereby, transistor Qn is turned on to couple electrically pseudo-ground line VB1 to power supply unit 60. Thereby, the charges are discharged from power supply unit 60 to pseudo-ground line VB1 so that pseudo-ground line VB1 is charged with them.

Figure 21:
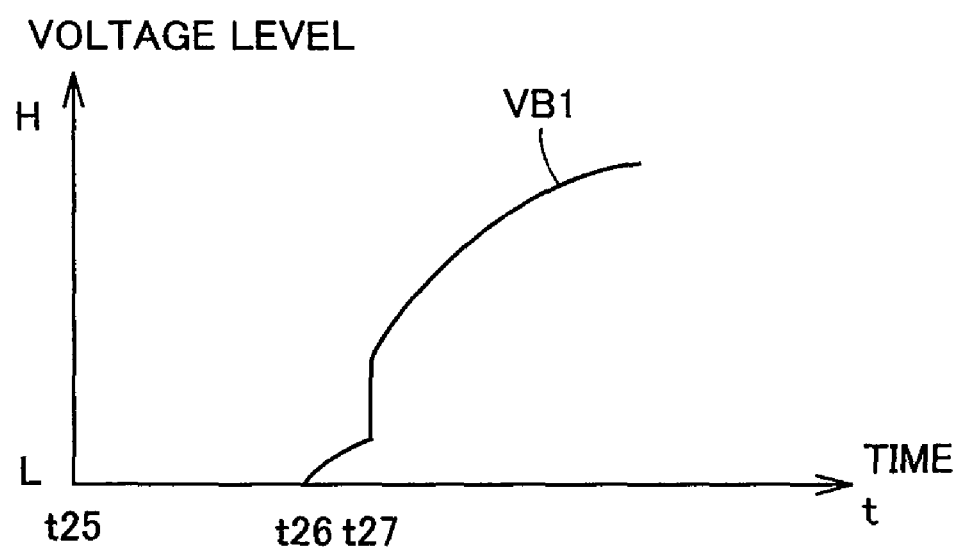
FIG. 21 illustrates a voltage level of pseudo-ground line VB1 of the MTCMOS circuit according to the fourth modification of the first embodiment of the invention, and particularly the voltage level according to input of control signals in FIG. 20.

FIG. 21 illustrates the voltage level of pseudo-ground line VB1 of the MTCMOS circuit according to the fourth modification of the first embodiment of the invention, and particularly illustrates the voltage level according to input of the control signals in FIG. 20.

Referring to FIG. 21, at time t25, transistor Q2 is on so that pseudo-ground line VB1 is electrically coupled to ground voltage GND, and attains 0 V. At subsequent time t26, transistor Q3 is turned off so that pseudo-ground line VB1 and ground voltage GND are electrically decoupled from each other. Therefore, pseudo-ground line VB1 is charged with the current leaking from logic circuit group L1, and the potential of pseudo-ground line VB1 starts to rise.

At time t27, transistor Qn is turned on to couple electrically pseudo-ground line VB to power supply unit 60, and power supply unit 60 charges pseudo-ground line VB1.

FIG. 21 shows the case where the potential of pseudo-ground line VB1 that electrically coupled to power supply unit 60 rapidly rises at time t27. Since transistor Q3 is off, pseudo-ground line VB1 has been electrically decoupled from ground voltage GND. Therefore, pseudo-ground line VB1 is charged with the current leaking from logic circuit group L1, and the potential of pseudo-ground line VB1 will rise to the balanced potential that can keep a balance of the leak current.

In the structure according to the fourth modification of the first embodiment of the invention, therefore, power supply unit 60 corresponding to charge supply unit 30 in FIG. 2 discharges the charges to pseudo-ground line VB1 of logic circuit group L1 corresponding to internal circuit 25 when the mode changes to the standby mode, and thereby the potential of pseudo-ground line VB1 rises.

This structure uses power supply unit 60, i.e., the foregoing generator element for providing a part of the charges that is required for raising the potential of pseudo-ground line VB1 when logic circuit group L1 attains the standby mode. Thereby, the structure can reduce the quantity of charges pulled out from the power supply voltage Vcc side, and can reduce the power consumption.

The voltages and output times of these generator elements vary depending on the situation, and therefore it has been difficult apply these generator elements to the semiconductor device requiring stable power supply. However, these generator elements can be sufficiently used as the charge supply unit for supplying charges. Therefore, by using the above generator elements depending on the situation of use of the semiconductor device, the generator element can be effectively used to reduce the power consumption.

When the power supply unit is used an external power supply, the power is pulled out from an external power supply instead of pulling out the quantity of charges from power supply voltage Vcc so that the power consumption of power supply voltage Vcc can be suppressed. When the capacity of power supply voltage Vcc is limited as is done, e.g., in a batter, the drive duration can be increased. Even when an external power supply cannot be applied, as the power supply, to the device in question and, for example, cannot be used as the power supply due to a low voltage, this external power supply can be used as means for charging the pseudo-ground line, and thereby the consumption of the power from power supply voltage Vcc can be reduced.

Fifth Modification of the First Embodiment

The first embodiment and the modification thereof have been described in connection with the structure that controls switch SW based on the single control signal. However, such a structure may be employed that switch SW is controlled based on input of a plurality of control signals instead of the single control signal.

FIG. 22 illustrates switches according to a fifth modification of the first embodiment of the invention. An example of this modification will be discussed in connection with switch SW2 illustrated in FIG. 3(a).

Referring to FIG. 22(a), switch SW2 includes transistors. Q4A and Q4B connected in series. Transistors Q4A and Q4B are connected between pseudo-ground lines VB1 and VB2, and receive control signals Sleep2A and Sleep2B on their gates, respectively. When both control signals Sleep2A and Sleep2B are at the "H" level, pseudo-ground lines VB1 and VB2 are electrically coupled together. When one of them is at the "L" level, pseudo-ground lines VB1 and VB2 are electrically decoupled from each other. Therefore, switch SW2 illustrated in FIG. 3(a) can be controlled in the above manner based on the combination of the plurality of input signals.

Referring to FIG. 22(b), switch SW2 includes transistors Q4C, Q4D and Q4E connected in parallel. Transistors Q4C, Q4D and Q4E are connected in parallel between pseudo-ground lines VB1 and VB2, and receive control signals Sleep2C, Sleep2D and Sleep2E on their gates, respectively. When one of control signals Sleep2C, Sleep2D and Sleep2E is at the "H" level, pseudo-ground lines VB1 and VB2 are electrically coupled together. When all the signals are at the "L" level, pseudo-ground lines VB1 and VB2 are electrically decoupled from each other. Therefore, switch SW2 illustrated in FIG. 3(a) can be controlled in the above manner based on the combination of the plurality of input signals. The above examples have been described in connection with the case where switch SW is controlled based on the combination of the transistors, and the number of the transistors is not restricted to the above number. Although the N-type MOS transistors have been described, P-type MOS transistors may be used. Instead of the transistors, switches having an electrical on/off function can be employed.

Although the logic circuit group included in the logic unit has been described as an example of the internal circuit, the internal circuit may likewise be applies to memories or the like included in the storage unit other than the logic circuit group.

The description has been given by way of example on the configuration that employs two kinds of modes, i.e., the active and standby modes, and reduces the power consumption in the logic circuit group at the time of mode switching. However, the storage unit may operate in a plurality of operation modes. For example, an SRAM memory cell can operate in an active mode for electrically coupling pseudo-ground line VB to ground voltage GND and executing an ordinary operation, and a standby mode for electrically decoupling pseudo-ground line VB from ground voltage GND and interrupting the power supply without storing an internal state of the SRAM memory cell, and further can operate, e.g., in a resume standby mode for regulating a potential of pseudo-ground line VB to a predetermined level and thereby interrupting the power supply while storing the internal state of the SRAM memory cell, or in a low power consumption operation mode for regulating the potential of pseudo-ground line VB according to the write and read operations to achieve lower power consumption than the ordinary operation.

Therefore, when the operation mode is switched to a mode in which the power supply is interrupted, the charge supply unit can supply the charges to the pseudo-ground line in the manner already described so that the power consumption can be reduced.

Second Embodiment

In a second embodiment of the invention described below, a switch does not operate at the time of switching of the operation mode, but operates during the operation mode.

An example of the second embodiment will be described in connection with a low power consumption operation mode of the SRAM memory cell.

Figure 23:
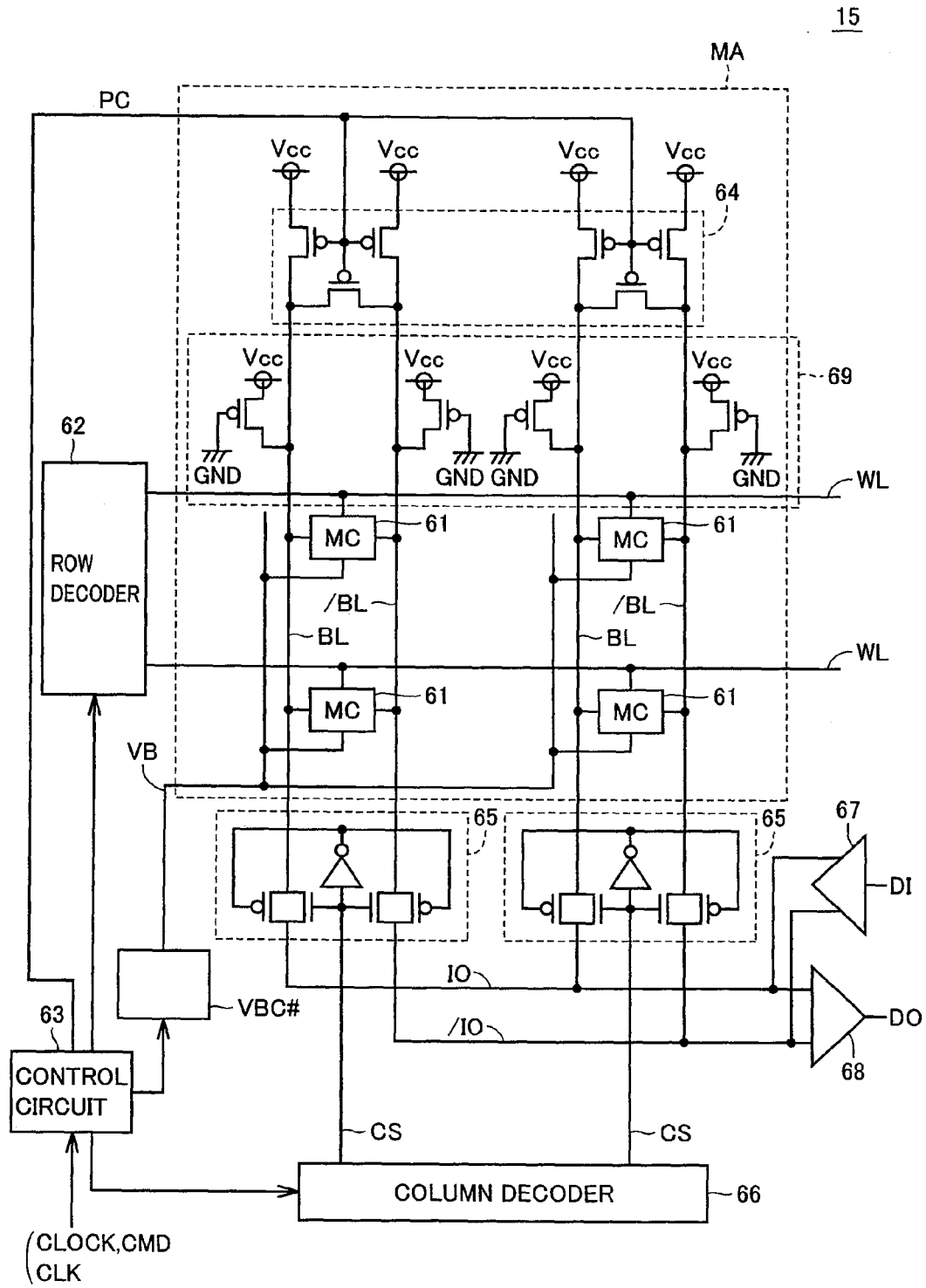
FIG. 23 is a schematic structural diagram illustrating a part of a storage unit 15 according to a second embodiment of the invention.

FIG. 23 is a schematic structural diagram illustrating a part of a storage unit 15 according to a second embodiment of the invention.

Referring to FIG. 23, storage unit 15 according to the second embodiment of the invention includes a memory array MA including MC arranged in rows and columns, a row decoder 62 selecting a row of memory cells MC, a column decoder 66 selecting a column of memory cells MC and a control circuit 63 for controlling a circuit block of the row decoder, column decoder and others, and also includes a data line IO and a complementary data line /IO used for reading and writing data. In this example, control circuit 63 receives a clock CLK and a command CMD, and provides control signals and others for operating various circuits. In this example, a control signal PC instructing a precharge is shown.

Memory array MA includes word lines WL arranged corresponding to the respective memory cell rows, and also includes bit lines BL and complementary bit lines /BL arranged corresponding to the respective memory cell columns.

Column select gates 65 are arranged corresponding to the memory cell columns, respectively, for electrically coupling bit line BL selected in response to input of a column select signal CS to data line 10. Also, it electrically couples complementary bit line /BL to complementary data line /IO.

Memory array MA further includes a write driver 67 that sets data lines IO and /IO to a predetermined voltage level corresponding to write data DI in response to input of write data DI, and a read amplifier 68 that provides read data DO by sensing a potential level of bit lines BL and /BL corresponding to a data read current flowing through bit lines BL and /BL in the selected row during the data reading.

Further, memory array MA includes a precharge circuit 64 for precharging bit lines BL and /BL. In response to input of control signal PC from control circuit 63, precharge circuit 64 electrically couples power supply voltage Vcc to bit lines BL and /BL for equalizing and precharging bit lines BL and /BL to the level of power supply voltage Vcc. A bit line load group 69 for supplying a data read current to memory cell MC in the data read operation is arranged for bit lines BL and /BL of memory array MA.

Figure 24:
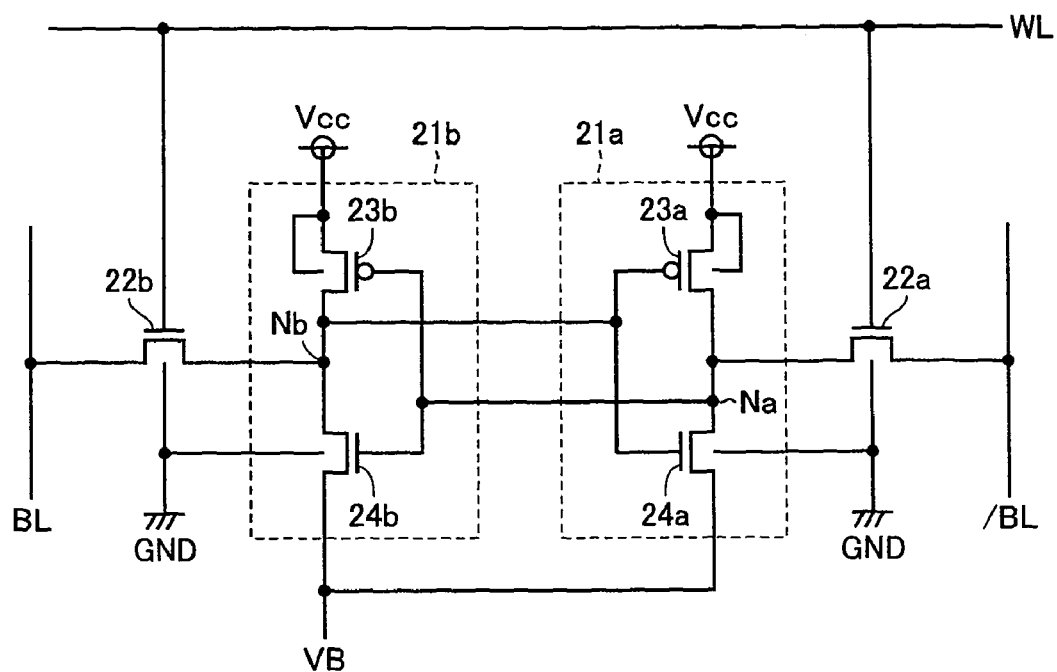
FIG. 24 illustrates a circuit structure of a memory cell MC according to the second embodiment of the invention.

FIG. 24 illustrates a circuit structure of memory cell MC according to the second embodiment of the invention.

Referring to FIG. 24, memory cell MC is formed of two inverter circuits 21a and 21b.

More specifically, inverter circuit 21a includes transistors 23a and 24a, and is connected between power supply voltage Vcc and pseudo-ground line VB with a storage node Na therebetween. A gate of each of transistors 23a and 24a is electrically coupled to a storage node Nb. Inverter circuit 21b includes transistors 23b and 24b. Transistors 23b and 24b are connected between power supply voltage Vcc and pseudo-ground line VB with storage node Nb therebetween. A gate of each of transistors 23b and 24b is electrically coupled to node Na.

Two inverter circuits 21a and 21b hold mutually complementary potential levels at the storage nodes, respectively. Access transistors 22a and 22b are also arranged. Access transistor 22a is arranged between storage node Na and complementary bit line /BL, and a gate thereof is electrically coupled to word line WL. Transistor 22b is arranged between storage node Nb and bit line BL, and a gate thereof is electrically coupled to word line WL.

In the data write operation, data lines IO and /IO that are set to the voltage levels corresponding to write data DI supplied via write driver 67 are electrically coupled to bit lines BL and /BL in the selected column, and one of them is set to "H" or "L" level and the other is set to "L" or "H" level. Word line WL in the selected row is activated to set storage nodes Na and Nb of selected memory cell MC to the mutually complementary potential levels, respectively.

In the data read operation, precharge circuit 64 precharges bit lines BL and /BL to power supply voltage Vcc. Thereafter, word line WL is selected, and the currents corresponding to the potential levels of the storage nodes of selected memory cell MC flow to bit lines BL and /BL as well as data lines IO and /IO. Read amplifier 68 senses these currents, and provides read data DO corresponding to a difference between the currents.

Figure 25:
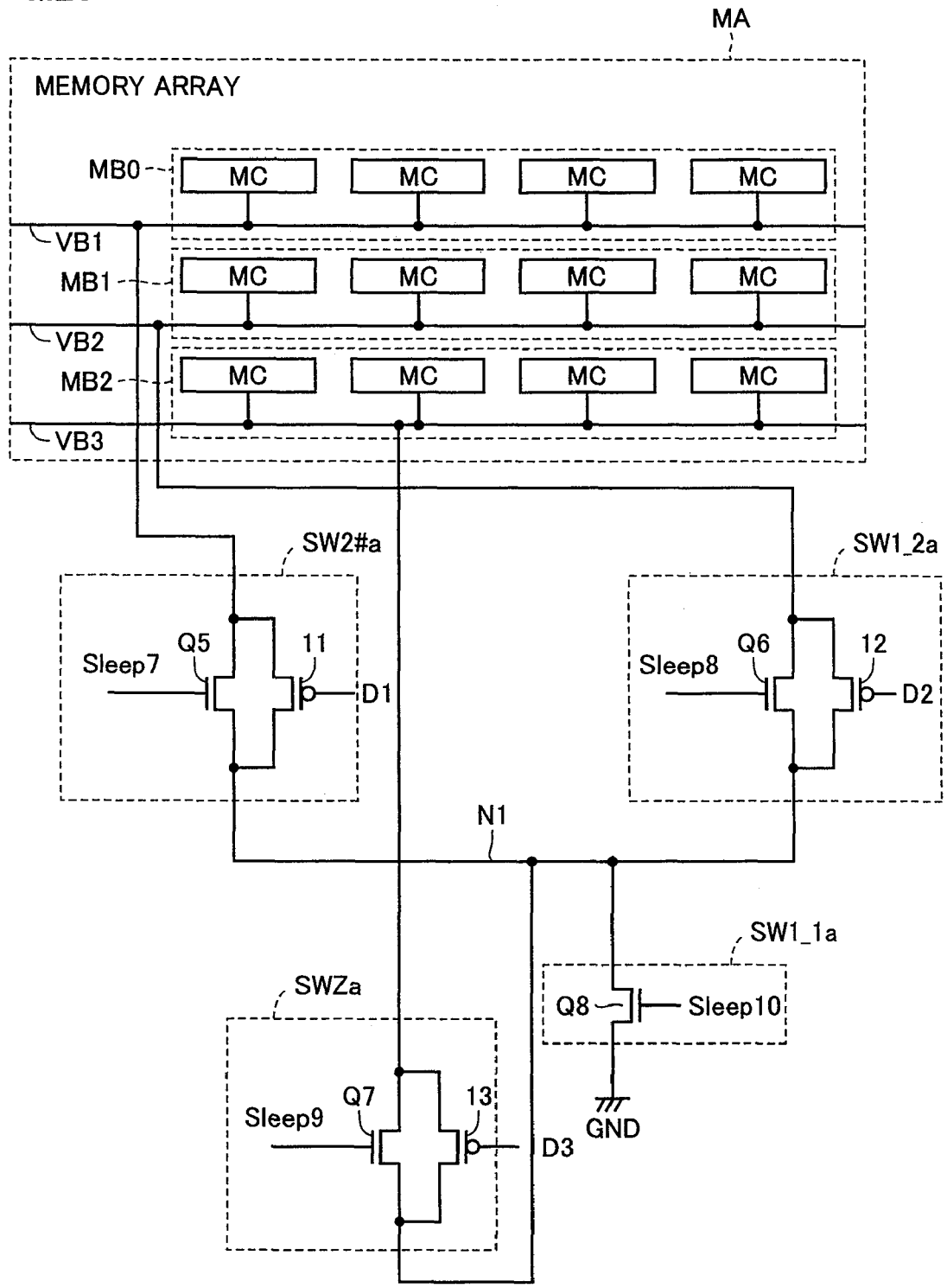
FIG. 25 illustrates a structure provided with switches for supplying a ground voltage to pseudo-ground lines of memory cells MC according to the second embodiment of the invention.

FIG. 25 illustrates a structure that employs switches for supplying the ground voltage to the pseudo-ground lines of memory cells MC according to the second embodiment of the invention.

Referring to FIG. 25, memory array MA in this example is divided into a plurality of memory blocks. More specifically, FIG. 25 shows three memory blocks MB0-MB2. Pseudo-ground line VB is arranged corresponding to each memory block MB. In the illustrated example, pseudo-ground lines VB1-VB3 are arranged corresponding to memory blocks MB0-MB2, respectively. Switches SW2#a, SWZa and SW1_2a are arranged between an internal node N1 and pseudo-ground lines VB1-VB3, respectively. A switch SW1_1a is arranged between internal node N1 and ground voltage GND.

Switch SW2#a includes transistors Q5 and 11. Transistor Q5 is arranged between pseudo-ground line VB1 and node N1, and receives a control signal Sleep7 on its gate. Transistor 11 is arranged in parallel with transistor Q5 and between pseudo-ground line VB1 and node N1, and receives a control signal D1 on its gate.

Switch SW1_2a includes transistors Q6 and 12. Transistor Q6 is arranged between pseudo-ground line VB2 and node N1, and receives a control signal Sleep8 on its gate. Transistor 12 is arranged in parallel with transistor Q6 and between pseudo-ground line VB2 and node N1, and receives a control signal D2 on its gate.

Switch SWZa includes transistors Q7 and 13. Transistor Q7 is arranged between pseudo-ground line VB3 and node N1, and receives a control signal Sleep9 on its gate. Transistor 13 is arranged in parallel with transistor Q7 and between pseudo-ground line VB3 and node N1, and receives a control signal D3 on its gate.

Switch SW1_1a includes a transistor Q8. Transistor Q8 is arranged between node N1 and ground voltage GND, and receives a control signal Sleep10 on its gate.

Figure 26:
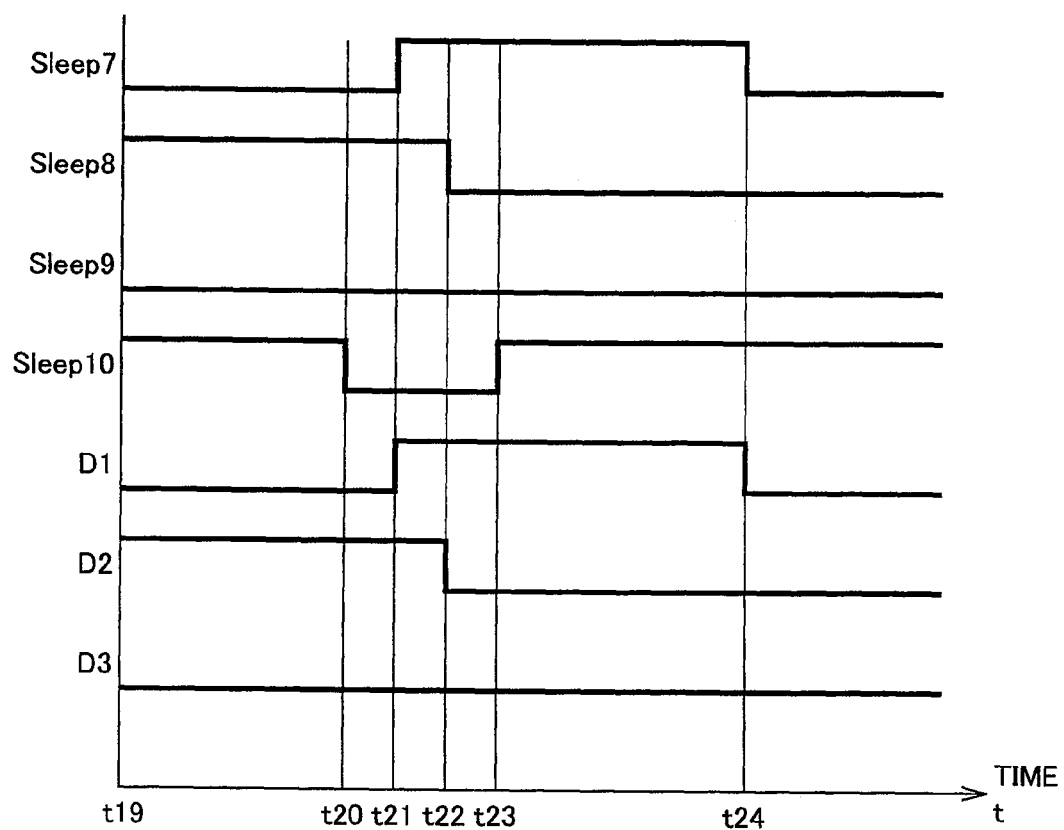
FIG. 26 is a timing chart illustrating operations of switches SW2#a, SWZa, SW1_2a and SW1_1a according to the second embodiment of the invention.

FIG. 26 is a timing chart illustrating operations of switches SW2#a, SWZa, SW1_2a and SW1_1a according to the second embodiment of the invention. Each memory block executes a predetermined operation such as data reading or data writing in cycles synchronized with clock signal CLK. In an example described below, each memory block executes a predetermined operation in three cycles SY1-SY3. In this example, it is assumed that the memory blocks are already in the low power consumption operation mode.

Memory block MB0 first executes the data writing in cycle SY1, executes the data reading in cycle SY2 and attains, in cycle SY3, an Nop state in which no operation is executed except for holding an internal state and thus storage data. Memory block MB1 first executes data reading in cycle SY1, and attains the Nop state, in which no operation is performed, in cycles Y2 and Y3. Memory block MB3 is in the Nop state in all cycles SY1-SY3.

Description will be given on the structure in which accumulated charges in pseudo-ground line VB1 of memory block MB0 are discharged to pseudo-ground line VB2 of memory block MB1 in cycle SY1.

Referring to FIG. 26, at a time t19, i.e., in an initial state, control signal Sleep7 attains the "L" level for executing the data writing in memory block MB0. For executing the data reading in memory block MB1, control signal Sleep8 attains the "H" level. For setting memory block MB2 to the Nop state, control signal Sleep9 attains the "L" level. Control signal Sleep10 attains the "H" level. Control signals D1, D2 and D3 attain the "L", "H" and "L" levels, respectively. These control signals D1-D3 are set as voltage signals of the same phases as corresponding control signals Sleep, respectively.

In this state, transistor Q5 is off, transistors Q6 and Q8 are on, and transistor Q7 is off Transistors 11 and 13 are on, and transistor 12 is off. Transistor 11 is employed for the purpose of adjusting the balanced potential and, for example, is turned on when transistor Q5 is turned off. When transistor Q5 is turned on, transistor 11 is turned off. As described above, when transistor Q5 is turned off, pseudo-ground line VB1 is charged with a current leaking from an upstream side, and the potential thereof rises. However, when the potential rises excessively, the potential becomes close to the level of the logical state of the "H" and "L" levels stored in memory cell MC so that stored information is lost. Thus, a state similar to the foregoing standby mode is attained.

Accordingly, transistor 11 is employed as the element for adjusting the potential of pseudo-ground line VB, and is kept on while transistor Q5 is off. More specifically, when the potential of pseudo-ground line VB1 rises to a voltage level close to the threshold voltage of transistor 11, transistor 11 starts to become conductive, and the current starts to flow from pseudo-ground line VB1 through transistor 11. Thus, when the potential of pseudo-ground line VB1 rises to the threshold voltage of transistor 11, transistor 11 becomes completely conductive. When the potential is lower than the threshold voltage of transistor 11, transistor 11 becomes conductive to a smaller extent.

Accordingly, the potential of pseudo-ground line VB1 attains the balanced state at the level that keeps a balance between a quantity of current passed from memory block MB0 to pseudo-ground line VB1 and a quantity of current passed through transistor 11 to ground voltage GND. This balanced potential depends on the threshold voltage, the transistor width and the like of transistor 11. Thus, the provision of transistor 11 allows the adjustment of the potential level of pseudo-ground line VB1. For a similar purpose, transistors 12 and 13 are arranged for adjusting the potential levels of pseudo-ground lines VB2 and VB3, respectively. In the structure described above, the transistor is employed as an example of a potential adjusting element. However, an element other than the transistor may be employed and, for example, a diode may be arranged between pseudo-ground line VB and node N1 as the potential adjusting element.

Figure 27:
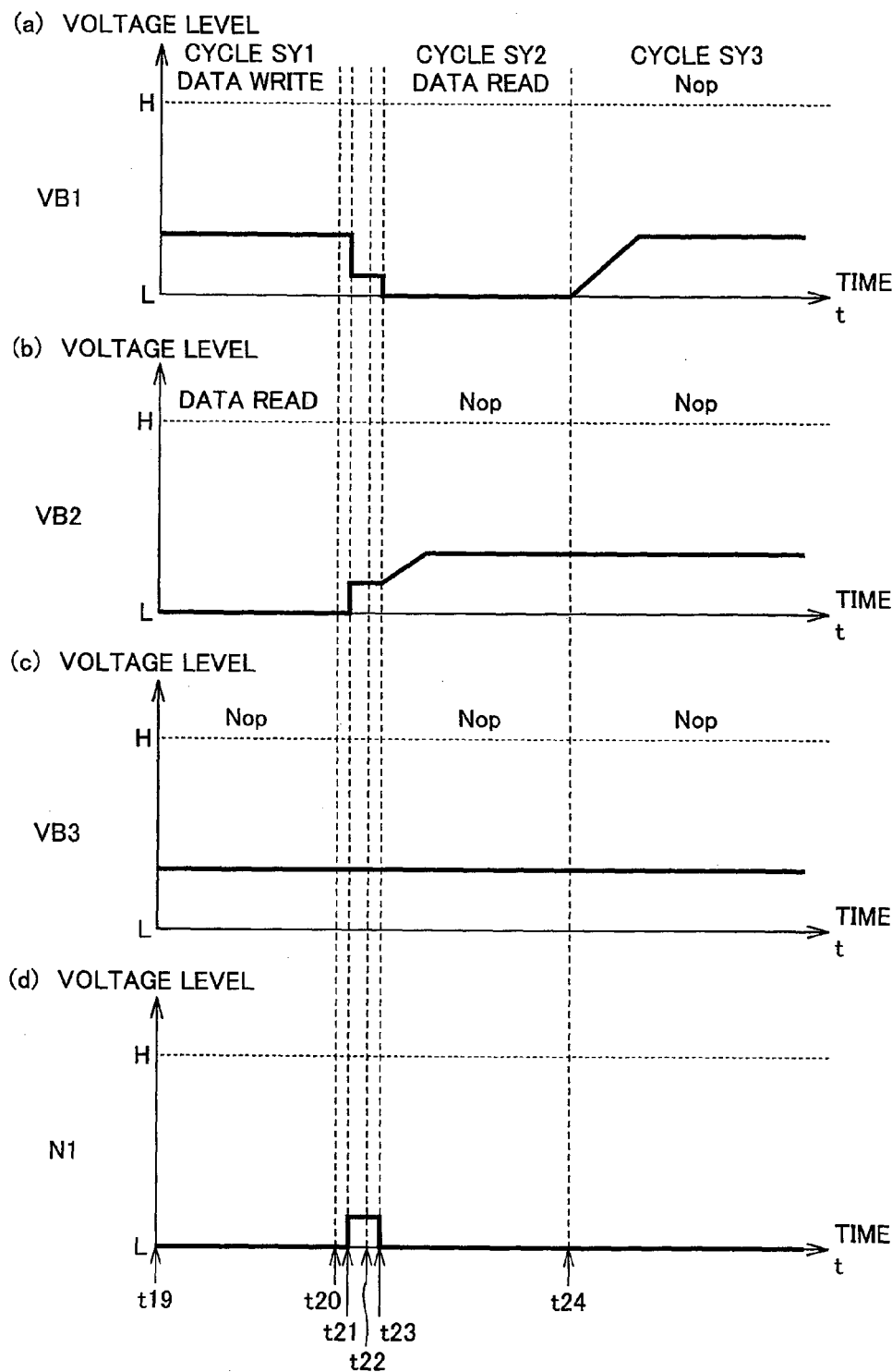
FIG. 27 illustrates voltage levels of pseudo-ground lines VB1-VB3 and a node N1 of memory block MB, and particularly the voltage levels according to input of control signals Sleep in FIG. 26.

FIG. 27 illustrates the voltage levels of pseudo-ground lines VB1-VB3 and node N1 of memory block MB, and particularly the voltage levels according to input of control signals Sleep in FIG. 26. In this example, FIG. 27 shows by way of example the voltage levels during the data writing, data reading and Nop state in the low power consumption operation mode.

FIG. 27(a) shows the voltage level of pseudo-ground line VB1. FIG. 27(b) shows the voltage level of pseudo-ground line VB2. FIG. 27(c) shows the voltage level of pseudo-ground line VB3. FIG. 27(d) shows the voltage level of node N1.

At time t19, transistor Q5 is off so that pseudo-ground line VB1 is already decoupled electrically from ground voltage GND. Therefore, pseudo-ground line VB1 that was charged with the current leaking from memory block MB0 has already attained a certain balanced potential. At time t19, transistors Q6 and Q8 are already on so that pseudo-ground line VB2 is already coupled electrically to ground voltage GND. Therefore, pseudo-ground line VB2 has the potential of 0 V. Further, at time t19, transistor Q7 is off so that pseudo-ground line VB3 is already decoupled electrically from ground voltage GND. Therefore, pseudo-ground line VB3 that was charged with the current leaking from memory block MB2 has already attained a certain balanced potential. Memory block MB2 keeps the Nop state in all cycles SY1-SY3, and therefore continuously keeps this balanced state.

In this data write operation, transistor Q5 is turned off to set the potential level of pseudo-ground line VB1 of memory block MB0 to the balanced potential, i.e., the potential intermediate between power supply voltage Vcc and ground voltage GND.

Figure 28:
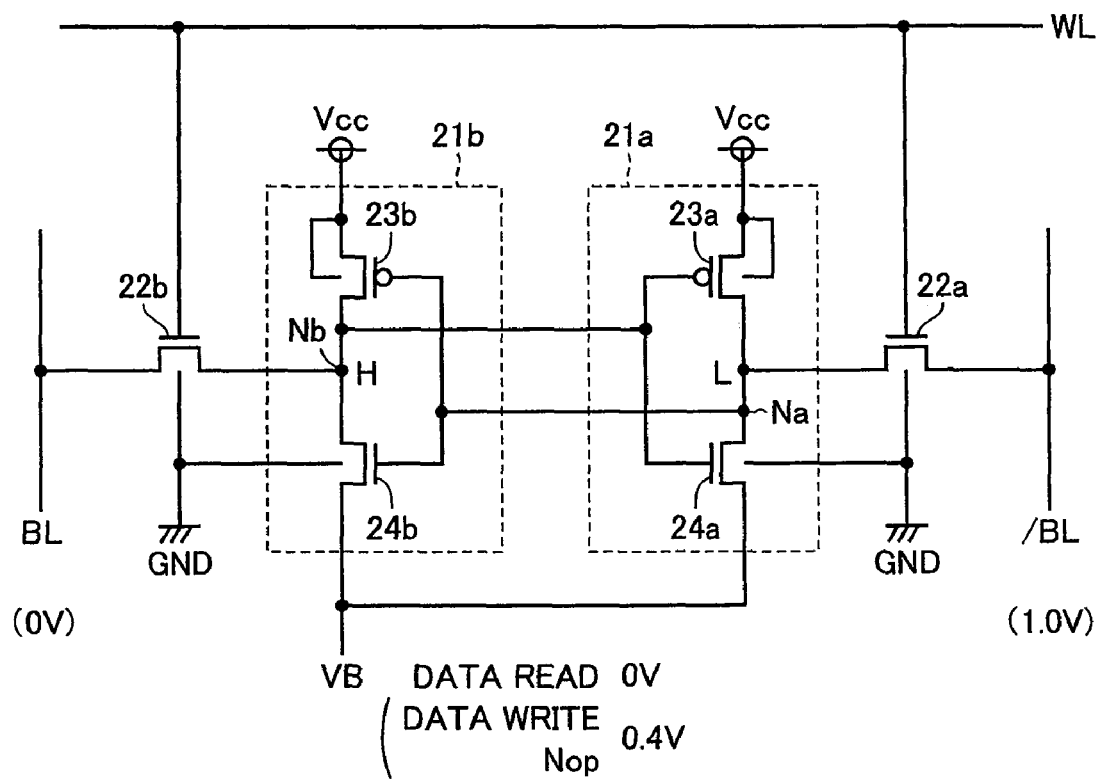
FIG. 28 illustrates a positional relationship between potentials of various nodes in an operation of writing inverted data of data stored in memory cell MC.

FIG. 28 illustrates a relationship between potentials of various nodes in an operation of writing inverted data of data stored in memory cell MC.

Referring to FIG. 28, storage nodes Na and Nb have stored, e.g., the data levels at the "L" and "H" levels, respectively. When power supply voltage Vcc is 1.0 V, node Nb attains 1.0 V. Node Na attains the same potential as pseudo-ground line VB because transistor 24a is already on according to the voltage of 1.0 V placed on its gate. When the balanced potential, i.e., the intermediate potential is, e.g., 0.4 V, node Na has the potential of 0.4 V.

In the data write operation, word line WL becomes active, and transistors 22a and 22b are turned on to couple electrically bit lines BL and /BL to storage nodes Nb and Na, respectively.

In this example, write driver 67 drives bit lines BL and /BL via data lines IO and /IO in response to input of write data DI, and thereby sets bit lines BL and /BL to 1.0 V and 0 V, respectively.

In this case, transistors 22a and 22b are turned on to discharge the charges from node Nb to bit line BL and, at the same time, transistor 23a is driven to charge node Na. This data writing ends when the charges are discharged from node Nb. In connection with node Nb, when the potential of node Na rises, transistor 23b is turned off and transistor 24 is turned on. Therefore, when transistor 23a or 23b has a small drive power, it is turned off easily, and the data writing operation becomes fast.

As described above, the potential level of pseudo-ground line VB is set to 0.4 V, i.e., the balanced potential by turning off transistor Q5 so that the drive power of transistor 23b electrically coupled to node Na has been small, and the data write operation becomes fast. For the memory cells that are not accessed, pseudo-ground lines VB are set to the potential level of 0.4 V so that the leak current of the inactive memory cells can be desirably suppressed. Thus, the low power consumption operation can be executed.

In this example, therefore, control signal Sleep7 is controlled to turn off transistor Q5 in the data write operation.

Referring to FIG. 27 again, when the operation changes from cycle SY1 to cycle SY2, control signal Sleep7 attains the "L" level at time t20. Thereby, transistor Q8 is turned off to decouple electrically node N1 from ground voltage GND.

At subsequent time t21, control signal Sleep7 attains the "H" level. Thereby, transistor Q5 is turned on. Therefore, pseudo-ground line VB1 is electrically coupled to node N1 via transistor Q5. In this operation, control signal Sleep8 is at the "H" level, and transistor Q6 is on.

As shown in FIG. 27, therefore, pseudo-ground lines VB1 and VB2 are electrically coupled together via node N1 and transistors Q5 and Q6 to have the same potential. FIG. 27 shows rapid rising of the potentials of node N0 and pseudo-ground line VB2 at a time t21.

At time t22, control signal Sleep8 attains the "L" level. Thereby, transistor Q6 is turned off. At time t23, control signal Sleep7 attains the "H" level. Thereby, transistor Q8 is turned on to couple electrically node N1 to ground voltage GND. In this operation, control signal Sleep7 is at the "H" level, and pseudo-ground line VB1 is not electrically coupled to node N1 so that ground voltage GND is supplied. Thereby, pseudo-ground line VB1 and node N1 attain 0 V.

At subsequent time t24 during transition from cycle SY2 to cycle SY3, control signal Sleep7 attains the "L" level. Thereby, transistor Q5 is turned off. Therefore, pseudo-ground line VB1 attains the level of the predetermined balanced potential.

In the above structure, pseudo-ground line VB1 is charged to attain the predetermined balanced potential particularly in cycle SY1 during the data writing of memory block MB0. In next cycle SY2, pseudo-ground line VB1 is electrically coupled to pseudo-ground line VB2 of memory block MB1 attaining the Nop state, and pseudo-ground line VB2 is charged with the charges accumulated in pseudo-ground line VB1. Thereby, when memory block MB1 attains the Nop state, a part of the charges required for setting pseudo-ground line VB2 to the predetermined balanced potential is supplemented with the charging charges in pseudo-ground line VB1. Thus, pseudo-ground line VB2 can reduce the quantity of the charges pulled out from the power supply voltage Vcc side for charging pseudo-ground line VB2 from the potential based on the charges discharged from pseudo-ground line VB1 to the predetermined balanced potential, and thereby can reduce the power consumption.

In the example already described, the structure uses the charges accumulated, in cycle SY1, in pseudo-ground line VB1 of memory block MB0 on which the data writing is executed, and charges pseudo-ground line VB2 of memory block MB1 attaining the Nop state in cycle SY2. However, this is not restrictive. For example, it is naturally possible to use the charges that are accumulated, in cycle SY2, in pseudo-ground line VB1 when the data writing is executed in memory block MB2, and to charge, with such charges, pseudo-ground line VB2 of memory block MB1 in which the data writing is to be executed.

This structure can use the charges accumulated in pseudo-ground line VB that attains the predetermined balanced potential in an arbitrary cycle period, and can supplement, with these charges, the charges to be supplied to the pseudo-ground line in another cycle. By performing the supplement with the charges already accumulated, it is possible to reduce the quantity of the charges pulled out from power supply voltage Vcc side when the charging to the predetermined balanced potential is to be performed, and the power consumption can be reduced.

The low power consumption operation mode of the SRAM cell has been described by way of example, and description has been given on the configuration in which the power consumption is reduced by executing the switching of the switches for raising the potential of the pseudo-ground line during the low power consumption operation mode. However, the operation mode is not restricted to the low power consumption operation mode, and the switching of the switches can likewise be executed in another operation mode.

In the example already described, when memory blocks MB0-MB2 of memory array MA are in the low power consumption operation mode, the charges are discharged from the pseudo-ground line corresponding to one of the memory blocks to the pseudo-ground line corresponding to another memory block in the operation mode. However, even in the case where each memory block MB is, e.g., in the active mode or the standby mode, the method in the first embodiment already described may be naturally implemented such that the charges are discharged from the charged pseudo-ground line corresponding to one of the memory blocks to the pseudo-ground line corresponding to another memory block for charging the latter when the mode changes from the active mode to the standby mode.

Modification of the Second Embodiment

A modification of the second embodiment of the invention will be described below in connection with a method of further reducing power consumption.

Figure 29:
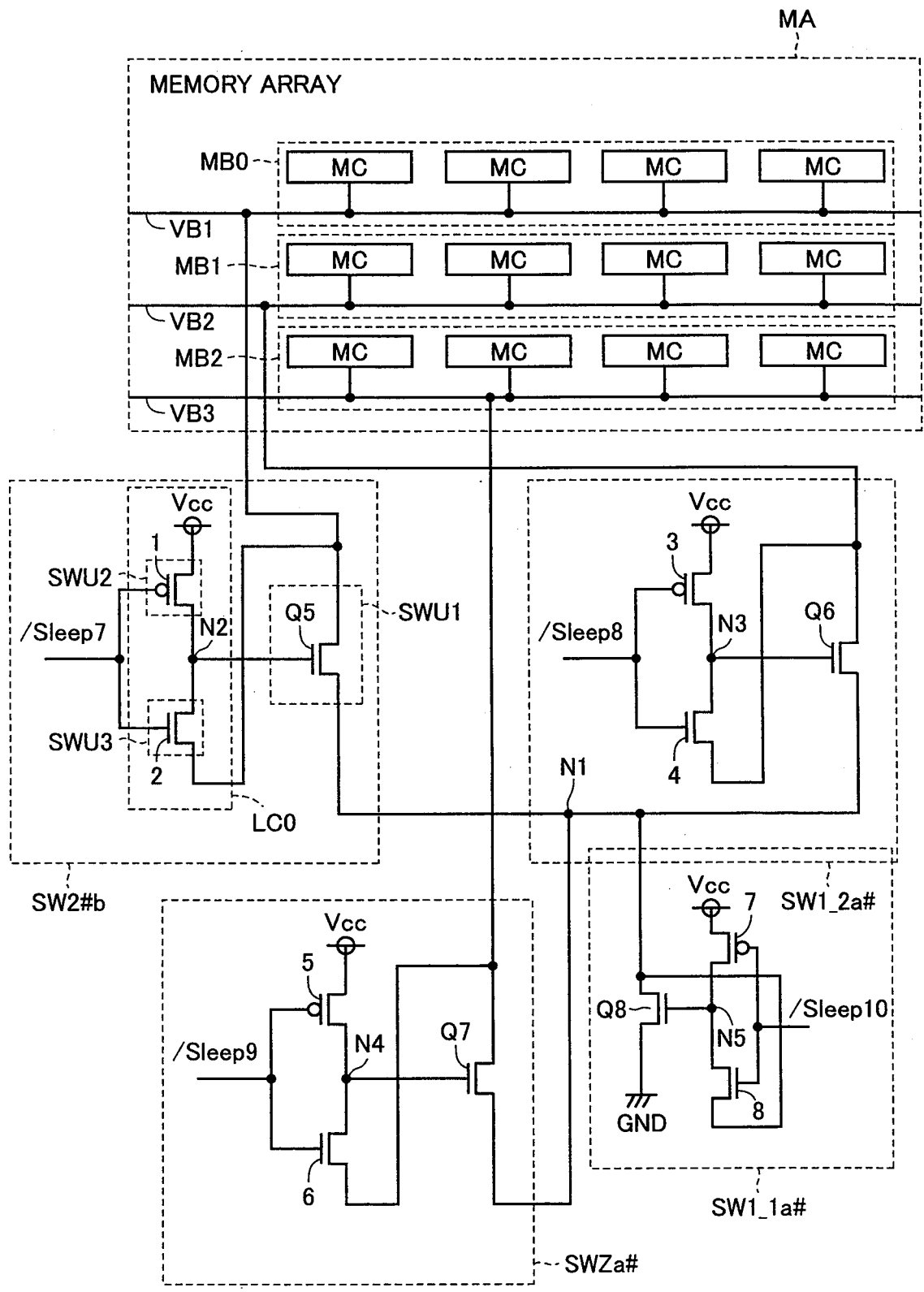
FIG. 29 illustrates a structure provided with switches for supplying a ground voltage to the pseudo-ground lines of memory cells MC according to a modification of the second embodiment of the invention.

FIG. 29 illustrates a structure according to the modification of the second embodiment of the invention that is provided with switches for supplying the ground voltage to the pseudo-ground lines of memory cells MC.

Referring to FIG. 29, this embodiment differs from the structure in FIG. 25 in that switches SW2#a and SWZa, SW1_2a and SW1_1a are replaced with switches SW2#b, SWZa#, SW1_2a# and SW1_1a#, respectively.

Switch SW2#b includes a switch unit SWU1 (to be generally referred to as a "switch unit SWU" in some cases hereinafter) that is arranged between pseudo-ground line VB1 and internal node N1, and is turned on/off in response to a command signal, and a logic circuit LC0 (to be generally referred to a "logic circuit LC" in some cases hereinafter) that controls switch unit SWU1 in response to a command signal. Switch unit SWU1 is formed of transistor Q5. Transistor Q5 is arranged between pseudo-ground line VB1 and internal node N1, and has a gate electrically coupled to a node N2.

Logic circuit LC0 includes a switch unit SWU2 electrically coupling power supply voltage Vcc to node N2 in response to a command signal that turns on switch unit SWU1, an a switch unit SWU3 that electrically couples pseudo-ground line VB1 to internal node N2 in response to a command signal attaining the off state in which the quantity of current passing through switch unit SWU1 is smaller than that in the on state.

Switch unit SWU2 is formed of a transistor 1, which is arranged between power supply voltage Vcc and node N2, and receives control signal/Sleep7 on its gate. Switch unit SWU3 is formed of a transistor 2, which is arranged between node N2 and pseudo-ground line VB1, and receives a control signal-Sleep7 on its gate. Although transistor 1 shown in the figure is connected to power supply line VL supplied with power supply voltage Vcc, this structure is not restrictive, and a power supply voltage VccP or the like other than power supply voltage Vcc may be supplied. More specifically, this can be achieved by electrically coupling transistor 1 to a power supply line to other than power supply line VL supplied with power supply voltage Vcc.

Other switches SW1_1a#, SW1_2a# and SWZa# have substantially the same structure as switch SW2#b.

More specifically, switch SW1_2a# includes transistors 3, 4 and Q6 forming logic circuit LC and switch unit SWU. Transistor Q6 is arranged between internal node N1 and pseudo-ground line VB2, and has a gate electrically coupled to node N3. Transistor 3 is arranged between power supply voltage Vcc and node N3, and receives a control signal /Sleep8 on its gate. Transistor 4 is arranged between node N3 and pseudo-ground line VB2, and receives control signal /Sleep8 on its gate.

Switch SWZa# includes transistors 5, 6 and Q7 forming logic circuit LC and switch unit SWU. Transistor Q7 is arranged between pseudo-ground line VB3 and internal node N1, and has a gate electrically coupled to a node N4. Transistor 5 is arranged between power supply voltage Vcc and node N4, and receives control signal /Sleep7 on its gate. Transistor 6 is arranged between node N4 and pseudo-ground line VB3, and receives a control signal /Sleep9 on its gate.

Switch SW1_1a# includes transistors 7, 8 and Q8 forming logic circuit LC and switch unit SWU. Transistor Q8 is arranged between internal node N1 and ground voltage GND, and has a gate electrically coupled to a node N5. Transistor 7 is arranged between power supply voltage Vcc and node N5, and receives a control signal /Sleep10 on its gate. Transistor 8 is arranged between node N5 and internal node N1, and receives control signal /Sleep10 on its gate.

Operations of switches SW2#b, SWZa#, SW1_2a# and SW1_1a# will now be described. Since all switches SW2#b, SWZa#, SW1_2a# and SW1_1a# have the same structure, the operation of switch SW2#b will be representatively described below.

When control signal /Sleep7 is at the "L" level, transistor 1 is on and electrically couples node N2 to power supply voltage Vcc. Thereby, node N2 attains the "H" level, and transistor Q5 is turned on. When control signal /Sleep7 is at the "H" level, transistor 2 is on and electrically couples node N2 to pseudo-ground line VB1. Thereby, a gate of transistor Q5 is electrically coupled to one of its conductive terminals, and transistor Q5 attains a diode-connected state.

Similarly to switch SW2#b, switches SWZa#, SW1_2a# and SW1_1a# operate in response to control signals /Sleep8-/Sleep10, respectively. More specifically, when control signal /Sleep8 is at the "L" level, transistor Q6 is on. When it is at the "H" level, node N2 is electrically coupled to pseudo-ground line VB2, and transistor Q6 attains a diode-connected state. When control signal /Sleep9 is at the "L" level, transistor Q7 is on. When it is at the "H" level, node N4 is electrically coupled to pseudo-ground line VB3, and transistor Q7 attains a diode-connected state. When control signal /Sleep10 is at the "L" level, transistor Q8 is on. When it is at the "H" level, node N5 is electrically coupled to node N1, and transistor Q8 attains a diode-connected state.

Figure 30:
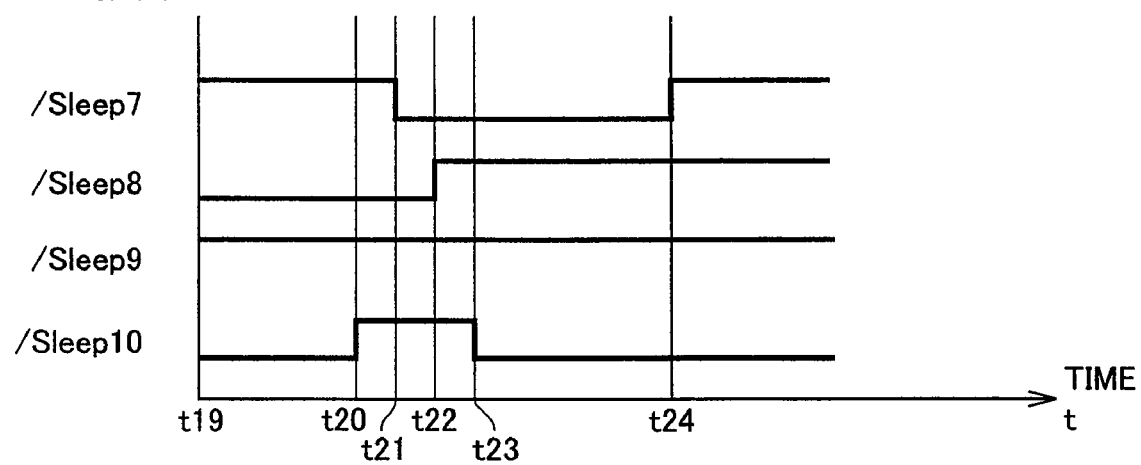
FIG. 30 is a timing chart illustrating operations of switches SW2#b, SWZa#, SW1_2a# and SW1_1a# according to the modification of the second embodiment of the invention.

FIG. 30 is a timing chart illustrating operations of switches SW2#b, SWZa#, SW1_2a# and SW1_1a# according to the modification of the second embodiment of the invention.

As described above, each memory block executes a predetermined operation such as data reading or data writing in every cycle synchronized with clock signal CLK. In the following description, it is assumed that each memory block executes an operation similar to that already described in connection with the second embodiment. More specifically, memory block MB0 first executes the data writing in cycle SY1, executes the data reading in cycle SY2 and attains, in cycle SY3, the Nop state, i.e., the state where it executes no operation except for holding the internal state, i.e., stored data. Memory block MB1 first executes the data reading in cycle SY1, and attains the Nop state, i.e., the state where it performs no operation in cycles SY2 and SY3. Memory block MB3 keeps the Nop state in all cycles SY1-SY3.

The following description will be given on a structure that discharges the accumulated charging charges in pseudo-ground line VB1 of memory block MB0 to pseudo-ground line VB2 of memory block MB1 in cycle SY1. Control signals /Sleep7-/Sleep10 shown in FIG. 30 are the inverted signals of control signals Sleep7-Sleep10 illustrated in FIG. 26, and these will be described based on the same times.

Referring to FIG. 30, in an initial state and particularly at time t19, since the data writing is to be executed in memory block MB0, control signal /Sleep7 attains the "H" level. Since the data reading is to be executed in memory block MB1, control signal /Sleep8 attains the "L" level. Since memory block MB2 is to be set to the Nop state, control signal /Sleep9 attains the "H" level. Control signal Sleep10 attains the "L" level.

In this case, node N2 is electrically coupled to pseudo-ground line VB1 so that transistor Q5 is diode-connected. Likewise, node N4 is electrically coupled to pseudo-ground line VB3 and transistor Q7 is diode-connected. Transistors Q6 and Q8 are on, and pseudo-ground line VB2 is electrically coupled to node N1. Also, node N1 is electrically coupled to ground voltage GND.

When transistor Q5 is diode-connected, pseudo-ground line VB1 is charged with a current leaking from the upstream side, and the potential thereof rises. When the potential of pseudo-ground line VB1 rises to the voltage level of threshold voltage of transistor Q5, transistor Q5 starts to become conductive, and the current starts to flow from pseudo-ground line VB1 through transistor Q5. Thus, when the potential of pseudo-ground line VB1 rises to the threshold voltage of transistor Q5, transistor Q5 becomes completely conductive. When the potential is lower than the threshold voltage of transistor Q5, transistor Q5 becomes conductive to a smaller extent.

Therefore, the potential of pseudo-ground line VB1 attains the balanced potential at the level that keeps a balance between the quantity of current passed from memory block MB0 to pseudo-ground line VB1 and the quantity of current passed to ground voltage GND via transistor Q5. This balanced potential depends on the threshold voltage, transistor width and others of transistor Q5. Transistor 11 may be additionally arranged for adjusting the balanced potential. However, the structure not employing transistor 11 can reduce the number of components of the circuit. Therefore, the circuit structure without transistor 11 is effective in layout and cost. The same is true with other switches SW8#-SW10#.

FIG. 31 illustrates voltage levels of pseudo-ground lines VB1-VB3 and node N1 of memory block MB according to input of control signals /Sleep7-/Sleep10 in FIG. 30.

FIG. 31(a) shows the voltage level of pseudo-ground line VB1. FIG. 31(b) shows the voltage level of pseudo-ground line VB2. FIG. 31(c) shows the voltage level of pseudo-ground line VB3. FIG. 31(d) shows the voltage level of node N1.

At time t19, since transistor Q5 is off, pseudo-ground line VB1 is already decoupled electrically from ground voltage GND. Pseudo-ground line VB1 is already charged with the current leaking from memory block MB0 so that pseudo-ground line VB1 has already attained a certain balanced potential. At time t19, transistors Q6 and Q8 are on so that ground voltage GND and pseudo-ground line VB2 are already coupled electrically together. The potential of pseudo-ground line VB2 is 0 V. At time t19, transistor Q7 is off so that pseudo-ground line VB3 is already decoupled electrically from ground voltage GND. The potential of pseudo-ground line VB3 charged with the current leaking from memory block MB2 has attained a certain balanced state. Since memory block MB2 is in the Nop state in all the cycles SY1-SY3, it continuously maintains the balanced potential.

During transition from cycle SY1 to cycle SY2, control signal /Sleep10 attains the "H" level at time t20. Thereby, transistor Q8 is turned off, and node N1 is electrically decoupled from ground voltage GND.

When transistor Q8 is turned off, node N5 is electrically coupled to node N1 as described before. Since transistor Q8 was supplied with power supply voltage Vcc on its gate, it has accumulated the charges. Therefore, when transistor 8 is turned on, the charges stored in a region of node N5 and particularly stored in a region connected to the gate of transistor Q8 are discharged to node N1. Thereby, the charges thus discharged raise the potential level of node N1. In this operation, control signal /Sleep8 is at the "L" level, and transistor Q6 is on. Therefore, FIG. 31 shows a state in which node N1 and pseudo-ground line VB2 electrically coupled to node N1 have the raised potentials.

At subsequent time t21, control signal /Sleep7 attains the "L" level. Thereby, transistor Q5 is turned on. Therefore, pseudo-ground line VB1 is electrically coupled to node N1 via transistor Q5.

Therefore, pseudo-ground lines VB1 and VB2 are electrically coupled together via node N1 and transistors Q5 and Q6 as shown in FIG. 31, and therefore attain the same potential. FIG. 31 shows a state in which the potentials of node N0 and pseudo-ground line VB2 rapidly rise at a time t21.

At time t22, control signal /Sleep8 attains the "H" level. Thereby, transistor Q6 is turned off. In this operation, control signal /Sleep8 attains the "H" level so that transistor 4 is turned on in a power supply interrupting unit VBCV2 as already described. The gate of transistor Q6 has already accumulated the charges owing to power supply voltage Vcc as already described. Therefore, the accumulated charges are discharged to pseudo-ground line VB2 when transistor 4 is turned on. FIG. 31 shows a state where the above accumulated charges raise the potential level of pseudo-ground line VB2.

At subsequent time t23, control signal /Sleep10 attains the "L" level. Thereby, transistor Q8 is turned on to couple electrically node N1 to ground voltage GND. In this operation, control signal /Sleep7 is at the "L" level, and pseudo-ground line VB1 is already coupled electrically to node N1 so that pseudo-ground line VB1 is supplied with ground voltage GND. Thereby, pseudo-ground line VB1 and node N1 attain 0 V.

At time t24 during subsequent transition from cycle SY2 to cycle SY3, control signal /Sleep7 attains the "H" level. Thereby, transistor Q5 is turned off. Therefore, the potential level of pseudo-ground line VB1 attains the predetermined balanced level as described before.

In the structure described above, pseudo-ground line VB1 is charged to attain the predetermined balanced potential during the data writing of memory block MB0 in cycle SY1. Further, in subsequent cycle SY2, pseudo-ground line VB1 is electrically coupled to pseudo-ground line VB2 of memory block MB1 attaining the Nop state, and pseudo-ground line VB2 is charged with the charges accumulated in pseudo-ground line VB1. Thereby, in the operation of setting memory block MB1 to the Nop state, a part of the charges required for setting pseudo-ground line VB2 to the predetermined balanced potential can be supplemented with the charging charges in pseudo-ground line VB1. Thus, pseudo-ground line VB2 is charged to raise its potential from the potential based on the charges discharged from pseudo-ground line VB1 to the predetermined balanced potential. Therefore, this structure can reduce the quantity of charges pulled out from the power supply voltage Vcc side, and can reduce the power consumption. Further, the charges accumulated in the gates of transistors Q5-Q8 of respective switches SW2#b, SWZa#, SW1_2a# and SW1_1a can be used for supplementing the charges required for the charging.

Accordingly, the power consumption can be further reduced as compared with the structure of the second embodiment. In the example described above, the structure uses the charges accumulated in pseudo-ground line VB1 of memory block MB0, in which the data writing is executed, in cycle SY1, and charges pseudo-ground line VB2 of memory block MB1 attaining the Nop state with such charges in cycle SY2. However, this is not restrictive. Naturally, such a configuration may be employed that uses the charges that are accumulated in pseudo-ground line VB1 when the data writing is executed in memory block MB2 in cycle SY2, and charges pseudo-ground line VB2 of memory block MB1, in which the data writing is executed, with such charges.

This structure uses the charges accumulated in pseudo-ground line VB that is set to the predetermined balanced potential in a certain cycle period as well as the charges accumulated in the gates of transistors Q5-Q7, and charges the pseudo-ground line set to the standby mode with such charges in another cycle. By performing the supplement with the charges, it is possible to reduce the quantity of charges pulled out from the power supply voltage Vcc side when the potential of the pseudo-ground line is to be raised, i.e., when the charging is to be performed until the predetermined balanced potential is attained. Thereby, it is possible to reduce the power consumption.

The description has been given particularly on the configuration in which arbitrary pseudo-ground line VB is supplemented with charges to reduce the power consumption. However, the substantially same configuration may be applied to pseudo-power supply line VA. In the case of pseudo-power supply line VA, the charges accumulated in the pseudo-power supply line are discharged to another pseudo-power supply line or the like so that the quantity of charges pulled out from the ground voltage GND side can be reduced, and the power consumption can be reduced.

Third Embodiment

The embodiments have been described in connection with examples that reduce power consumption in one chip. However, the chip is not restricted to one in number. For example, the similar configuration can be applied to semiconductor devices, e.g., of an SIO (System In Package) structure in which a plurality of chips are included in one package.

Figure 32:
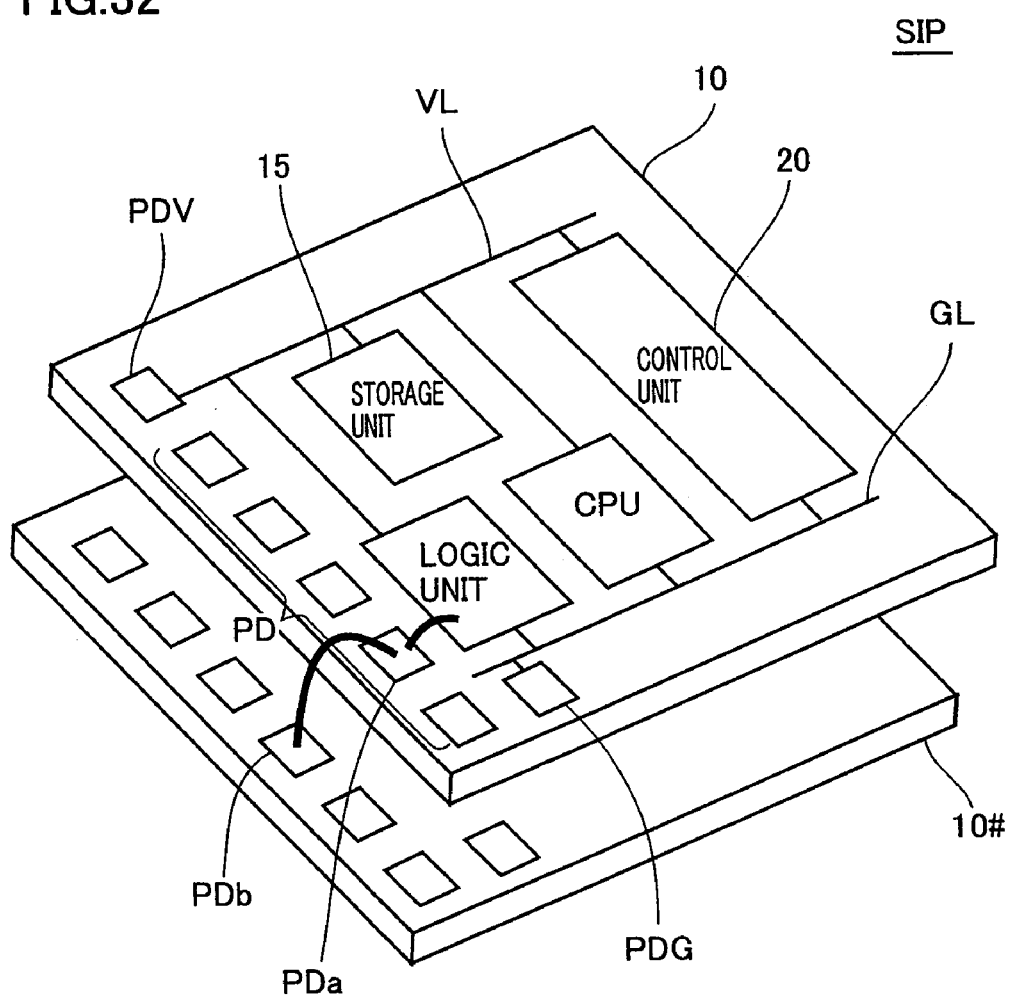
FIG. 32 illustrates a semiconductor device of a SIP structure.

FIG. 32 illustrates a semiconductor device of the SIO structure.

Referring to FIG. 32, chip 10 and another chip 10# are arranged in one package. The SIP structure can reduce a circuit board and can achieve fast data transfer. In this example, a pad PDa on chip 10 is connected by wire bonding to a pad PDb on chip 10#.

Figure 33:
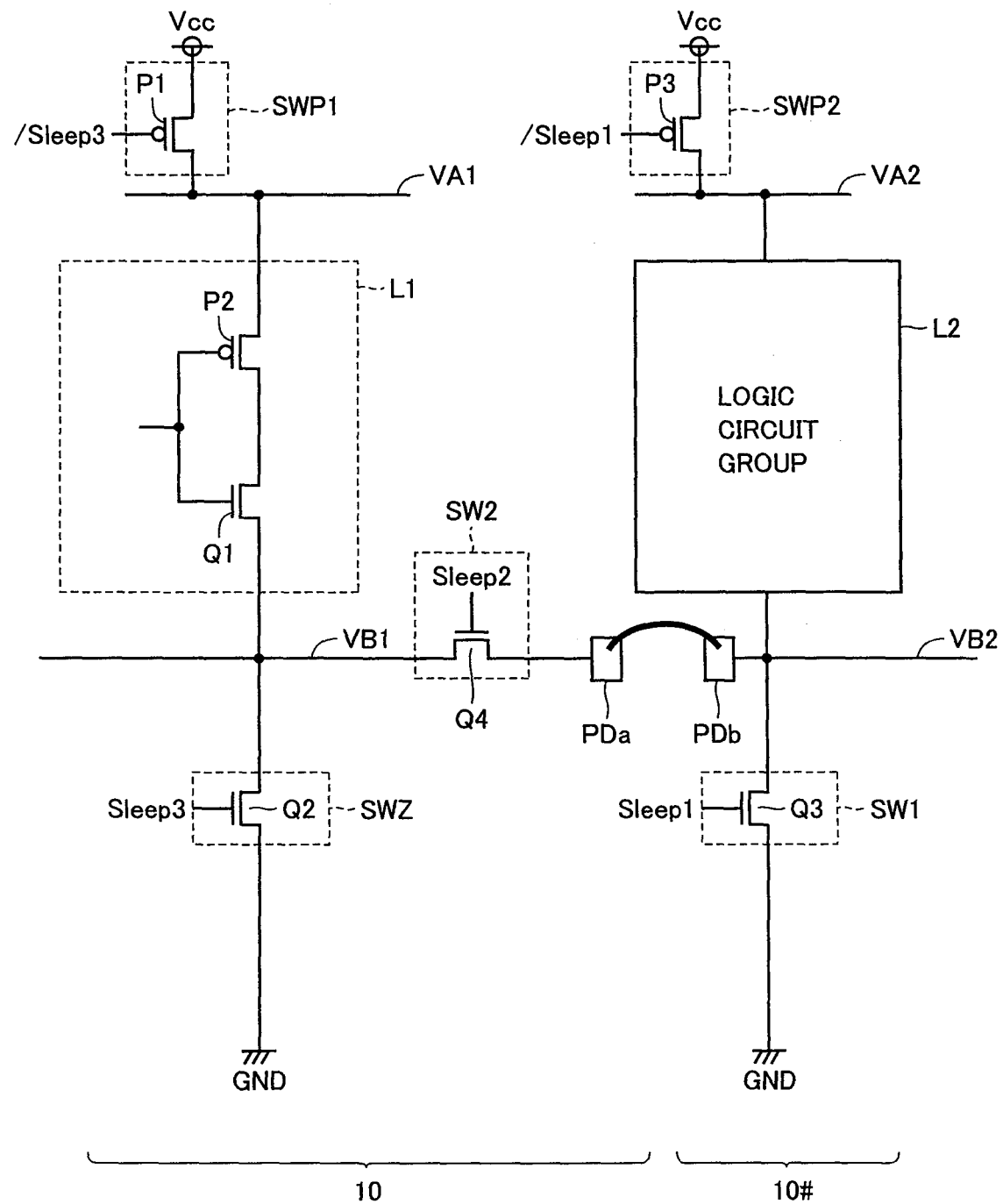
FIG. 33 illustrates an MTCMOS circuit according to a third embodiment of the invention.

FIG. 33 illustrates an MTCMOS circuit according to the third embodiment of the invention. The following description will be given, by way of example, in connection with the structure in FIG. 3(a) and particularly in connection with logic circuit group L1 included in logic unit 100 on the chip 10 side and logic circuit group L2 included in the logic unit (not shown) of the chip 10# side.

The MTCMOS circuit according to the third embodiment of the invention differs from the MTCMOS circuit in FIG.

3(*a*) in that an electric connection between pads PDa and PDb electrically couples pseudo-ground lines VB1 and VB2 together via switch SW2. The structures and operations other than the above are substantially the same as those already described with reference to FIG. 3(*a*), and therefore description thereof is not repeated.

For example, as can be seen in this structure, pseudo-ground line VB2 of chip 10# is supplemented with the charges supplied to pseudo-ground line VB1 of chip 10, and this reduces the quantity of charges pulled out from the power supply voltage Vcc side when the charging to the predetermined balanced potential is to be performed, and the power consumption can be reduced. Thus, the charges already supplied to the pseudo-ground line of one of the chips are discharged to the pseudo-ground line of the circuit of the other chip, whereby the power consumption of the whole semiconductor device can be reduced.

Although the structure in FIG. 3(*a*) has been described by way of example, the structure is not particularly restricted to that in FIG. 3(*a*). According to the configuration similar to those in the embodiments and modifications already described, the charges accumulated in one of the chips can be used for charging the other chip so that the power consumption of the whole semiconductor device can be reduced.

The discharging is not restricted to that between the logic circuit groups, i.e., from the charged pseudo-ground line corresponding to one of the logic circuit group to the pseudo-ground line corresponding to the other logic circuit group, and may be performed between memory arrays in the storage unit. Also, the discharging may be performed in a combination of arbitrary internal circuits already described in the first and second embodiments so that the power consumption of the whole semiconductor device can be reduced.

First Modification of the Third Embodiment

The third embodiment has been described in connection with the structure in which switch SW2 is arranged in one of chips 10 and 10#. However, switch SW2 may be arranged outside chip 10 or 10#.

Figure 34:
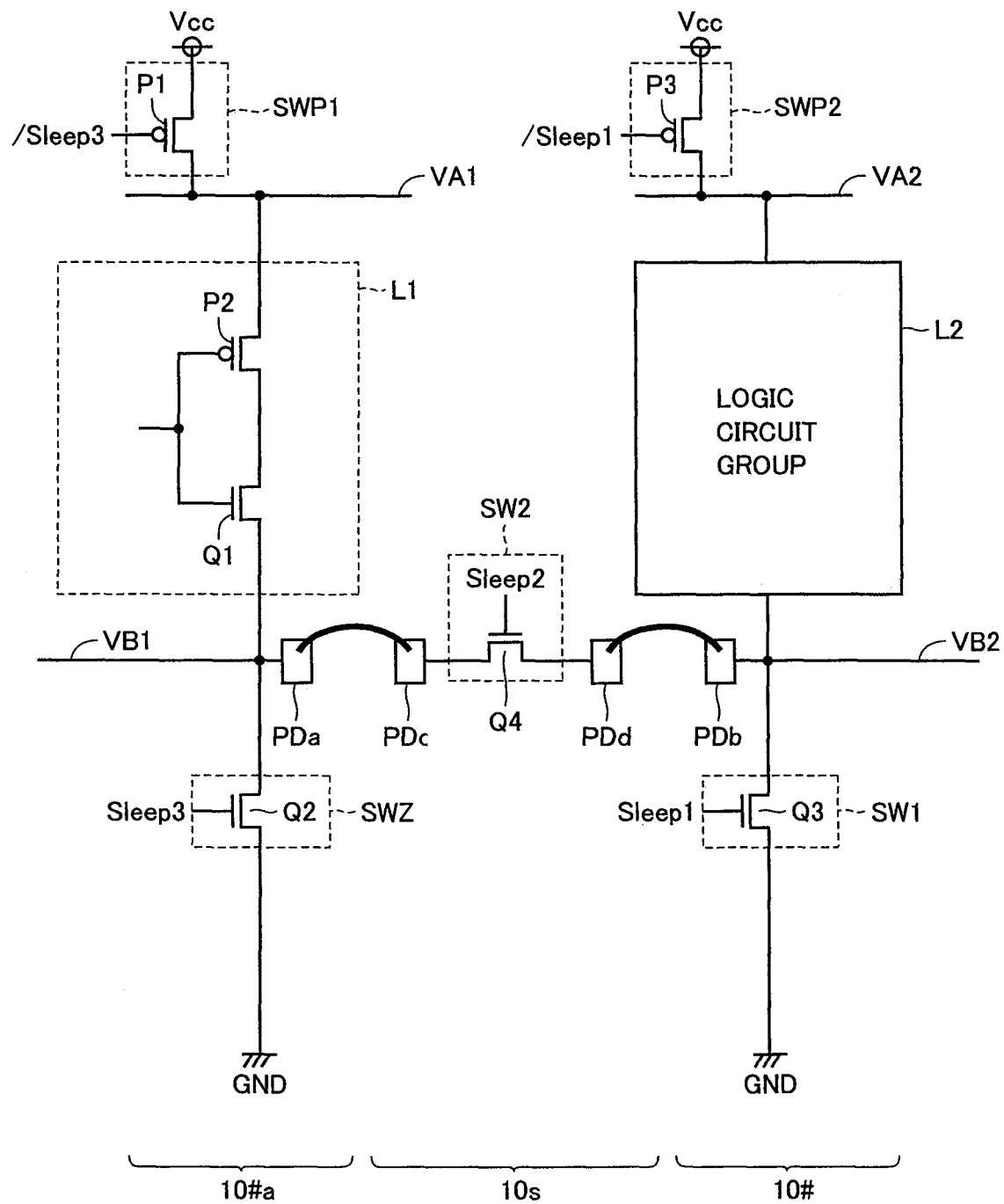
FIG. 34 illustrates an MTCMOS circuit according to a first modification of the third embodiment of the invention.

FIG. 34 illustrates an MTCMOS circuit according to a first modification of the third embodiment of the invention.

The MTCMOS circuit according to the first modification of the third embodiment of the invention differs from the MTCMOS circuit of the structure shown in FIG. 33 in that chip 10 is replaced with chip a chip 10#*a*, and a new chip 10*s* is arranged. Chip 10#*a* differs from chip 10 only in that switch SW2 is not employed, and the other structures are the same so that description thereof is not repeated.

New chip 10*s* includes switch SW2, which uses pads PDc and PDd for external and electrical connection. Thus, switch SW2 is not arranged in one of chips 10#*a* and 10#.

Pad PDa is connected to pseudo-ground line VB1, and pad PDb is connected to pseudo-ground line VB2.

In this example, pad PDc of chip 10*s* is electrically connected to pad PDa. Pad PDd of chip 10*s* is electrically connected to pad PDb.

This structure electrically couples pseudo-ground lines VB1 and VB2 together via switch SW2. Although not shown, control signal Sleep2 input to switch SW2 is provided from a control unit arranged in chip 10#*a*.

Structures and operations other than the above are the same as those already described with reference to FIG. 33, and therefore description thereof is not repeated.

Owing to the structure of this example in which switch SW3 is not arranged in chip 10#*a* or 10#, and is independent of it, chip 10#*a* or 10# that is designed as a general-purpose product can be easily employed for combination. Thereby, the invention can be employed more easily, and the power consumption of the whole semiconductor circuit device can be further lowered.

The structure has been described in connection with the example of the structure of FIG. 3(*a*). However, the structure is not restricted to that in FIG. 3(*a*). According to the configuration similar to those of the embodiments and modifications already described, the charges accumulated in one of the chips can be used for charging the other chip, whereby the power consumption of the whole semiconductor device can be reduced.

Although the example has been described in connection with the structure that includes new chip 10*s* provided with switch SW3, this structure is not restrictive, and a switch element may be merely arranged between chips 10#*a* and 10# instead of arranging the chip therebetween.

Second Modification of the Third Embodiment

Figure 35:
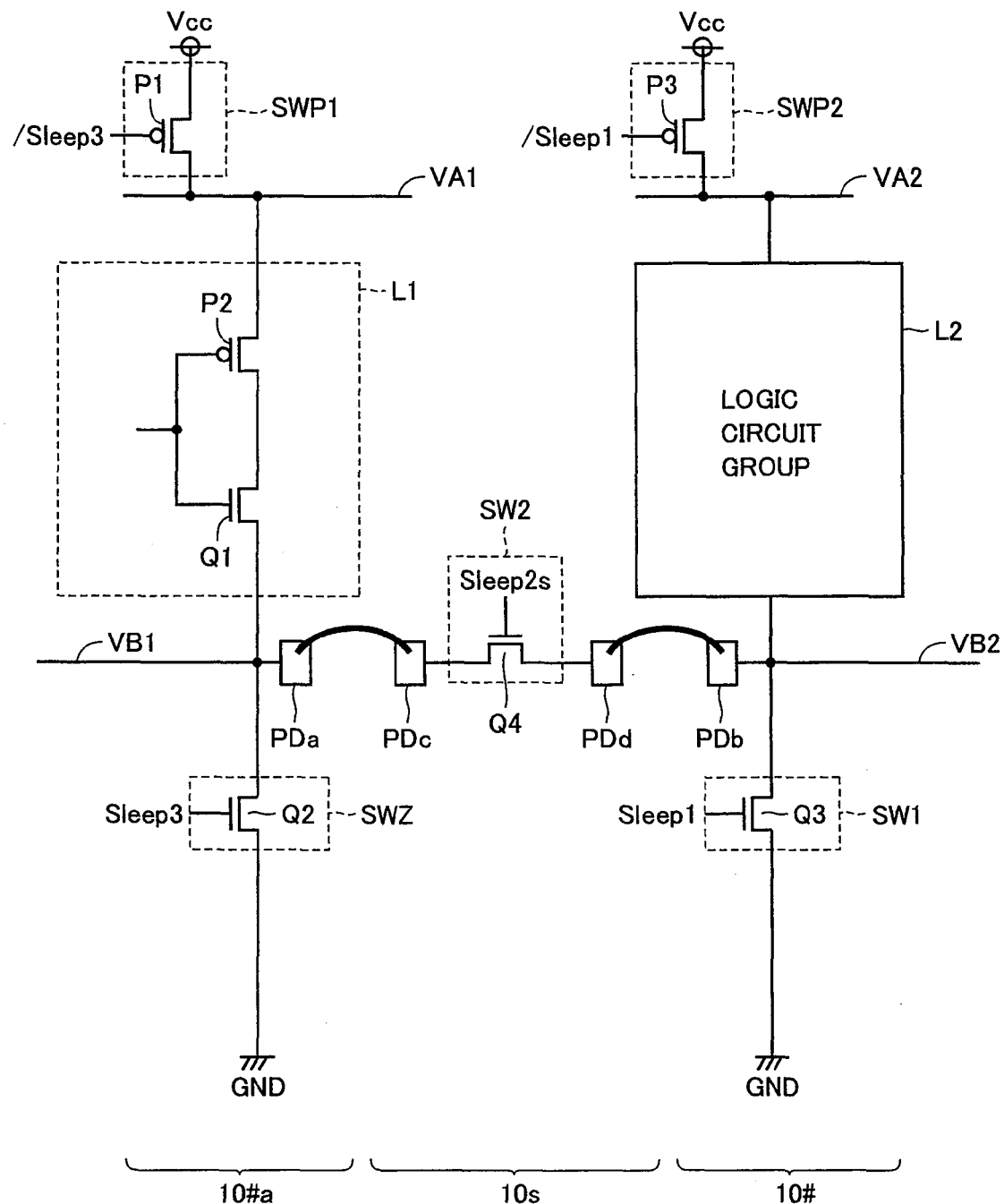
FIG. 35 illustrates an MTCMOS circuit according to a second modification of the third embodiment of the invention.

FIG. 35 illustrates an MTCMOS circuit according to a second modification of the third embodiment of the invention.

Referring to FIG. 35, the MTCMOS circuit according to the second modification of the third embodiment of the invention differs from the MTCMOS circuit according to the first modification in control signal that is input to switch SW2 of chip 10*s*. Other structures are the same, and therefore description thereof is not repeated.

The MTCMOS circuit according to the first modification has been described in connection with the structure in which the control unit arranged in chip 10#*a* provides the signal. However, this is not restrictive, and such a structure may be employed that a control unit (not shown) arranged in chip 10*s* provides the signal, or a control unit (not shown) arranged in chip 10# provides the signal.

The example has been described in connection with the structure provided with new chip 10*s* including switch SW3. However, this is not restricted, and a switch element may be merely arranged between chips 10#*a* and 10# instead of arranged it in the chip.

Fourth Embodiment

A fourth embodiment of the invention will now be described in connection with the case where divided blocks are employed for further increasing a reuse factor of the charges.

Figure 36:
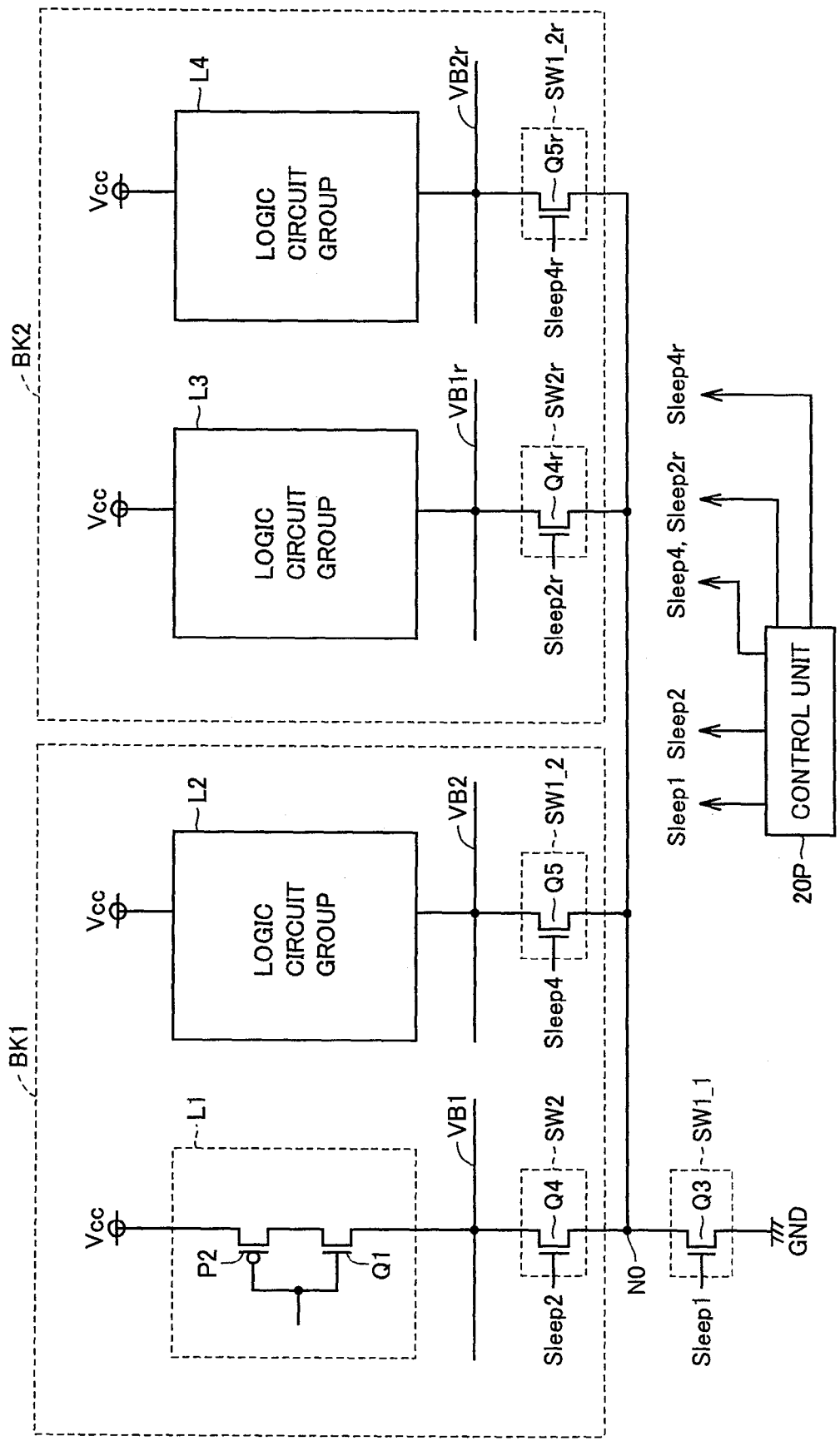
FIG. 36 illustrates an MTCMOS circuit according to a fourth embodiment of the invention.

FIG. 36 illustrates an MTCMOS circuit according to a fourth embodiment of the invention.

Referring to FIG. 36, this example will be described in connection with a structure in which an internal circuit is divided into a plurality of blocks.

The structure having divided blocks BK1 and BK2 is shown by way of example. A structure having a combination of block BK1 and switch SW1_1 is substantially the same as the MTCMOS circuit illustrated in FIG. 9. Likewise, a structure having a combination of block BK2 and switch SW1_1 is substantially the same as the MTCMOS circuit already described with reference to FIG. 9. Node N0 provides a common node shared between blocks BK1 and BK2. The structure on the pseudo-power supply line side is different from that of the MTCMOS circuit illustrated in FIG. 9, but the structure on the pseudo-power supply line side may be substantially the same as that of the MTCMOS circuit illustrated in FIG. 9.

Block BK1 according to the fourth embodiment of the invention includes logic circuit groups L1 and L2, pseudo-ground lines VB1 and VB2 arranged corresponding to logic circuit groups L1 and L2, respectively, and switches SW2 and SW1_2 that are arranged corresponding to pseudo-ground lines VB1 and VB2 for controlling the electrical connection to internal node N0.

Block BK2 according to the fourth embodiment of the invention includes logic circuit groups L3 and L4, pseudo-ground lines VB1r and VB2r arranged corresponding to logic circuit groups L3 and L4, respectively, and switches SW2r and SW1_2r arranged corresponding to pseudo-ground lines VB1r and VB2r, respectively, for controlling the electrical connection to internal node N0.

As described before, FIG. 36 shows switch SW1_1 arranged between internal node N0 and ground voltage GND as described before, and a control unit 20P providing a control signal controlling these switches.

Control unit 20P provides control signals Sleep1, Sleep2, Sleep2r, Sleep4 and Sleep4r based on the commands, e.g., from a CPU arranged in a chip, although not shown.

Figure 37:
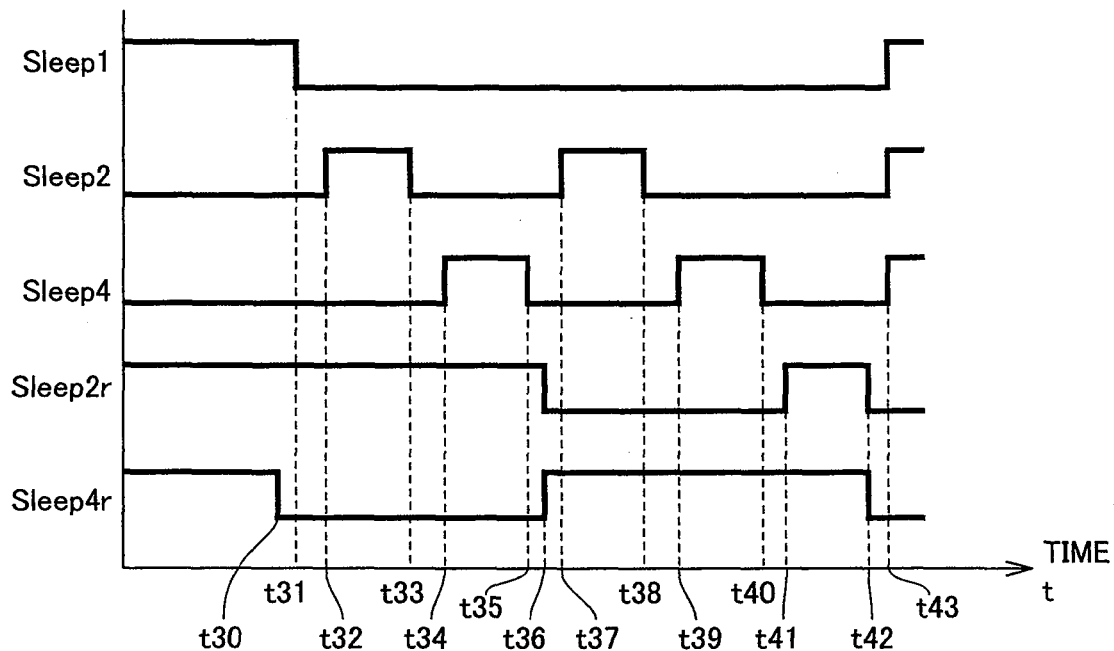
FIG. 37 is a timing chart illustrating an operation of an MTCMOS circuit according to a fourth embodiment of the invention.

FIG. 37 is a timing chart illustrating an operation of the MTCMOS circuit according to the fourth embodiment of the invention. This example will be described in connection with the case in which block BK1 changes from the standby mode to the active mode, and block BK2 changes from the active mode to the standby mode.

Referring to FIG. 37, control signal Sleep4r changes from the "H" level to the "L" level at a time t30. In response to this, a transistor Q5r of switch SW1_2r is turned off. Therefore, node N0 is electrically decoupled from pseudo-ground line VB2r. Thus, logic circuit group L4 attains the standby mode.

At a time t31, control signal Sleep1 changes from the "H" level to the "L" level. In response to this, transistor Q3 of switch SW1_1 is turned off.

Thereby, node N0 is electrically decoupled from ground voltage GND. Control signal Sleep2r maintains the "H" level. Therefore, a transistor Q4r of switch SW2r is on and keeps electrical coupling between pseudo-ground line VB1r and node N0.

At time t32, control signal Sleep2 changes from the "L" level to the "H" level. Thereby, transistor Q4 of switch SW2 is turned on. Pseudo-ground lines VB1 and VB1r are electrically coupled via node N0. As described above, pseudo-ground lines VB1 and VB2 of block BK1 in the standby mode has accumulated the charging charges. Therefore, the charging charges in pseudo-ground line VB1 are discharged to pseudo-ground line VB1r. At a time t33, control signal Sleep2 changes from the "H" level to the "L" level. Thereby, transistor Q4 of switch SW2 is turned off to decouple electrically pseudo-ground line VB1 from pseudo-ground line VB1r connected via node N0 thereto.

At a subsequent time t34, control signal Sleep4 changes from the "L" level to the "H" level. Thereby, transistor Q5 of switch SW1_2 is turned on. Pseudo-ground lines VB2 and VB1r are electrically coupled together via node N0. As described before, pseudo-ground lines VB1 and VB2 of block BK1 in the standby mode has accumulated the charging charges. Therefore, the charging charges in pseudo-ground line VB2 are discharged to pseudo-ground line VB1r. At a time t35, control signal Sleep4 changes from the "H" level to the "L" level. Thereby, transistor Q5 of switch SW1_2 is turned off to decouple electrically pseudo-ground line VB2 from pseudo-ground line VB1r connected thereto via node N0.

At a time t36, control signal Sleep2r changes from the "H" level to the "L" level. Thereby, transistor Q4r of switch SW2r is turned off to decouple electrically node N0 from pseudo-ground line VB1r. At time t36, control signal Sleep4r changes from the "L" level to the "H" level. Thereby, transistor Q5r of switch SW1_2r is turned on to couple electrically pseudo-ground line VB2r to node N0.

At a subsequent time t37, control signal Sleep2 changes from the "L" level to the "H" level. Thereby, transistor Q4 of switch SW2 is turned on, and pseudo-ground lines VB1 and VB2r are electrically coupled together via node N0. Therefore, the charging charges in pseudo-ground line VB1 are charged to pseudo-ground line VB2r. At a time t38, control signal Sleep2 changes from the "H" level to the "L" level. Thereby, transistor Q4 of switch SW2 is turned off, and electrically decouples pseudo-ground lines VB1 and VB2r coupled via node N0 from each other.

At a subsequent time t39, control signal Sleep4 changes from the "L" level to the "H" level. Thereby, transistor Q5 of switch SW1_2 is turned on, and pseudo-ground lines VB2 and VB2r are electrically coupled together via node N0. Therefore, the charging charges in pseudo-ground line VB2 are discharged to pseudo-ground line VB2r. Therefore, the charging charges in pseudo-ground line VB2 are discharged to pseudo-ground line VB2r. At a time t40, control signal Sleep4 changes from the "H" level to the "L" level. Thereby, transistor Q5 of switch SW1_2 is turned off, and electrically decouples pseudo-ground lines VB2 and VB2r connected together via node N0 from each other.

At a subsequent time t41, control signal Sleep2r changes from the "L" level to the "H" level. Thereby, pseudo-ground lines VB1r and VB2r are electrically coupled together via node N0. At a time t42, control signals Sleep2 and Sleep4r change from the "H" level to the "L" level. Thereby, both transistors Q4r and Q5r of switches SW2r and SW1_2r are turned off to decouple electrically node N0 from pseudo-ground lines VB1r and VB2r, respectively.

At a time t43, control signals Sleep1, Sleep2 and Sleep4 change from the "L" level to the "H" level. The switching of the logical levels of control signals Sleep1, aSleep2 and Sleep4 may be performed at the same time or at different times, respectively.

Thereby, transistors Q3, Q4 and Q5 of switches SW1_1, SW2 and SW1_2 are turned on. Therefore, pseudo-ground lines VB1 and VB2 are electrically coupled to ground voltage GND. Therefore, block BK1 attains the active mode. Logic circuit groups L1 and L2 are supplied with the power required for the operation, and execute the predetermined operation. Block BK2 attains the standby mode. Logic circuit groups L3 and L4 are powered off because transistors Q4r and Q5r are off.

Figure 38:
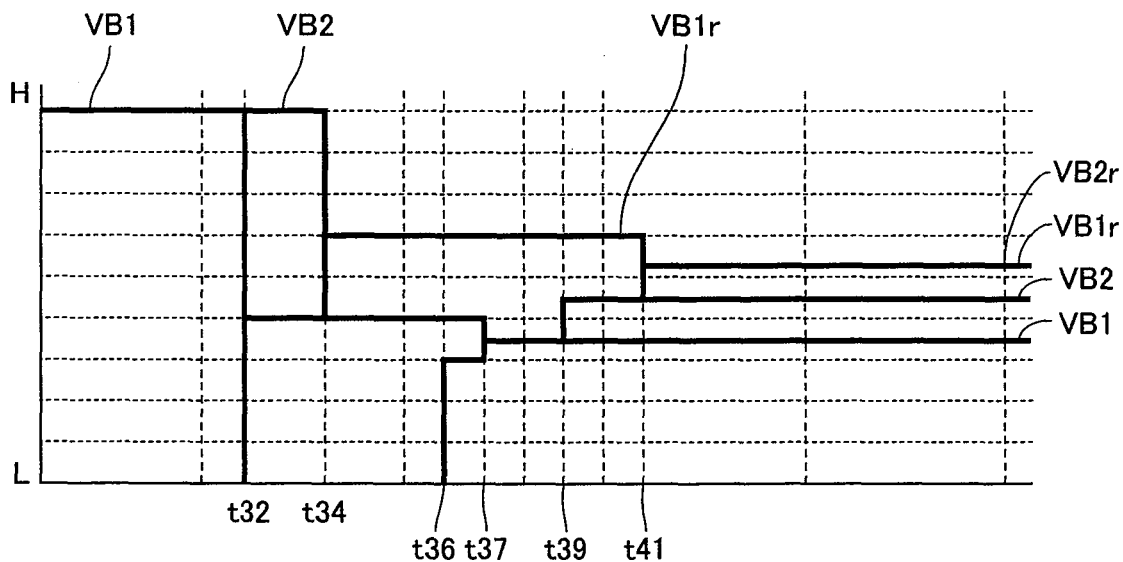
FIG. 38 illustrates voltage levels of pseudo-ground lines and others in a switching operation according to the fourth embodiment of the invention.

FIG. 38 illustrates voltage levels of the pseudo-ground lines in the MTCMOS circuit according to the fourth embodiment of the invention, and particularly the voltage levels according to the input of the control signals in FIG. 37.

Referring to FIG. 38, since control signal Sleep2 attains the "H" level at time t32, pseudo-ground lines VB1 and VB1r are electrically coupled together via node N0. Thereby, the charging charges in pseudo-ground line VB1 are discharged, and pseudo-ground lines VB1 and VB1r attain the same potential. Therefore, the potential of pseudo-ground line VB1 lowers, and the potential of pseudo-ground line VB1r rises. The potentials of pseudo-ground lines VB1 and VB1r connected via node N0 depend on the potentials and capacitances of node N0 and pseudo-ground lines VB1 and VB1r.

At time t34, control signal Sleep4 attains the "H" level so that pseudo-ground lines VB2 and VB1r are electrically coupled together via node N0. Thereby, the charging charges are discharged from pseudo-ground line VB2, and pseudo-ground lines VB2 and VB1r attain the same potential as described before. Therefore, the potential of pseudo-ground line VB2 lowers, and the potential of pseudo-ground line VB1r further rises. The potentials of pseudo-ground lines VB2 and VB1r connected together via node N0 depend on the potentials and capacitances of node N0 and pseudo-ground lines VB2 and VB1r.

At time t36, control signal Sleep2r changes from the "H" level to the "L" level, and control signal Sleep4r changes from the "L" level to the "H" level so that node N0 is electrically coupled to pseudo-ground line VB2r.

Thereby, the charging charges carried by node N0 are discharged, and node N0 and pseudo-ground line VB2r attain the same potential. Therefore, the potential of pseudo-ground line VB2r rises. The potentials of node N0 and pseudo-ground line VB2r depend on the potentials and capacitances of pseudo-ground line VB2r and node N0. The logical levels of control signals Sleep2r and Sleep4r may be switched at the same time or at different times, respectively.

At subsequent time t37, control signal Sleep2 attains the "H" level so that pseudo-ground lines VB2r and VB1 are electrically coupled together via node N0. Thereby, the charging charges remaining in pseudo-ground line VB1 are discharged so that pseudo-ground lines VB1 and VB2r attain the same potential. Therefore, the potential of pseudo-ground line VB2r further rises. The potentials of pseudo-ground lines VB1 and VB2r coupled via node N0 depend on the potentials and capacitances of pseudo-ground lines VB1 and VB2r as well as node N0.

At subsequent time t39, control signal Sleep4 attains the "H" level so that pseudo-ground lines VB2 and VB2r are electrically coupled together via node N0. Thereby, the charging charges remaining in pseudo-ground line VB2 are discharged, and pseudo-ground lines VB2 and VB2r attain the same potential as described before. Therefore, the potential of pseudo-ground line VB2r further rises. The potentials of pseudo-ground lines VB2 and VB2r depend on the potentials and capacitances of pseudo-ground lines VB2 and VB1r as well as node N0.

At time t41, control signal Sleep2r attain the "H" level. Thereby, pseudo-ground lines VB1r and VB2r are electrically coupled together via node N0, and attain the same potential.

Therefore, the potential of pseudo-ground line VB1r slightly lowers, but the potential of pseudo-ground line VBr further rises. The potentials of pseudo-ground lines VB1r and VB2r depend on the potentials and capacitances of pseudo-ground lines VB1r and VB2r as well as node N0. In the above description, control signal Sleep2 attains the "H" level at time t41, and pseudo-ground lines VB1r and VB2r attain the same potential. However, pseudo-ground lines VB1r and VB2r may not attain the same potential for the following reason. Since control signal Sleep4 attains the "H" level at time t39, pseudo-ground lines VB1 and VB2 of block BK1 supply the whole charges required for charging the pseudo-ground lines VB1r and VB2r of block BK2. Therefore, even when the charging and discharging between pseudo-ground lines VB1r and VB2r are performed, the whole quantity of the charging charges in block BK2 is constant. Accordingly, the above same potential is not essential.

Therefore, when block BK1 changes from the standby mode to the active mode and block BK2 changes from the active mode to the standby mode, the above structure can use the charges already carried by pseudo-ground lines VB1 and VB2 that are arranged corresponding to block BK1, and can supplement, with these charges, a part of the charges required for raising the potentials of pseudo-ground lines VB1r and VB2r arranged corresponding to respective logic circuit groups L3 and L4 of block BK, respectively.

Similarly to the case already described, therefore, when block BK2 attains the standby mode, the charging charges in block BK1 are reused for supplementing a part of the charges required for raising the potentials of pseudo-ground lines VB1r and VB2r with such reused charges. Thereby, the quantity of charges can be reduced, and the power consumption can be suppressed.

As described above, in addition to the foregoing configuration in which the charging charges are supplied only from the pseudo-ground line arranged corresponding to one logic circuit group, the charging charges may be supplied from the pseudo-ground lines arranged corresponding to the plurality of logic circuit groups, respectively, and thereby the quantity of charges that can be reused is increased to suppress the power consumption. In the configuration already described, pseudo-ground lines VB1 and VB2 of block BK1 supply the charging charges to pseudo-ground lines VB1r and VB2r of block BK2. However, such a configuration may be naturally employed that pseudo-ground lines VB1r and VB2r of block BK2 supply the charging charges to pseudo-ground lines VB1 and VB2 of block BK1. FIG. 37 is a timing chart that illustrates control signals Sleep for supplying the charging charges for supplement from pseudo-ground lines VB1 and VB2 of block BK1 to pseudo-ground lines VB1r and VB2r of block BK2. However, this is merely an example, and is not restrictive. For example, similar effect can be achieved, e.g., even by replacing control signal Sleep2 with control signal Sleep4.

In the configuration already described, control unit 20P controls control signals Sleep2 and Sleep4 to prevent overlapping of the on periods in which switches SW2 and SW1_2 are on, respectively. However, the control may be employed in the case where both switches SW2 and SW1_2 are simultaneously turned on, or the on periods thereof overlap each other. This is for the following reason. In the case where switches SW2 and SW1_2 are simultaneously turned on or the on periods thereof overlap each other, the capacitance value of the whole pseudo-ground lines in the charging and discharging operations is larger than that in the case where the control is performed not to cause overlapping of the on period, and therefore the efficiency lowers from the viewpoint of the reuse of the charging charges.

Figure 39:
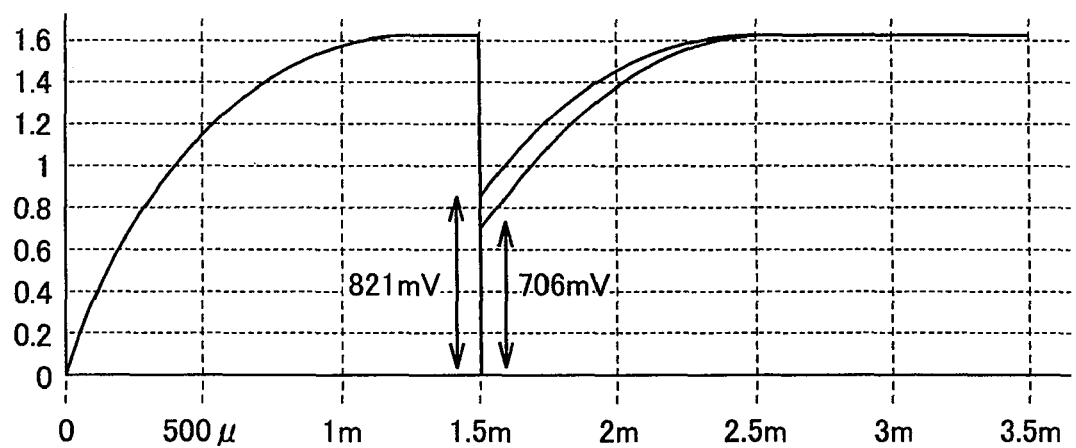
FIG. 39 illustrates a voltage level of the pseudo-ground line in the MTCMOS circuit according to the fourth embodiment of the invention, and particularly the voltage level according to input of the control signals in FIG. 37.

FIG. 39 illustrates the voltage level of the pseudo-ground lines in the MTCMOS circuit illustrated in FIG. 9 and the MTCMOS circuit according to the fourth embodiment illustrated in FIG. 36, and particularly a result of the simulation of the voltage level.

Referring to FIG. 39, the structure in FIG. 9 can raise the potential to 706 mV by supplementing the charging charges. The structure in FIG. 36 can raise the potential to 821 mV by supplementing the charging charges.

The description has been given, by way of example, in connection with a block having substantially the same circuit structure as that illustrated in FIG. 9. However, this is not restrictive, and various variations may be employed. For example, switches SWP1 and SWP2 may be replaced with voltage step-down circuits VDC1 and VDC2, as already described with reference to FIG. 3(c).

The above structure can increase the charge reuse factor as compare with the first embodiment of the invention. The first embodiment of the invention can theoretically achieve, the charge reuse factor of up to 50%. However, the structure in FIG. 36 can increase the charge reuse factor to 62.5%.

By way of example, circuit simulation was performed on an 8-bit SRAM of 0.18 μm. The structure according to the first embodiment of the invention achieved the charge reuse factor of 43.85%.

However, the structure shown in FIG. 36 of the fourth embodiment of the invention achieved the charge reuse factor of 51.3%, and thus achieved the further improved charge reuse factor so that the power consumption can be further improved.

The example has been described in connection with the structure in FIG. 36 that has the two divided blocks each including the two logic circuit groups. However, this is not restrictive, and the structure may employ more divided blocks. For example, the structure may employ three divided blocks each having three logic circuit groups, and the charging charges may be supplemented in the similar manner, in which case the theoretical charge reuse factor is 68.75%. More divided blocks each including a plurality of logic circuit groups may be employed, and the charging charges may be supplemented in the similar manner, whereby the theoretical charge reuse factor of up to 75% can be achieved. The structure having the two divided blocks each having the two logic circuit groups has been described. However, the numbers are not restricted to the above. Each block may include only one logic circuit group, or may include a plurality of logic circuit groups, and various combinations can be employed.

First Modification of the Fourth Embodiment

Although the fourth embodiment has been described in connection with the structure that employs the plurality of divided blocks for improving the charge reuse factor, a first modification of the fourth embodiment of the invention will now be described in connection with a simple method of supplementing with the charging charges.

Figure 40:
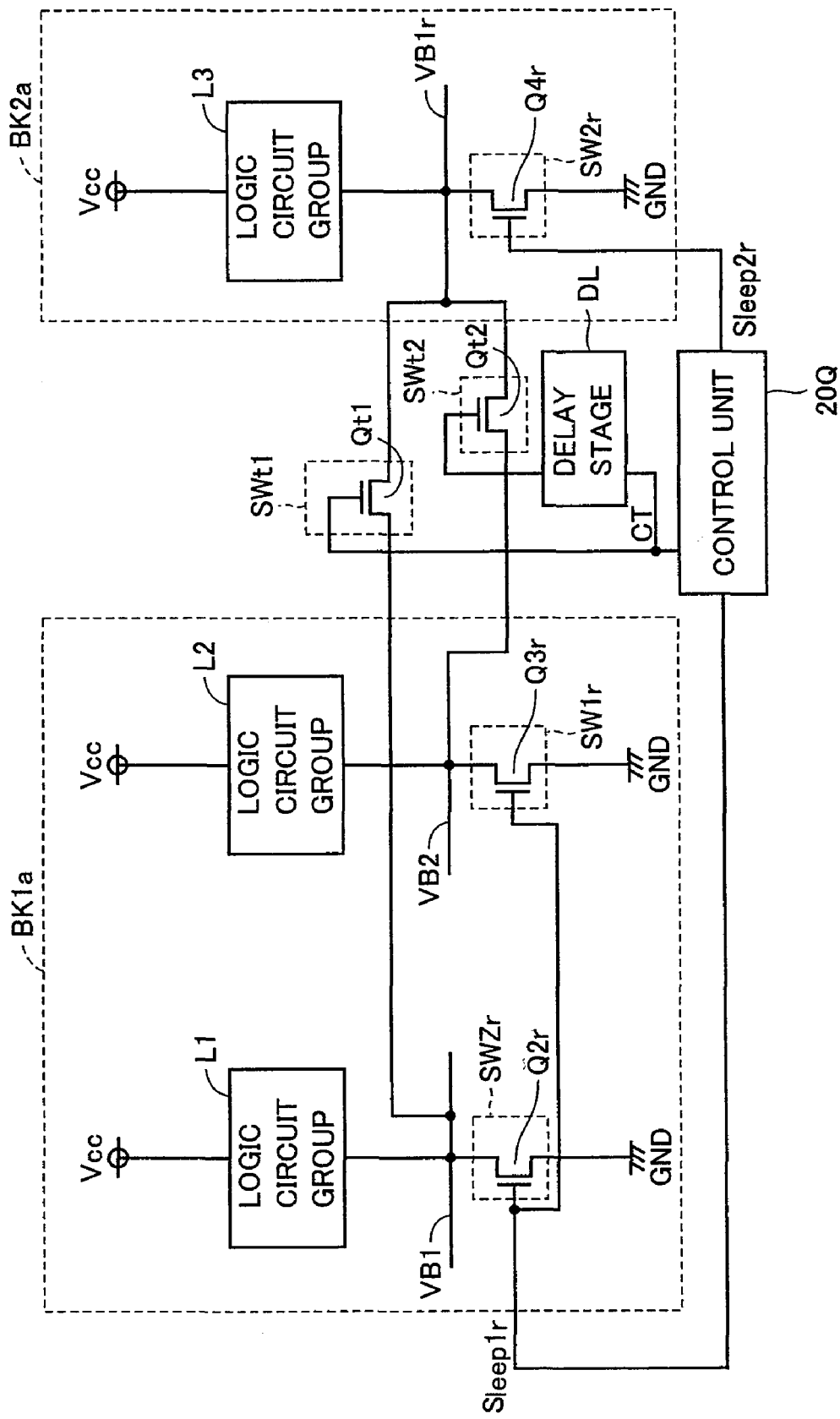
FIG. 40 illustrates a MTCMOS circuit according to a first modification of the fourth embodiment of the invention.

FIG. 40 illustrates the MTCMOS circuit according to the first modification of the fourth embodiment of the invention.

FIG. 40 shows by way of example a structure having divided blocks BK1a and BK2a. Block BK1a according to the first modification of the fourth embodiment of the invention includes logic circuit groups L1 and L2, pseudo-ground lines VB1 and VB2 arranged corresponding to logic circuit groups L1 and L2, respectively, and switches SWZr and SW1r controlling electrical connections of pseudo-ground lines VB1 and VB2 to ground voltage GND, respectively.

Block BK2a according to the first modification of the fourth embodiment of the invention includes logic circuit group L3, pseudo-ground line VB1r arranged corresponding to logic circuit group L3 and switch SW2r controlling the electrical connection between pseudo-ground line VB1r and ground voltage GND.

The structure further includes a switch SWt1 controlling an electrical connection between pseudo-ground lines VB1 and VB1r, a switch SWt2 controlling an electrical connection between pseudo-ground lines VB2 and VB1r, a delay stage DL and a control unit 20Q providing control signals controlling these switches.

Control unit 20Q provides control signals Sleep1r, Sleep2r and CT based on commands provided, e.g., from a CPU in a chip (not shown).

Figure 41:
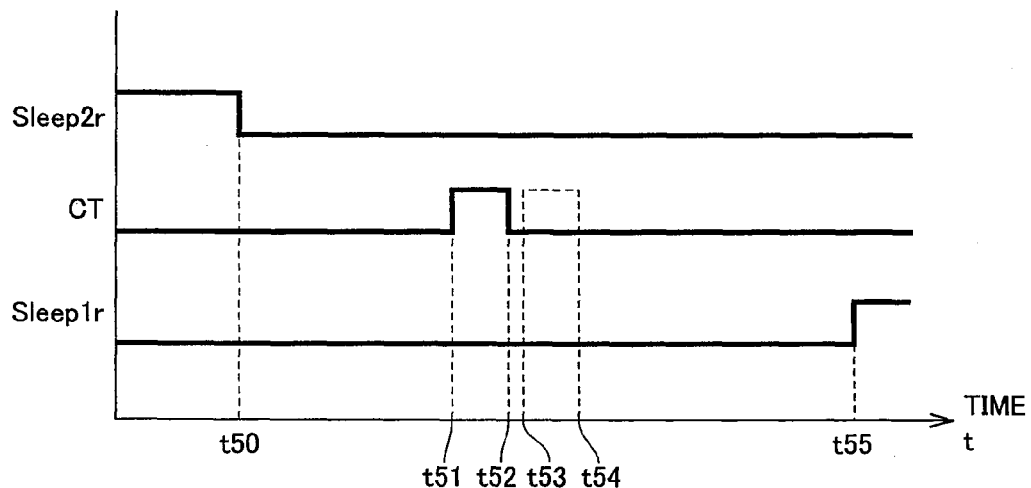
FIG. 41 is a timing chart illustrating an operation of the MTCMOS circuit according to the first modification of the fourth embodiment of the invention.

FIG. 41 is a timing chart illustrating an operation of the MTCMOS circuit of the first modification of the fourth embodiment of the invention. In the example to be described below, block BK1a changes from the standby mode to the active mode, and block BK2a changes from the active mode to the standby mode.

Referring to FIG. 41, control signal Sleep2r changes from the "H" level to the "L" level at a time t50. In response to this, transistor Q4r of switch SW2r is turned of Therefore, pseudo-ground line VB1r is electrically decoupled from ground voltage GND. Thus, logic circuit group L3 of block BK2a attains the standby mode. Control signal Sleep1r has maintained the "L" level. Therefore, block BK1a is in the standby mode, and pseudo-ground lines VB1 and VB2 arranged corresponding to respective logic circuit groups L1 and L2 have accumulated the charging charges.

At a subsequent time t51, control signal CT changes from the "L" level to the "H" level. A transistor Qt1 of switch SWt1 is turned on in response to this.

Thereby, pseudo-ground lines VB1 and VB1r are electrically coupled together.

Therefore, the charging charges of pseudo-ground line VB1 are discharged to pseudo-ground line VB1r. At a time t52, control signal CT changes from the "H" level to the "L" level. Thereby, transistor Qt1 of switch SWt1 is turned off to decouple electrically pseudo-ground lines VB1 and VB1r from each other.

At a subsequent time t53, control signal CT that attained the "H" level at time t51 as described before is transmitted to a gate of a transistor Qt2 of switch SWt2 via delay stage DL.

Thereby, transistor Qt2 is turned on so that pseudo-ground lines VB2 and VB1r are electrically coupled together. At a time t54, control signal CT that attained the "L" level at time t52 as described before is supplied to the gate of transistor Qt2 of switch SWt2 via the delay stage. Thereby, transistor Qt2 is turned off to decouple electrically pseudo-ground lines VB2 and VB1r from each other.

At time t53, control signal Sleep1r changes from the "L" level to the "H" level. Thereby, transistors Q2r and Q3r of switches SWZr and SW1r are turned on to couple electrically ground voltage GND to pseudo-ground lines VB1 and VB2, respectively.

Therefore, block BK1a attains the active mode. Logic circuit groups L1 and L2 are supplied with the power required for the operation, and execute the predetermined operations. Block BK2a attains the standby mode. Logic circuit group L3 is powered off because transistor Q4r is off.

Figure 42:
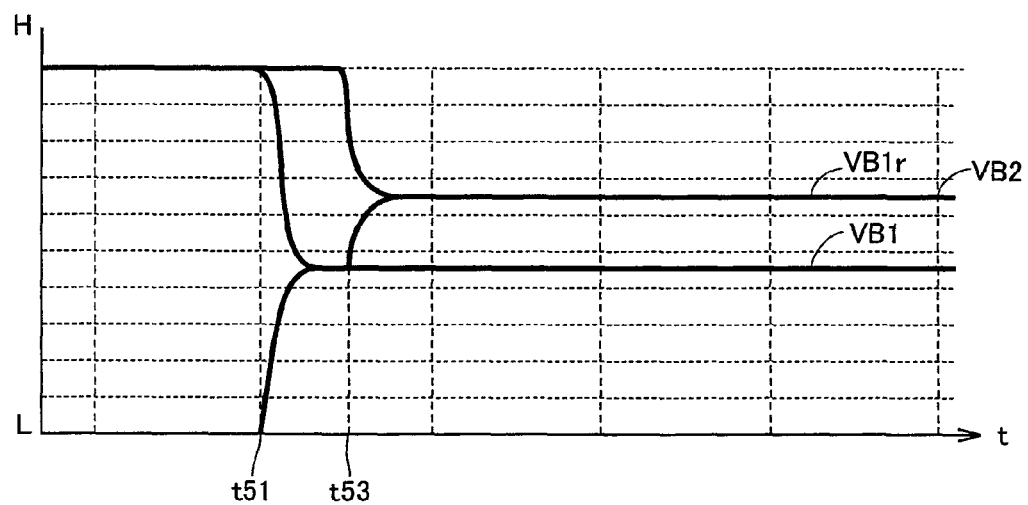
FIG. 42 illustrates voltage levels of pseudo-ground lines in the MTCMOS circuit according to the first modification of the fourth embodiment of the invention.

FIG. 42 illustrates the voltage levels of the pseudo-ground lines in the MTCMOS circuit according to the first modification of the fourth embodiment of the invention, and particularly the voltage levels according to the input of the control signals in FIG. 41.

Referring to FIG. 42, control signal CT attains the "H" level at time t51 so that pseudo-ground lines VB1 and VB1r are electrically coupled together. Thereby, the charging charges are discharged from pseudo-ground line VB1, and pseudo-ground lines VB1 and VB1r attain the same potential as already described. Therefore, the potential of pseudo-ground line VB1 lowers, and the potential of pseudo-ground line VB1r rises. The potentials of pseudo-ground lines VB1 and VB1r depend on the potentials and the capacitance values of pseudo-ground lines VB1 and VB1r.

At time t53, delayed control signal CT is supplied to transistor Q2t of switch SWt2 so that pseudo-ground lines VB2 and VB1r are electrically coupled together. Thereby, the charging charges are discharged from pseudo-ground line VB2, and pseudo-ground lines VB2 and VB1r attain the same potential as already described. Therefore, the potential of pseudo-ground line VB2 lowers, and the potential of pseudo-ground line VB1r further rises. The potentials of pseudo-ground lines VB2 and VB1r depend on the potentials and the capacitance values of pseudo-ground lines VB2 and VB1r.

Therefore, when block BK1a changes from the standby mode to the active mode and block BK2a changes from the active mode to the standby mode similarly to the fourth embodiment, the charges already carried by pseudo-ground lines VB1 and VB2 arranged corresponding to block BK1a can be used for supplementing a part of the charges that are required for raising the potential of pseudo-ground line VB1r arranged corresponding to logic circuit group L3 of block BK2a, and this supplement reusing the charging charges can reduce the quantity of charges, and can suppress the power consumption. The charging charges for the supplement are supplied from the pseudo-ground lines arranged corresponding to the plurality of logic circuit groups, respectively, so that the quantity of charges that are reused can be further increased, and the power consumption can be suppressed.

In the structure according to the first modification of the fourth embodiment, the control is simple so that the transition time can be reduced, and the increase in circuit footprint can be suppressed.

Further, the above structure employs delay stage DL and is configured to apply control signal CT at the "H" level to the gates of switches SWt1 and SWt2 at different times, respectively.

Owing to delay stage DL, therefore, control unit 20Q is not required to provide controls signals independent of each other to the transistors of switches SWt1 and SWt2, respectively, and the simple structure can be employed for supplementing the charges for the charging.

In the case where delay stage DL is designed to provide a delay period longer than the period between times t51 and t52, control unit 20Q can provide control signal CT of a one-shot pulse without executing the timing control of the logic level of control signal CT provided from control unit 20Q. Naturally, this structure can simplify the control by control unit 20Q, and can reduce a load on it.

In the example described above, control unit 20Q applies control signal CT to the gates of switches SWt1 and SWt2 at different times, respectively, so that switches SWt1 and SWt2 may not be on simultaneously, and thus the on periods of respective switches SWt1 and SWt2 may be completely shifted from each other. However, the control may be employed in the case where both switches SWt1 and SWt2 are simultaneously turned on, or the on periods thereof overlap each other.

This is for the following reason. In the case where both switches SWt1 and SWt2 are simultaneously turned on, or the on periods thereof overlap each other, the capacitance value of the whole pseudo-ground lines in the charging and discharging operations increases in the charging and discharging operations, as compared with the case where the on periods do not overlap each other. Therefore, the efficiency lowers from the viewpoint of the reuse of the charging charges.

The example has been described in connection with the structure having the two divided blocks. However, this is not restrictive, and more divided blocks may be employed as already described. The number of the logic circuit groups forming the block is not restricted to the above. One block may include one logic circuit group or a plurality of logic circuit groups, and various combinations may be selected.

All the switches arranged at the plurality of paths between the pseudo-ground lines may be turned on at different times, respectively, or one or some of the switches may be turned on at the time(s) shifted from the others.

The fourth embodiment that has been described is applied to the pseudo-ground lines. However, the embodiment can be applied to the pseudo-power supply lines.

Second Modification of the Fourth Embodiment

The first modification of the fourth embodiment of the invention has been described in connection with the configuration that improves the charge reuse factor by preparing the plurality of divided blocks in a simple manner. In addition to the case where the supplement with the charging charges is performed from the pseudo-ground line to the pseudo-power supply line, the charge reuse factor can be improved by preparing the plurality of divided blocks when the supplement with the charges is performed from the pseudo-power supply line to the pseudo-ground line.

Figure 43:
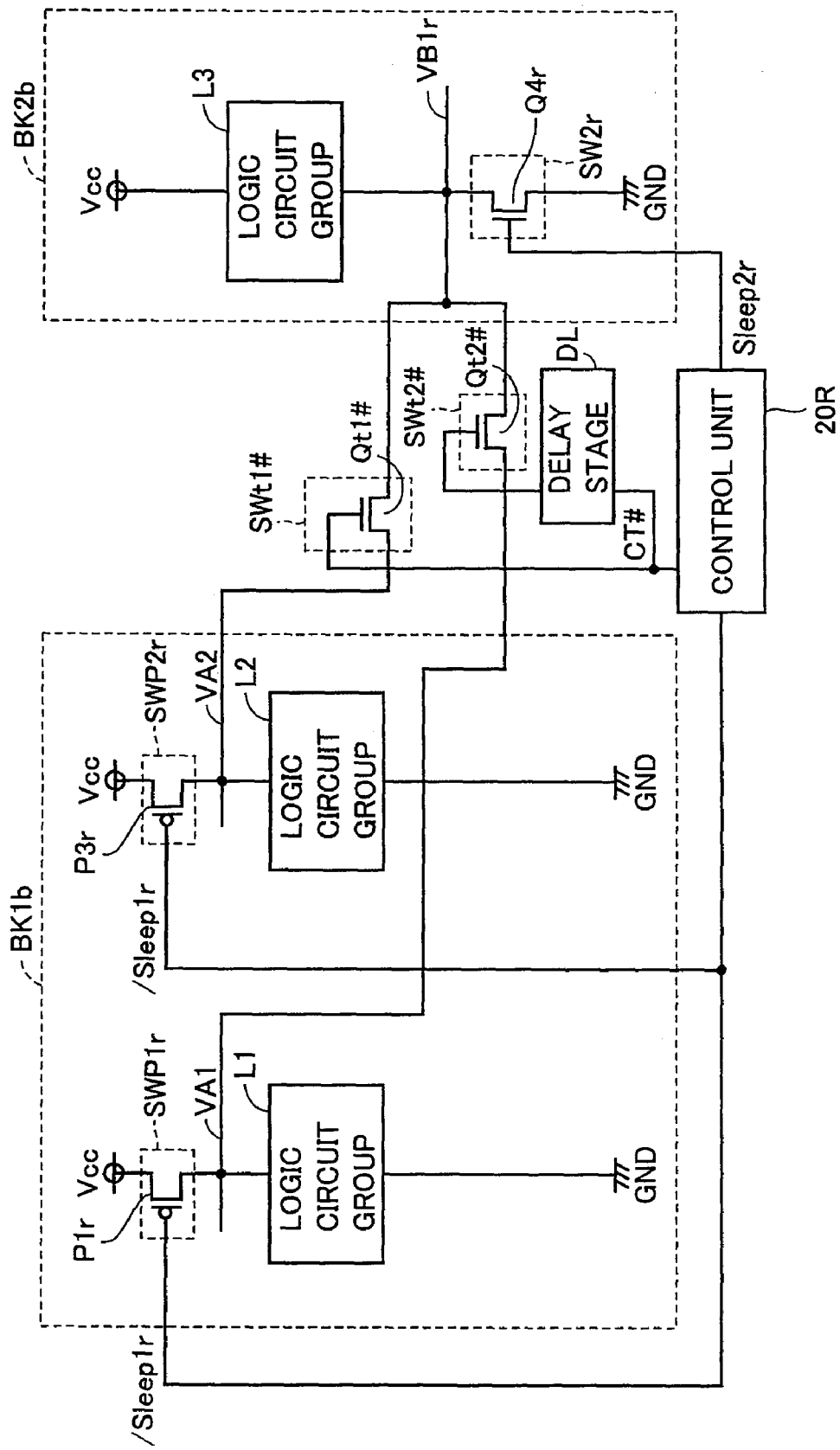
FIG. 43 illustrates an MTCMOS circuit according to a second modification of the fourth embodiment of the invention.

FIG. 43 illustrates an MTCMOS circuit according to a second modification of the fourth embodiment of the invention.

FIG. 43 shows an example that includes divided blocks BK1b and BK2b. Block BK1b according to the second modification of the fourth embodiment of the invention includes logic circuit groups L1 and L2, pseudo-power supply lines VA1 and VA2 arranged corresponding to logic circuit groups L1 and L2, respectively, and switches SWP1r and SWP2r controlling electrical connections between power supply voltage Vcc and pseudo-power supply lines VA1 and VA2, respectively.

Block BK2b according to the first modification of the fourth embodiment of the invention includes a logic circuit L3, a pseudo-ground line VB1r arranged corresponding to logic circuit group L3 and switch SW2r controlling an electrical connection between pseudo-ground line VB1r and ground voltage GND.

This example further includes a switch SWt2# controlling an electrical connection between pseudo-power supply line VA1 and pseudo-ground line VB1r, a switch SWt1# controlling an electrical connection between pseudo-power supply line VA2 and pseudo-ground line VB1r, delay stage DL and a control unit 20R providing control signals that control these switches.

Although not shown, control unit 20R provides control signals /Sleep1r, Sleep2r and CT# based on a command provided, e.g., from the CPU (not shown) in the chip.

Figure 44:
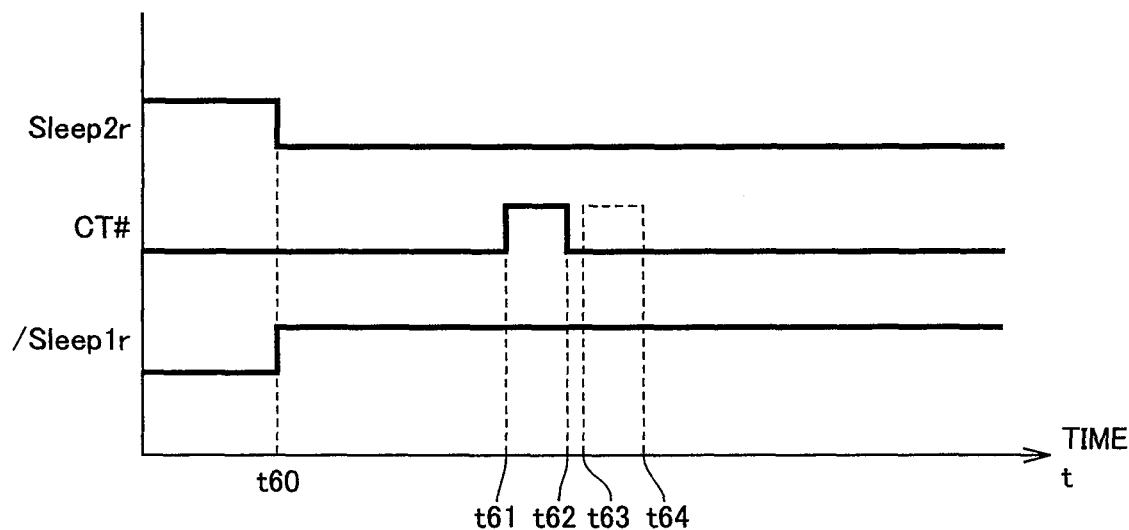
FIG. 44 is a timing chart illustrating an operation of the MTCMOS circuit according to a second modification of the fourth embodiment of the invention.

FIG. 44 is a timing chart illustrating an operation of the MTCMOS circuit according to the second modification of the fourth embodiment of the invention. This example will now be described by way of example in connection with the case where block BK1b changes from the active mode to the standby mode, and block BK2b changes from the active mode to the standby mode.

Referring to FIG. 44, control signal Sleep2r changes from the "H" level to the "L" level at a time t60. In response to this, transistor Q4r of switch SW2r is turned off. Therefore, pseudo-ground line VB1r is electrically decoupled from ground voltage GND. Thus, logic circuit group L3 of block BK2b attains the standby mode. Control signal /Sleep1r changes from the "L" level to the "H" level. In response to this, transistors P1r and P3r of respective switches SWP1r and SWP2r are turned off. Therefore, each of pseudo-power supply lines VA1 and VA2 is electrically decoupled from power supply voltage Vcc. Thus, logic circuit groups L1 and L2 of block BK1b attain the standby mode. At time t60, pseudo-power supply lines VA1 and VA2 arranged corresponding to logic circuit groups L1 and L2, respectively, are at the potential levels of the power supply voltage value, and have accumulated the charges. In the above description, the logical levels of control signals Sleep2r and /Sleep1r change simultaneously at time t60. However, these levels may not change simultaneously, and may change at different times, respectively.

At a time t61, control signal CT# changes from the "L" level to the "H" level. In response to this, a transistor Qt1# of switch SWt1# is turned on.

Thereby, pseudo-power supply line VA2 is electrically coupled to pseudo-ground line VB1r.

Therefore, the charging charges in pseudo-power supply line VA2 are discharged to pseudo-ground line VB Ir. At a time t62, control signal CT# changes from the "H" level to the "L" level. Thereby, transistor Qt1# of switch SWt1# is turned off, and pseudo-power supply line VA2 is electrically decoupled from pseudo-ground line VB1r.

At a subsequent time t63, control signal CT# that attained the "H" level at time t61 as described before is supplied to a gate of a transistor Qt2# of switch SWt2# via delay stage DL.

Therefore, transistor Qt2# is turned on to couple electrically pseudo-power supply line VA1 to pseudo-ground line VB Ir. At a time t64, control signal CT# that attained the "L" level at time t62 as described before is supplied to a gate of transistor Qt2# of switch SWt2# via the delay stage. Therefore, transistor Qt2# is turned off to decouple electrically pseudo-power supply line VA1 from pseudo-ground line VB1r.

Figure 45:
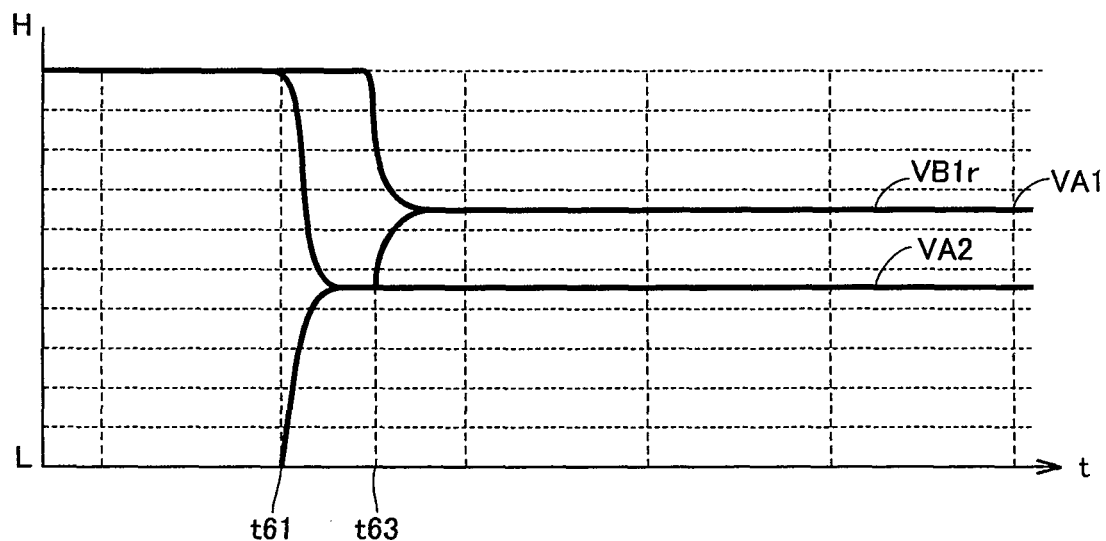
FIG. 45 illustrates voltage levels of pseudo-ground lines in the MTCMOS circuit according to the second embodiment of the invention, and particularly the voltage levels according to input of control signals in FIG. 44.
Figure 46:
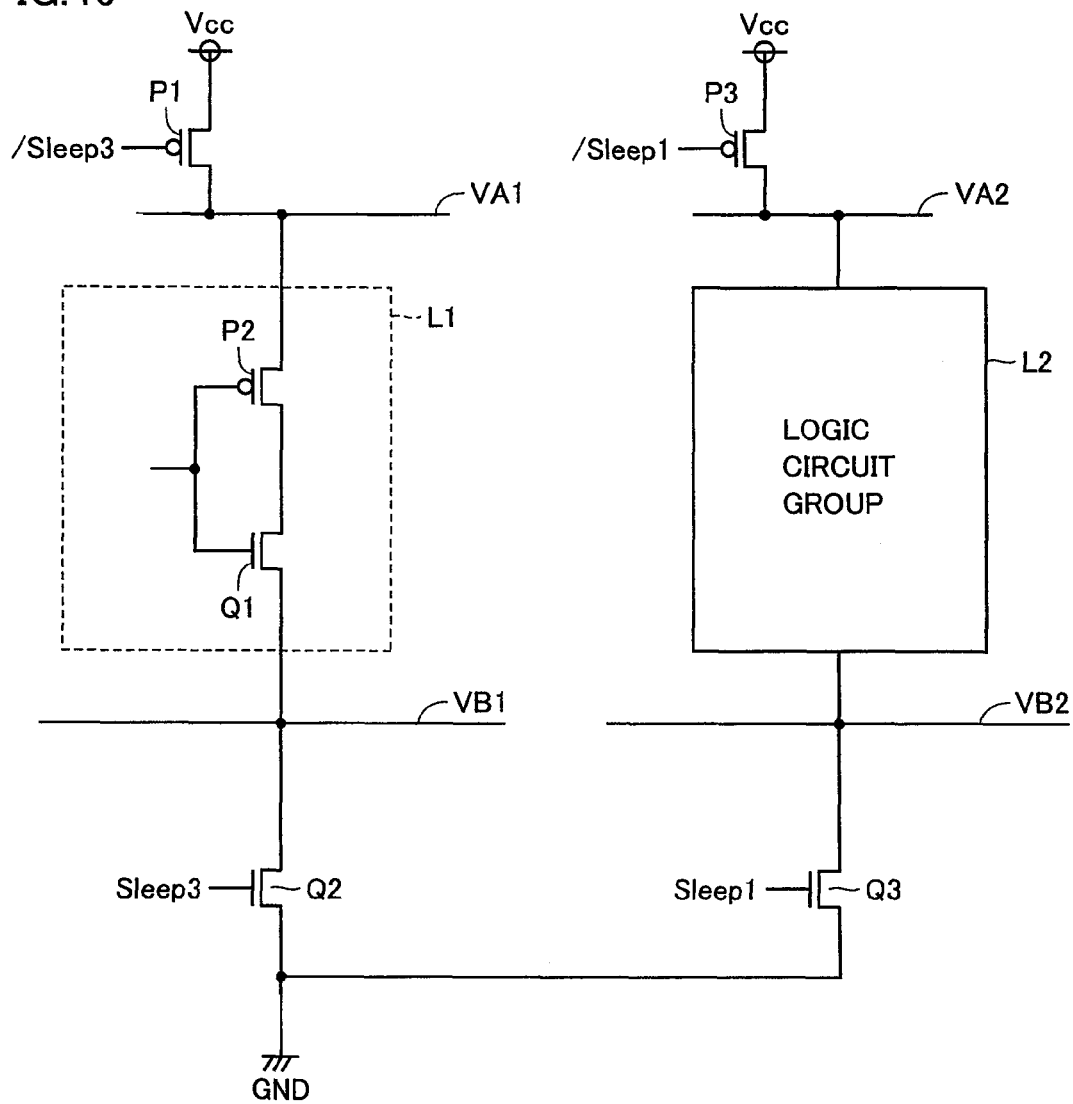
FIG. 46 illustrates a conventional MTCMOS circuit.
Figure 47:
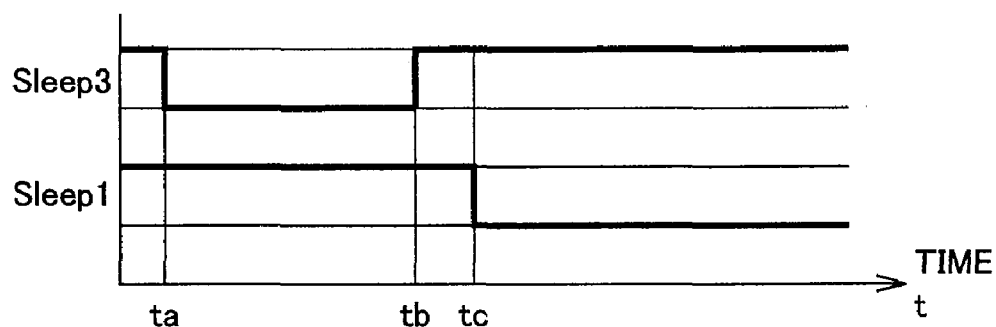
FIG. 47 is a timing chart of control signals Sleep1 and Sleep3 operating the MTCMOS circuit.
Figure 48:
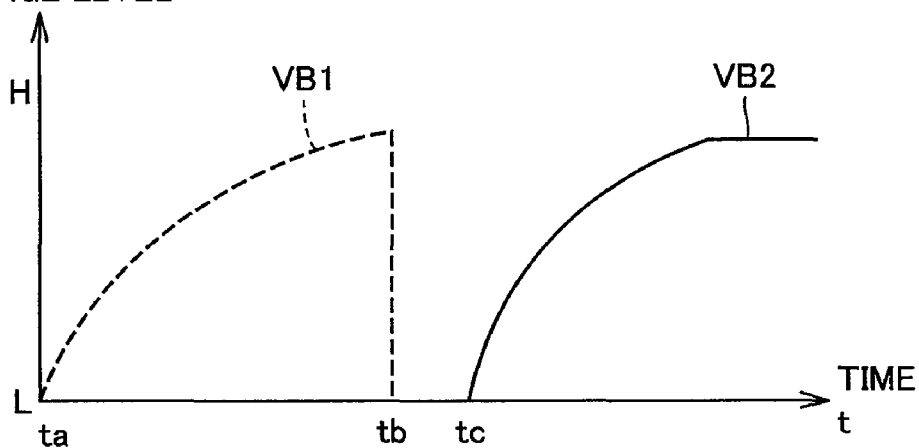
FIG. 48 illustrates a case where potential levels of pseudo-ground lines VB1 and VB2 of logic circuit groups L1 and L2 rise with time.

FIG. 45 illustrates voltage levels of the pseudo-ground line in the MTCMOS circuit according to the second modification of the fourth embodiment of the invention, and particularly the voltage levels according to input of control signals in FIG. 44.

Referring to FIG. 45, control signal CT# attains the "H" level at time t61 so that transistor Qt1# of switch SWt1# is turned on to couple electrically pseudo-power supply line VA2 to pseudo-ground line VB1r. Thereby, the charging charges in pseudo-power supply line VA2 are discharged so that pseudo-power supply line VA2 and pseudo-ground line VB1r attain the same potential as described before. Therefore, the potential of pseudo-power supply line VA2 lowers, and the potential of pseudo-ground line VB1r rises. The potentials of pseudo-power supply line VA2 and pseudo-ground line VB1r depend on the potentials and the capacitance values of pseudo-power supply line VA2 and pseudo-ground line VB1r, respectively.

At time t63, delayed control signal CT# is provided to transistor Qt2# of switch SWt2# so that pseudo-power supply line VA1 and pseudo-ground line VB1r are electrically coupled together. Thereby, the charging charges are discharged from pseudo-power supply line VA1 so that pseudo-power supply line VA1 and pseudo-ground line VB1r attain the same potential. Therefore, the potential of pseudo-power supply line VA1 lowers, and the potential of pseudo-ground line VB1r further rises. The potentials of pseudo-power supply line VA1 and pseudo-ground line VB1r depend on the potentials and the capacitance values of pseudo-power supply line VA1 and pseudo-ground line VB1r, respectively.

Similarly to the first modification of the fourth embodiment, therefore, when block BK1b changes from the standby mode to the active mode and block BK2b changes from the active mode to the standby mode, the above structure can use the charges carried in pseudo-power supply lines VA1 and VA2 arranged corresponding to block BK1b, and can supplement, with these charges, a part of the charges required for raising the potential of pseudo-ground line VB1r arranged corresponding to logic circuit group L3 of block BK2b so that the quantity of charges can be reduced, and the power consumption can be suppressed. Since the supplement is performed with the charging charges in the pseudo-power supply lines arranged corresponding to the plurality of logic circuit groups, respectively, the quantity of the reused charges can be increased, and the power consumption can be suppressed.

In the structure according to the second modification of the fourth embodiment, since the control is simple, the transition time can be reduced, and increase in circuit footprint can be suppressed.

Further, the above structure includes delay stage DL, and is configured to supply control signal CT# (at the "H" level) to the gates of switches SWt1# and SWt2# at different times, respectively.

Therefore, owing to the provision of delay stage DL, control unit 20R is not required to output the control signals to the transistors of switches SWt1# and SWt2# independently of each other, and the supplement with the charging charges can be implemented by the simple structure.

When delay stage DL is designed to cause a delay longer than a period between times t61 and t62, control unit 20R can provide control signal CT# of one-shot pulse without executing the timing control on the logical level of control signal CT# provided from control unit 20R. This structure simplifies the control of control unit 20R and reduces the load on it.

The example has been described in connection with the case where control unit 20R controls and applies control signal CT# to the gates of switches SWt1# and SWt2# at different times, respectively, so that the on-periods of them may not overlap each other. However, the control may be employed in the case where switches SWt1# and SWt2# are turned on simultaneously or the on periods overlap each other.

This is for the following reason. In the case where switches SWt1# and SWt2# are simultaneously turned on or the on periods thereof overlap each other, the capacitance value of the whole pseudo-ground lines in the charging and discharging operations is larger than that in the case where the control is performed not to cause overlapping of the on period, and therefore the efficiency lowers from the viewpoint of the reuse of the charging charges.

This example has been described in connection with the structure having the two divided blocks. However, this is not restrictive, and more divided blocks may be employed as described before. The number of the logic circuit groups forming the block is not restricted to that in this example. One block may include one logic circuit group or a plurality of logic circuit groups, and various combinations may be selected.

All the switches arranged at respective paths between the plurality of pseudo-power supply lines and the pseudo-ground lines may be turned on at different times, respectively, or one or some of them may be turned on at the time shifted from that of the others.

The contents of the respective embodiments and the modifications thereof that have been described may be appropriately combined.

Although the present invention has been described and illustrated in detail, it is clearly understood that the same is by way of illustration and example only and is not to be taken by way of limitation, the scope of the present invention being interpreted by the terms of the appended claims.

The invention claimed is:
1. A semiconductor device comprising:
a first voltage interconnection supplying a first voltage;
a second voltage interconnection supplying a second voltage;
a first voltage supply interconnection arranged between said first voltage interconnection and said second voltage interconnection;
a first internal circuit connected between said second voltage interconnection and said first voltage supply interconnection, and forming a current path between said second voltage interconnection and said first voltage supply interconnection in response to an input signal;

a first switch connected between said first voltage interconnection and said first voltage supply interconnection, and being turned on in response to an input first control signal;

a charge supply unit charging said first voltage supply interconnection; and a second switch connected between said first voltage supply interconnection and said charge supply unit, and being turned on in response to an input second control signal, said second switch being turned on while said first internal circuit is in a standby mode.

2. The semiconductor device according to claim 1, further comprising:

a third voltage interconnection supplying a third voltage;

a second voltage supply interconnection arranged between said first voltage interconnection and said third voltage interconnection;

a second internal circuit connected between said third voltage interconnection and said second voltage supply interconnection, and forming a current path between said third voltage interconnection and said second voltage supply interconnection in response to an input signal; and a third switch connected between said first voltage interconnection and said second voltage supply interconnection, and being turned on in response to an input third control signal, wherein said charge supply unit corresponds to said second voltage supply interconnection.

3. The semiconductor device according to claim 1, wherein said first and second switches are electrically coupled to said first voltage supply interconnection via an internal node, and said semiconductor device further comprises a third switch connected between said internal node and said first voltage supply interconnection, and being turned on in response to an input third control signal.

4. The semiconductor device according to claim 3, further comprising:

a third voltage interconnection supplying a third voltage;

a second voltage supply interconnection arranged between said first and third voltage interconnections; and a second internal circuit connected between said first voltage interconnection and said second voltage supply interconnection, and forming a current path between said first voltage interconnection and said second voltage supply interconnection in response to an input signal, wherein said charge supply unit corresponds to said second voltage supply interconnection.

5. The semiconductor device according to claim 1, wherein said charge supply unit includes a capacitor accumulating charges.

6. The semiconductor device according to claim 1, wherein said charge supply unit includes a power supply unit for charging said first voltage supply interconnection.

7. The semiconductor device according to claim 6, wherein said power supply unit includes a generator element generating an electric power by converting physical energy other than electric energy into electric energy.

8. The semiconductor device according to claim 1, wherein at least one of said corresponding switches receives input of the plurality of corresponding control signals, and electrically couples one of corresponding ends to the other corresponding end based on a combination of said plurality of corresponding control signals.

9. The semiconductor device according to claim 1, wherein said first internal circuit and said first voltage supply interconnection are formed in a first chip, and said charge supply unit is formed in a second chip.

10. The semiconductor device according to claim 1, wherein said first input circuit, said first voltage supply interconnection and said first switch are formed in a first chip, and at least one of said charge supply unit and said second switch is formed in a second chip.

11. The semiconductor device according to claim 1, wherein said first internal circuit corresponds to a memory array having a plurality of memory cells.

12. The semiconductor device according to claim 11, wherein each of said memory cells includes a flip-flop circuit for setting said first and second storage nodes to different potential levels, respectively, according to data to be stored;

said flip-flop circuit includes:

a first transistor connected between said second voltage and said first storage node, and having a gate electrically coupled to said second storage node, a second transistor connected between said voltage supply interconnection and said first storage node, and having a gate electrically coupled to said second storage node, a third transistor connected between said second voltage and said second storage node, and having a gate electrically coupled to said first storage node, and a fourth transistor connected between said voltage supply interconnection and said second storage node, and having a gate electrically coupled to said first storage node;

said first switch is turned off in response to said first control signal in a data write operation; and said first voltage supply interconnection is set to a potential intermediate between said first and second voltages.

13. The semiconductor device according to claim 2, wherein at least one of said first and second internal circuits corresponds to at least one of a plurality of memory blocks each having a plurality of memory cells.

14. The semiconductor device according to claim 1, further comprising:

a third voltage interconnection supplying a third voltage;

said first switch includes:

a first switch unit connected between said first voltage supply interconnection and said first voltage interconnection, and a first logic circuit controlling said first switch unit in response to a command signal; and said first logic circuit includes:

a second switch unit connected between said third voltage interconnection and a control terminal of said first switch unit, and electrically coupling said third voltage interconnection to the control terminal of said first switch unit in response to a command signal setting said first switch unit to a conductive state, and a third switch unit connected between said first voltage supply interconnection and the control terminal of said first switch unit, and electrically coupling said first voltage supply interconnection to the control terminal of said first switch unit in response to a command signal implementing an nonconductive state reducing a quantity of a current flowing to said first switch unit as compared with the conductive state.

15. A semiconductor device comprising:

a first voltage interconnection supplying a first voltage;

a second voltage interconnection supplying a second voltage;

one or a plurality of first voltage supply interconnection(s) connected between said first and second voltage interconnections;

one or a plurality of first internal circuit(s) connected between said second voltage interconnection and said one or said plurality of first voltage supply interconnection(s), and forming a current path(s) between said second voltage interconnection and said one or said plurality of first voltage supply interconnection(s) in response to an input signal;

one or a plurality of first switches connected between said first voltage interconnection and said one or said plurality of first voltage supply interconnection(s), and being turned on in response to an input first control signal;

one or a plurality of charge supply unit(s) charging said one or said plurality of first voltage supply interconnection(s); and a plurality of second switches connected between said one or said plurality of voltage supply interconnection(s) and said one or said plurality of charge supply unit(s), and being turned on in response to an input second control signal, said second control signal corresponding to a plurality of command signals being input corresponding to said plurality of second switches, respectively; and a first control circuit producing said plurality of command signals to turn on at least a part of said plurality of second switches according to timing different from that of the other second switch(es), said plurality of second switches being turned on while said one or a plurality of first internal circuit(s) is in a standby mode.

16. The semiconductor device according to claim 15, wherein said one or said plurality of first switches and said plurality of second switches are electrically coupled to said one or said plurality of first voltage supply interconnection(s) via an internal node, and said semiconductor device further comprises a third switch connected between said internal node and said one or said plurality of first voltage supply interconnections, and being turned on in response to an input third control signal.

* * * * *